United States Patent
Lee et al.

(10) Patent No.: US 12,166,074 B2
(45) Date of Patent: Dec. 10, 2024

(54) GATE STRUCTURE IN SEMICONDUCTOR DEVICE AND METHOD OF FORMING THE SAME

(71) Applicant: Taiwan Semiconductor Manufacturing Co., Ltd., Hsinchu (TW)

(72) Inventors: Hsin-Yi Lee, Hsinchu (TW); Weng Chang, Hsinchu (TW); Hsiang-Pi Chang, New Taipei (TW); Huang-Lin Chao, Hillsboro, OR (US); Chung-Liang Cheng, Changhua County (TW); Chi On Chui, Hsinchu (TW); Kun-Yu Lee, Tainan (TW); Tzer-Min Shen, Hsinchu (TW); Yen-Tien Tung, Hsinchu (TW); Chun-I Wu, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 395 days.

(21) Appl. No.: 17/651,869

(22) Filed: Feb. 21, 2022

(65) Prior Publication Data
US 2023/0009485 A1 Jan. 12, 2023

Related U.S. Application Data

(60) Provisional application No. 63/229,677, filed on Aug. 5, 2021, provisional application No. 63/219,894, filed on Jul. 9, 2021.

(51) Int. Cl.
*H01L 21/00* (2006.01)
*H01L 21/324* (2006.01)
(Continued)

(52) U.S. Cl.
CPC ........ *H01L 29/0665* (2013.01); *H01L 21/324* (2013.01); *H01L 21/823412* (2013.01);
(Continued)

(58) Field of Classification Search
CPC ............... H01L 29/0665; H01L 21/324; H01L 21/823412
See application file for complete search history.

(56) References Cited

U.S. PATENT DOCUMENTS 9,502,307 B1 * 11/2016 Bao ................... H01L 29/42372
9,548,372 B2 * 1/2017 Cheng ................. H01L 29/4966
(Continued)

FOREIGN PATENT DOCUMENTS

CN 115360143 A * 11/2022 ....... H01L 21/28185
CN 115763373 A * 3/2023 ....... H01L 21/28518
(Continued)

*Primary Examiner* — Laura M Menz
(74) *Attorney, Agent, or Firm* — Slater Matsil, LLP

(57) ABSTRACT

A method includes removing a first dummy gate stack and a second dummy gate stack to form a first trench and a second trench. The first dummy gate stack and the second dummy gate stack are in a first device region and a second device region, respectively. The method further includes depositing a first gate dielectric layer and a second gate dielectric layer extending into the first trench and the second trench, respectively, forming a fluorine-containing layer comprising a first portion over the first gate dielectric layer, and a second portion over the second gate dielectric layer, removing the second portion, performing an annealing process to diffuse fluorine in the first portion into the first gate dielectric layer, and at a time after the annealing process, forming a first work-function layer and a second work-function layer over the first gate dielectric layer and the second gate dielectric layer, respectively.

20 Claims, 65 Drawing Sheets

(51) Int. Cl.
*H01L 21/8234* (2006.01)
*H01L 29/06* (2006.01)
*H01L 29/423* (2006.01)
*H01L 29/66* (2006.01)
*H01L 29/786* (2006.01)

(52) U.S. Cl.
CPC ........... *H01L 21/823418* (2013.01); *H01L 29/42392* (2013.01); *H01L 29/66545* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 9,685,441 B2* | 6/2017 | Cheng | H01L 29/513 |
| 10,340,358 B2 | 7/2019 | Suh | |
| 10,468,258 B1* | 11/2019 | Lin | H01L 21/28247 |
| 10,593,775 B2* | 3/2020 | Yeo | H01L 27/0886 |
| 10,672,742 B2* | 6/2020 | Wu | H01L 29/66 |
| 10,734,500 B2* | 8/2020 | Lin | H01L 29/785 |
| 10,964,543 B2* | 3/2021 | Lin | H01L 21/28247 |
| 11,152,338 B2* | 10/2021 | Wu | H01L 29/42376 |
| 11,289,578 B2* | 3/2022 | Lee | H01L 21/823437 |
| 11,430,652 B2* | 8/2022 | Lee | H01L 21/76871 |
| 11,437,277 B2* | 9/2022 | Ko | H01L 21/823481 |
| 11,631,770 B2 | 4/2023 | Ju | |
| 11,682,675 B2* | 6/2023 | Lee | H01L 27/0886 257/288 |
| 11,710,638 B2* | 7/2023 | Wei | H01L 21/02321 257/401 |
| 11,742,395 B2* | 8/2023 | Lee | H01L 29/401 257/401 |
| 11,901,411 B2 | 2/2024 | Young | |
| 11,967,504 B2* | 4/2024 | Lee | H01L 29/42392 |
| 12,027,423 B2* | 7/2024 | Ko | H01L 29/6681 |
| 2016/0225871 A1* | 8/2016 | Cheng | H01L 29/4236 |
| 2017/0092644 A1* | 3/2017 | Cheng | H01L 29/4966 |
| 2019/0051734 A1* | 2/2019 | Lin | H01L 29/42392 |
| 2019/0096680 A1* | 3/2019 | Wei | H01L 21/28185 |
| 2019/0123161 A1* | 4/2019 | Yeo | H01L 21/823814 |
| 2019/0131274 A1* | 5/2019 | Wu | H01L 25/04 |
| 2020/0066535 A1* | 2/2020 | Lin | H01L 21/28247 |
| 2020/0168722 A1* | 5/2020 | Hung | H01L 21/3247 |
| 2020/0294973 A1* | 9/2020 | Wu | H01L 29/66 |
| 2020/0312985 A1* | 10/2020 | Chang | H01L 21/823821 |
| 2021/0335670 A1* | 10/2021 | Ko | H01L 29/6681 |
| 2022/0122887 A1* | 4/2022 | Young | H01L 29/78391 |
| 2022/0216307 A1* | 7/2022 | Lee | H01L 27/0886 |
| 2022/0285529 A1* | 9/2022 | Chen | H01L 27/0924 |
| 2022/0320094 A1* | 10/2022 | Lee | H01L 29/41791 |
| 2022/0359299 A1* | 11/2022 | Ko | H01L 29/66545 |
| 2022/0406598 A1* | 12/2022 | Lee | H01L 21/02603 |
| 2023/0009485 A1* | 1/2023 | Lee | H01L 21/823857 |
| 2023/0029651 A1* | 2/2023 | Lo | H01L 29/42392 |
| 2023/0114191 A1* | 4/2023 | Lu | H01L 29/6681 438/157 |
| 2023/0154992 A1* | 5/2023 | Lee | H01L 29/41775 257/368 |
| 2023/0187518 A1* | 6/2023 | Lai | H01L 29/0665 257/481 |
| 2023/0275094 A1* | 8/2023 | Lee | H01L 29/66795 257/288 |
| 2023/0335406 A1* | 10/2023 | Chen | H01L 27/092 |
| 2023/0335601 A1* | 10/2023 | Lee | H01L 29/401 |
| 2024/0038866 A1* | 2/2024 | Wang | H01L 29/6656 |
| 2024/0071767 A1* | 2/2024 | Chen | H01L 21/31116 |

FOREIGN PATENT DOCUMENTS

| | | | | |
|---|---|---|---|---|
| DE | 102020113993 A1 | * | 4/2021 | ......... H01L 21/0273 |
| DE | 102022104675 A1 | * | 1/2023 | ....... H01L 21/28185 |
| DE | 102022104650 A1 | * | 4/2023 | ..... H01L 21/823418 |
| KR | 20190028061 A | | 3/2019 | |
| KR | 20190037057 A | | 4/2019 | |
| KR | 20210032873 A | | 3/2021 | |
| KR | 20210053161 A | | 5/2021 | |
| KR | 20210084206 A | | 7/2021 | |
| TW | 202002011 A | | 1/2020 | |
| TW | 202107571 A | | 2/2021 | |

* cited by examiner

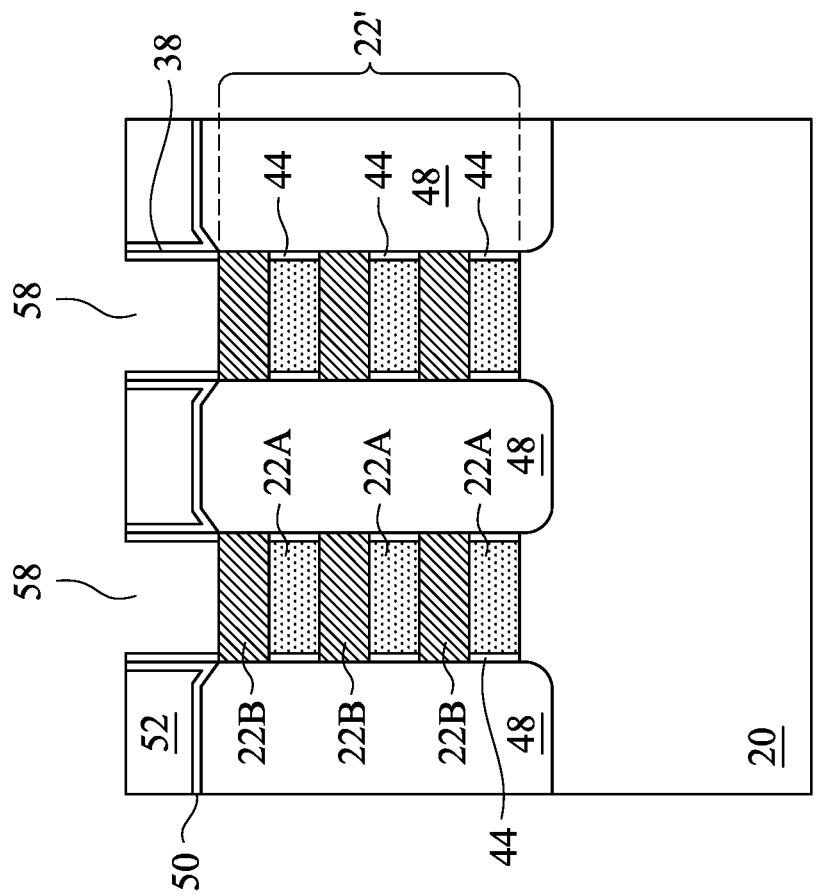
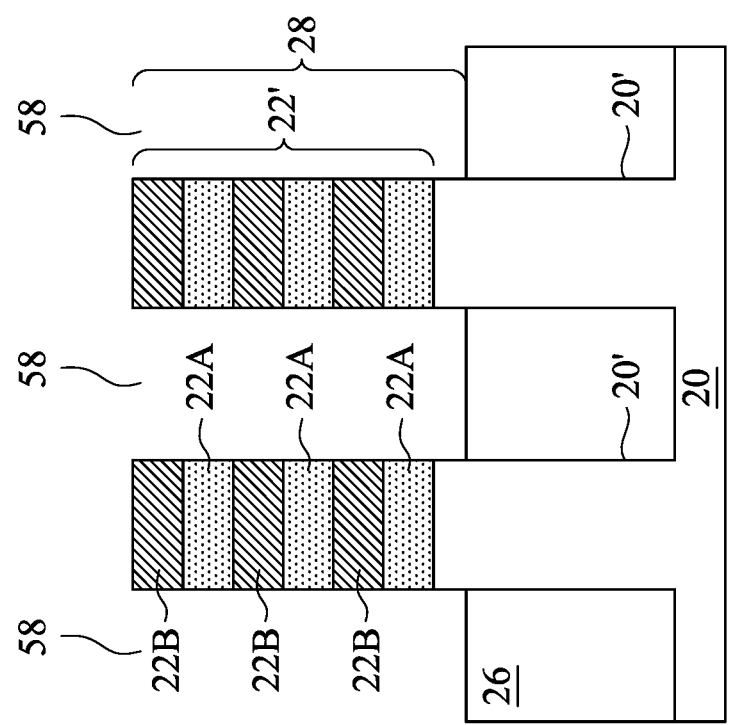
FIG. 12B
FIG. 12A

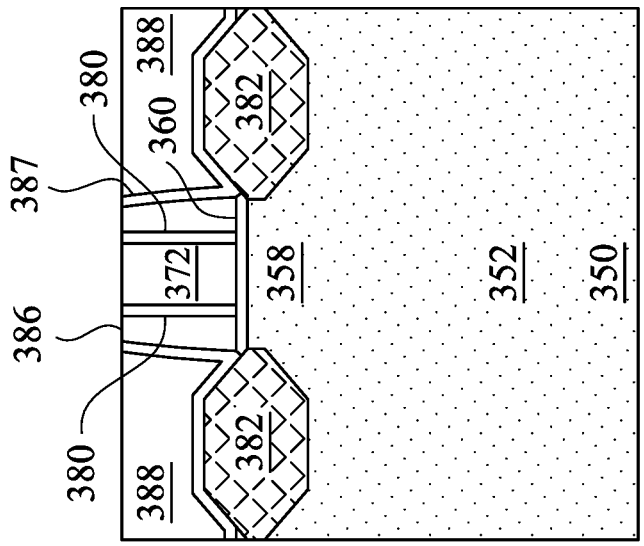
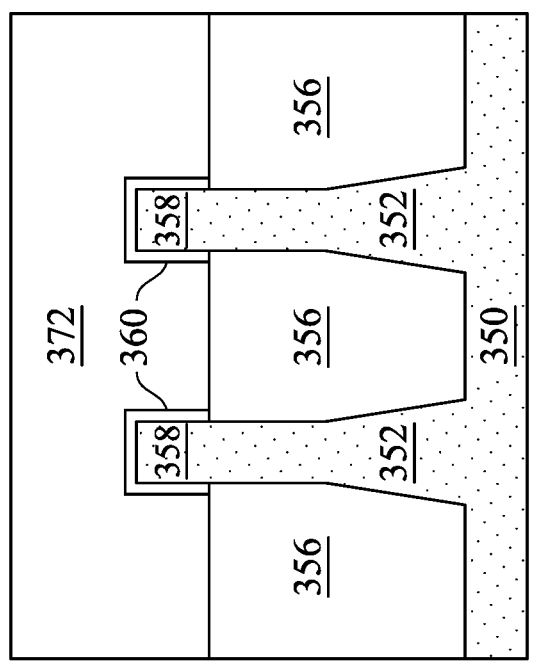
FIG. 40B
FIG. 40A

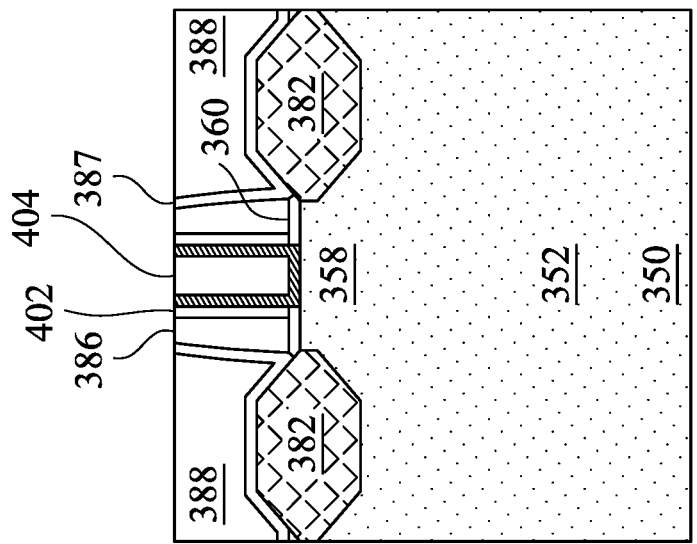
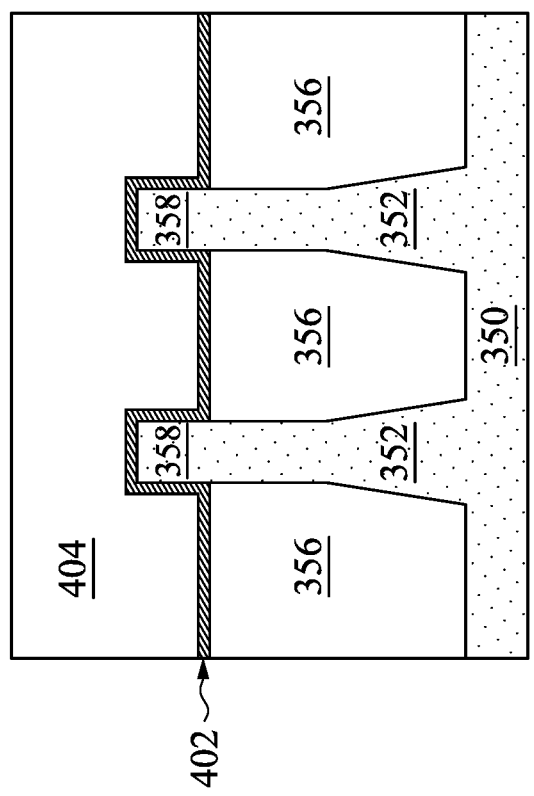
FIG. 50B
FIG. 50A

GATE STRUCTURE IN SEMICONDUCTOR DEVICE AND METHOD OF FORMING THE SAME

PRIORITY CLAIM AND CROSS-REFERENCE

This application claims the benefit of the following provisionally filed U.S. Patent applications: Application No. 63/229,677, filed on Aug. 5, 2021, and entitled "F Incorporation Method for Nanosheet Replacement Gate (RPG) Scheme and Structure Formed Thereby," and Application No. 63/219,894, filed on Jul. 9, 2021, and entitled "Novel F Incorporation with Dipole Insertion Method and Structure Formed Thereby," which applications are hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (for example, transistors, diodes, resistors, capacitors, etc.) through continual reduction in minimum feature size, which allows more components to be integrated into a given chip area. As the minimum feature sizes are reduced, however, additional problems arise and should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 8A, 8B, 9A, 9B, 10A, 10B, 10C, 11A, 11B, 12A, 12B, 12C, 13A, 13B, 14-15, 16A, 16B, 17, 18, 19A, 19B, 20A, 20B, 21A, 21B, 22A, 22B, 23A, 23B, 24A, 24B, 24C, 24D, and 24E illustrate the intermediate stages in the formation of Gate All-Around (GAA) transistors in accordance with some embodiments.

FIGS. 30-35, 36A, 36B, 37A, 37B, 38A, 38B, 38C, 38D, 39A, 39B, 40A, 40B, 41A, 41B, 42A, 42B, 42C, 43, 44, 45, 46, 47, 48, 50A, 50B, 51A, 51B, 52A, and 52B illustrate intermediate stages in the formation of FinFETs in accordance with some embodiments.

DETAILED DESCRIPTION

Figure 1:
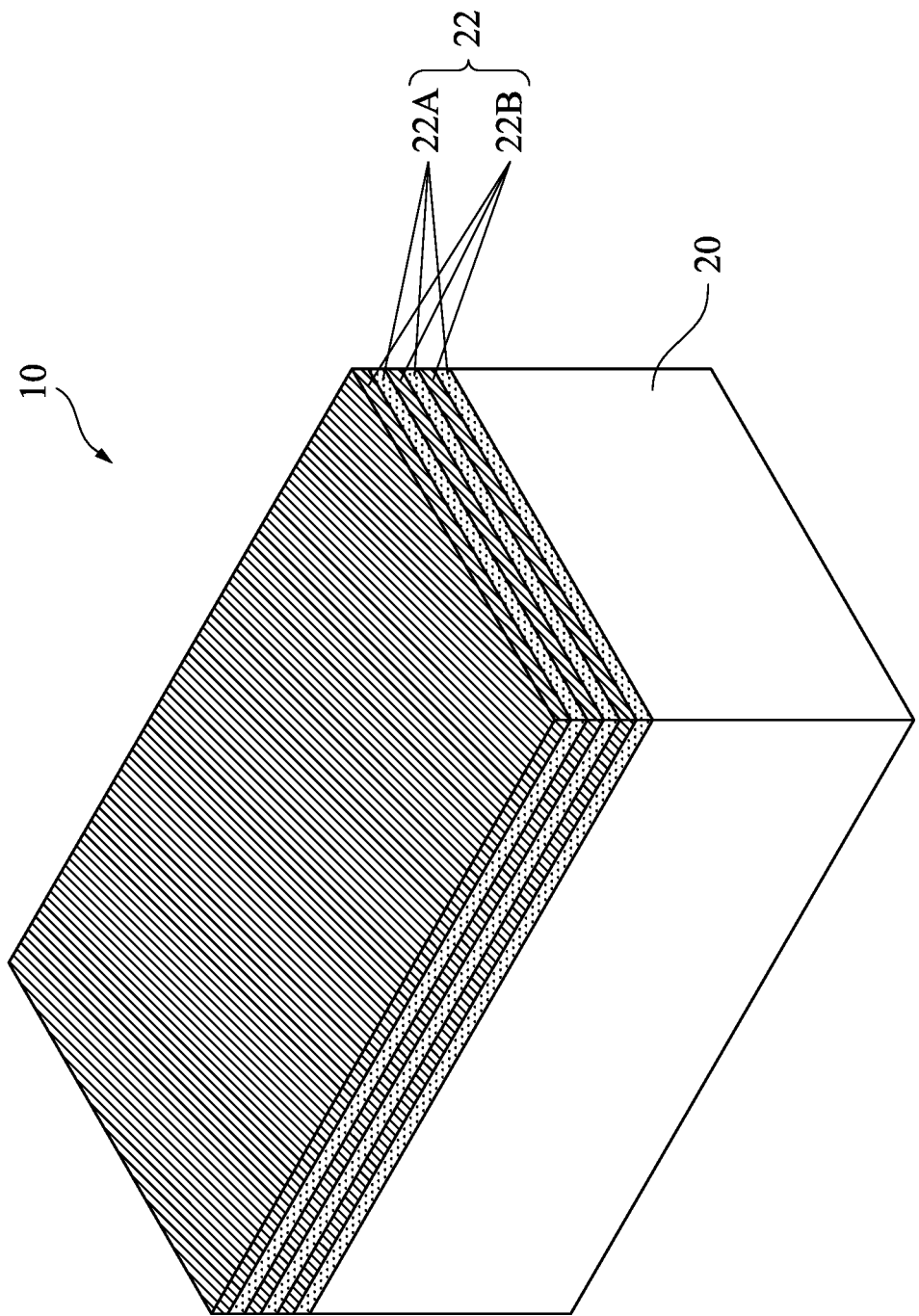

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of selectively incorporating fluorine into a gate dielectric of a replacement gate stack and the corresponding transistor are provided. In accordance with some embodiments, dummy gate stacks are removed from a first and a second device region, and nanostructures are exposed. A first and a second gate dielectrics are formed encircling the nanostructures. A protection layer may be formed on the gate dielectrics, followed by the deposition of a fluorine-containing layer. The fluorine-containing layer is removed from the second device region and left in the first device region. An annealing process is then performed to diffuse fluorine into the first gate dielectric. The fluorine-containing layer in the first device region may then be removed. Work-function layers may then be formed over the first and the second gate dielectrics.

According to some embodiments, a fluorine treatment is applied to one or more gate dielectric layers of a gate structure, and a dipole dopant species is diffused into the gate dielectric layers, thereby tuning the work functions (and thus threshold voltages) of the subsequently formed transistors. These aspects can further be implemented in various combinations, with or without additional work function tuning layers in the gate structures to tune threshold voltages. In some embodiments, the work functions of the transistors may be tuned by dipole doping, so that a work function tuning layer can be omitted from the gate structure, allowing the gate structures to be formed to a smaller size. Threshold voltages of subsequently formed transistors may thus be tuned without negatively affecting respective spacings for the gate structures of the transistors by controlling the concentration of the dipole dopant species in the gate dielectric layers. Introduction of the dipole dopant species in the gate dielectric layers may cause charge buildup in the gate dielectric layers, leading to leakage path and reliability issues of the transistors. That charge buildup may be reduced by additionally diffusing the fluorine into the gate dielectric layers.

In the description of the present disclosure, Gate All-Around (GAA) transistors (also referred to as nanostructure, e.g., nanosheet, nanowire, or the like, field effect transistors (NSFETs)), and Fin Field-Effect Transistors (FinFETs) are discussed to explain the concept of the present disclosure. The embodiments of the present disclosure may also be applied to other types of transistors such as planar transistors and the like.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 28:
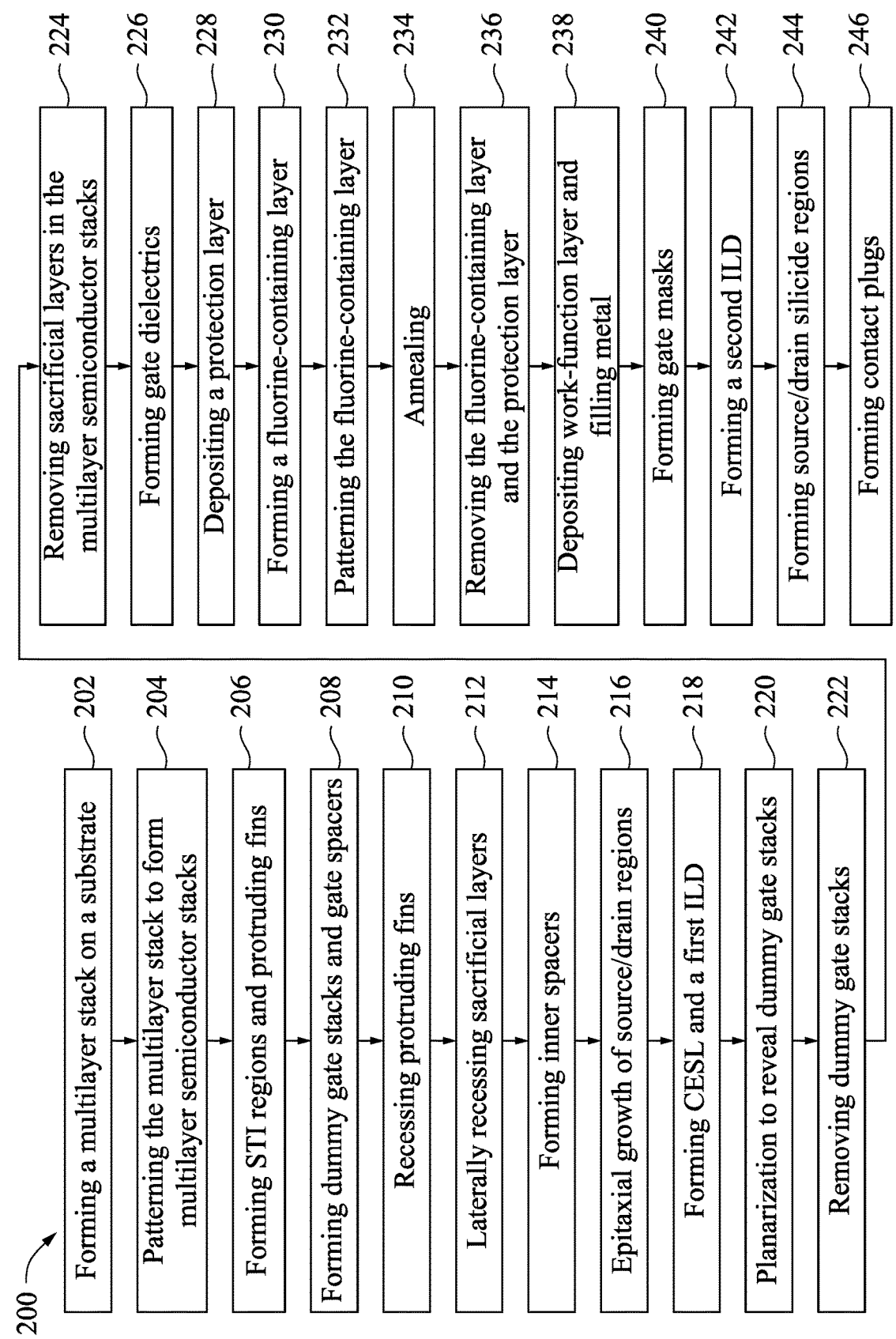
FIG. 28 illustrates a process flow for forming a GAA transistor in accordance with some embodiments.

FIGS. 1-4, 5A, 5B, 6A, 6B, 7A, 7B, 8A, 8B, 9A, 9B, 10A, 10B, 10C, 11A, 11B, 12A, 12B, 12C, 13A, 13B, 14-15, 16A, 16B, 17, 18, 19A, 19B, 20A, 20B, 21A, 21B, 22A, 22B, 23A, 23B, 24A, 24B, 24C, 24D, and 24E illustrate various views of intermediate stages in the formation of GAA transistors in accordance with some embodiments of the present disclosure. The corresponding processes are also reflected schematically in the process flow shown in FIG. 28.

Referring to FIG. 1, a perspective view of wafer 10 is shown. Wafer 10 includes a multilayer structure comprising multilayer stack 22 on substrate 20. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor.

In accordance with some embodiments, multilayer stack 22 is formed through a series of deposition processes for depositing alternating materials. The respective process is illustrated as process 202 in the process flow 200 shown in FIG. 28. In accordance with some embodiments, multilayer stack 22 comprises first layers 22A formed of a first semiconductor material and second layers 22B formed of a second semiconductor material different from the first semiconductor material.

In accordance with some embodiments, the first semiconductor material of a first layer 22A is formed of or comprises SiGe, Ge, Si, GaAs, InSb, GaSb, InAlAs, InGaAs, GaSbP, GaAsSb, or the like. In accordance with some embodiments, the deposition of first layers 22A (for example, SiGe) is through epitaxial growth, and the corresponding deposition method may be Vapor-Phase Epitaxy (VPE), Molecular Beam Epitaxy (MBE), Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the first layer 22A is formed to a first thickness in the range between about 30 Å and about 300 Å. However, any suitable thickness may be utilized while remaining within the scope of the embodiments.

Once the first layer 22A has been deposited over substrate 20, a second layer 22B is deposited over the first layer 22A. In accordance with some embodiments, the second layers 22B is formed of or comprises a second semiconductor material such as Si, SiGe, Ge, GaAs, InSb, GaSb, InAlAs, InGaAs, GaSbP, GaAsSb, combinations of these, or the like, with the second semiconductor material being different from the first semiconductor material of first layer 22A. For example, in accordance with some embodiments in which the first layer 22A is silicon germanium, the second layer 22B may be formed of silicon, or vice versa. It is appreciated that any suitable combination of materials may be utilized for first layers 22A and the second layers 22B.

In accordance with some embodiments, the second layer 22B is epitaxially grown on the first layer 22A using a deposition technique similar to that is used to form the first layer 22A. In accordance with some embodiments, the second layer 22B is formed to a similar thickness to that of the first layer 22A. The second layer 22B may also be formed to a thickness that is different from the first layer 22A. In accordance with some embodiments, the second layer 22B may be formed to a second thickness in the range between about 10 Å and about 500 Å, for example.

Once the second layer 22B has been formed over the first layer 22A, the deposition process is repeated to form the remaining layers in multilayer stack 22, until a desired topmost layer of multilayer stack 22 has been formed. In accordance with some embodiments, first layers 22A have thicknesses the same as or similar to each other, and second layers 22B have thicknesses the same as or similar to each other. First layers 22A may also have the same thicknesses as, or different thicknesses from, that of second layers 22B. In accordance with some embodiments, first layers 22A are removed in the subsequent processes, and are alternatively referred to as sacrificial layers 22A throughout the description. In accordance with alternative embodiments, second layers 22B are sacrificial, and are removed in the subsequent processes.

In accordance with some embodiments, there are some pad oxide layer(s) and hard mask layer(s) (not shown) formed over multilayer stack 22. These layers are patterned, and are used for the subsequent patterning of multilayer stack 22.

Figure 2:
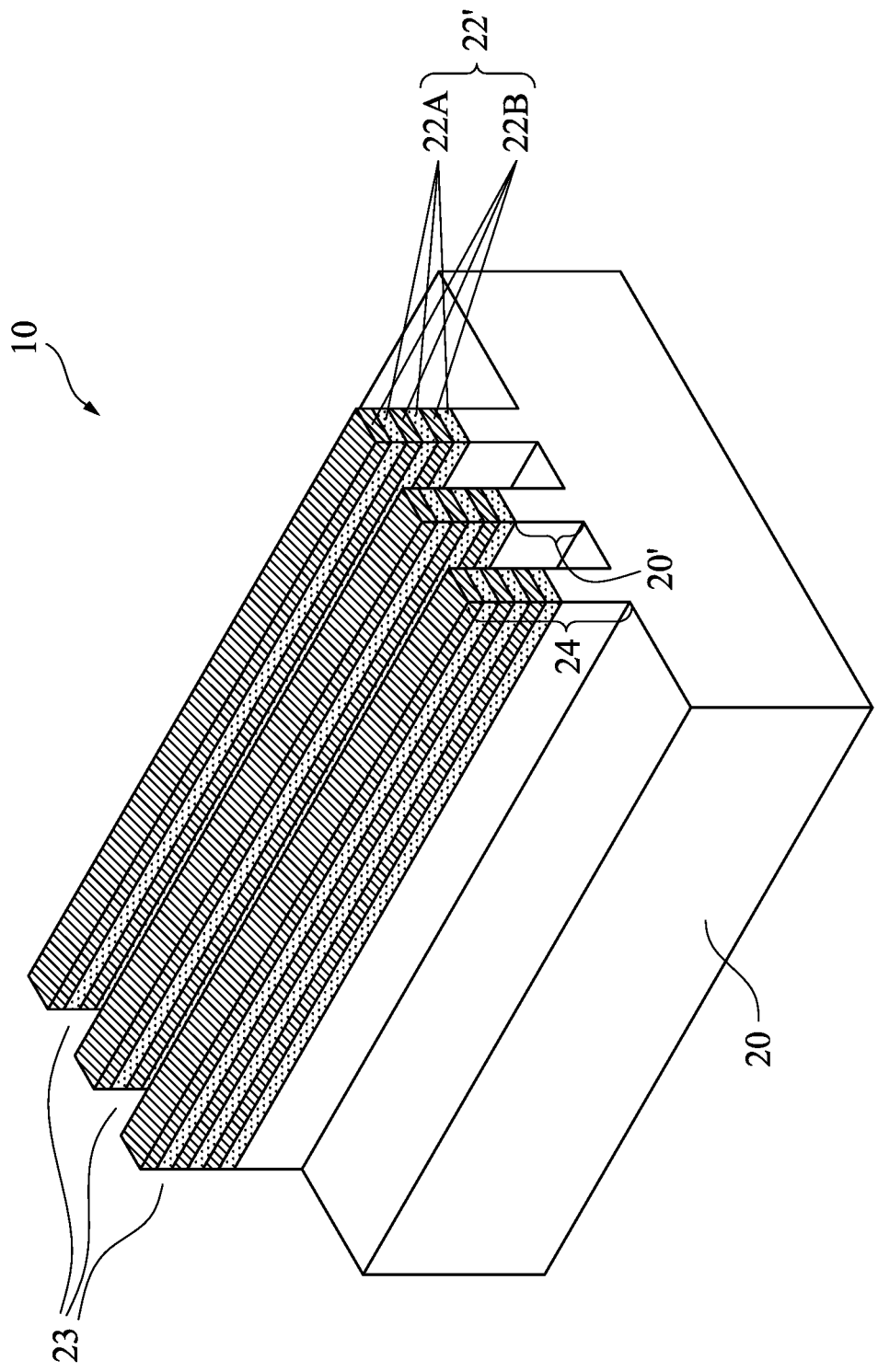

Referring to FIG. 2, multilayer stack 22 and a portion of the underlying substrate 20 are patterned in an etching process(es), so that trenches 23 are formed. The respective process is illustrated as process 204 in the process flow 200 shown in FIG. 28. Trenches 23 extend into substrate 20. The remaining portions of multilayer stacks are referred to as multilayer stacks 22' hereinafter. Underlying multilayer stacks 22', some portions of substrate 20 are left, and are referred to as substrate strips 20' hereinafter. Multilayer stacks 22' include semiconductor layers 22A and 22B. Semiconductor layers 22A are alternatively referred to as sacrificial layers, and Semiconductor layers 22B are alternatively referred to as nanostructures hereinafter. The portions of multilayer stacks 22' and the underlying substrate strips 20' are collectively referred to as semiconductor strips 24.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
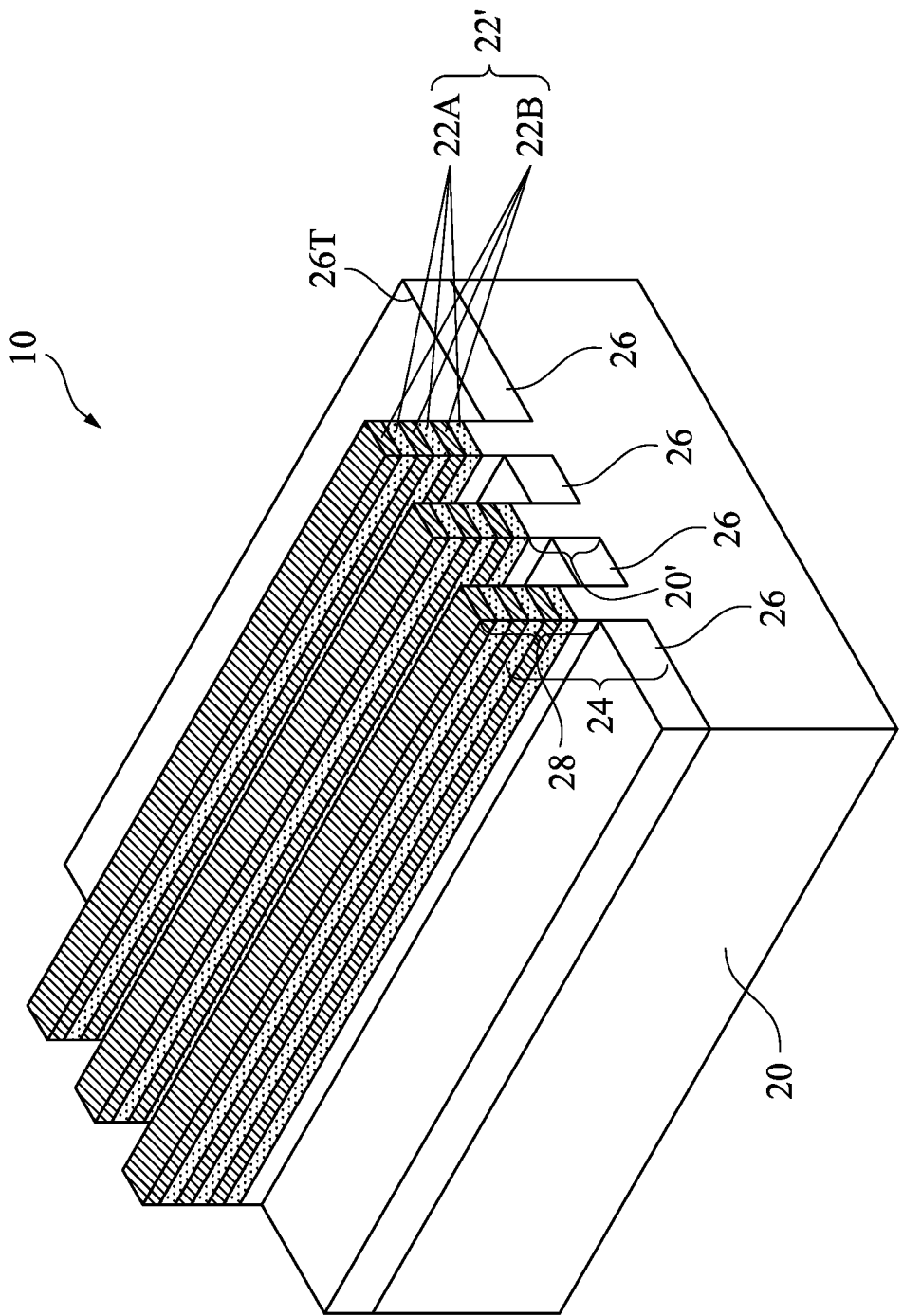

FIG. 3 illustrates the formation of isolation regions 26, which are also referred to as Shallow Trench Isolation (STI) regions throughout the description. The respective process is illustrated as process 206 in the process flow 200 shown in FIG. 28. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric material are STI regions 26.

STI regions 26 are then recessed, so that the top portions of semiconductor strips 24 protrude higher than the top surfaces 26T of the remaining portions of STI regions 26 to form protruding fins 28. Protruding fins 28 include multilayer stacks 22' and the top portions of substrate strips 20'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include HF, for example.

Figure 4:
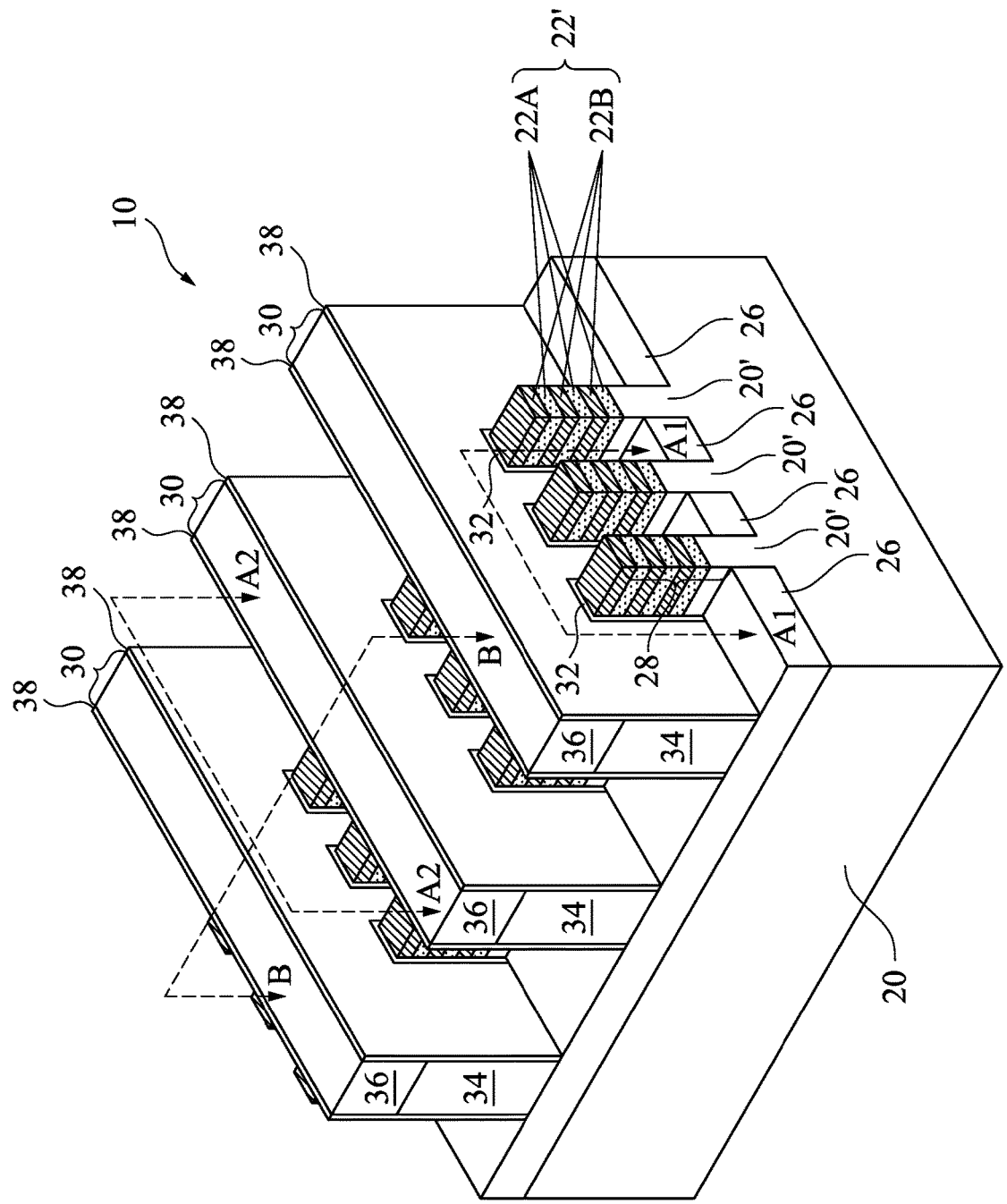

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 28. Dummy gate stacks 30 may include dummy gate dielectrics 32 and dummy gate electrodes 34 over dummy gate dielectrics 32. Dummy gate dielectrics 32 may be formed by oxidizing the surface portions of protruding fins 28 to form oxide layers, or by depositing a dielectric layer such as a silicon oxide layer. Dummy gate electrodes 34 may be formed, for example, using polysilicon or amorphous silicon, and other materials such as amorphous carbon may also be used.

Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a patterning process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

Figure 5B:
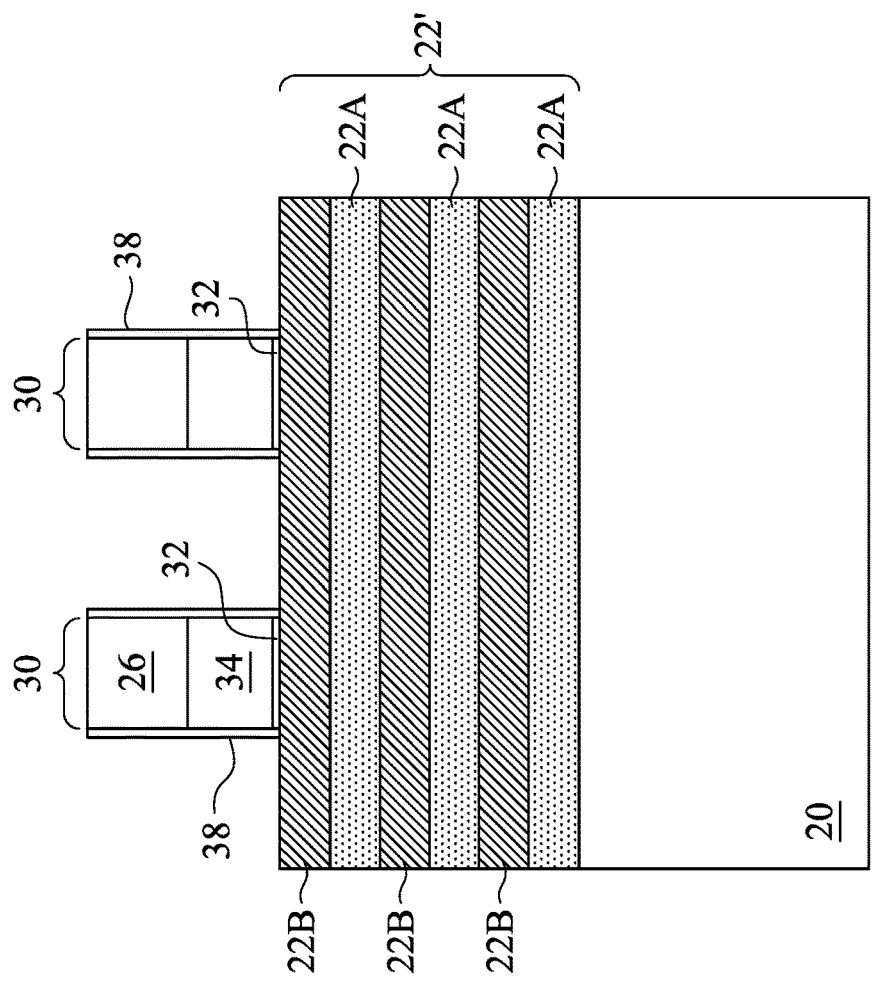
Figure 5A:
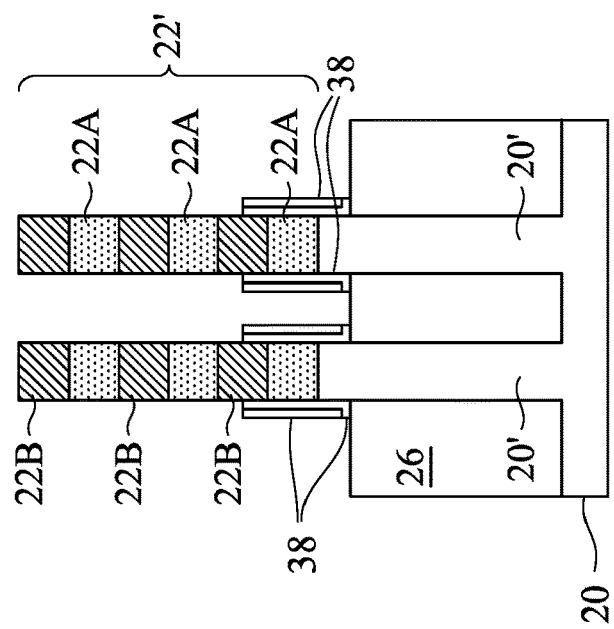

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by gate stacks 30 and gate spacers 38, and is perpendicular to the gate-length direction. Fin spacers 38, which are on the sidewalls of protruding fins 28, are also illustrated. FIG. 5B illustrates the reference cross-section B-B in FIG. 4, which reference cross-section is parallel to the lengthwise directions of protruding fins 28.

Figure 6B:
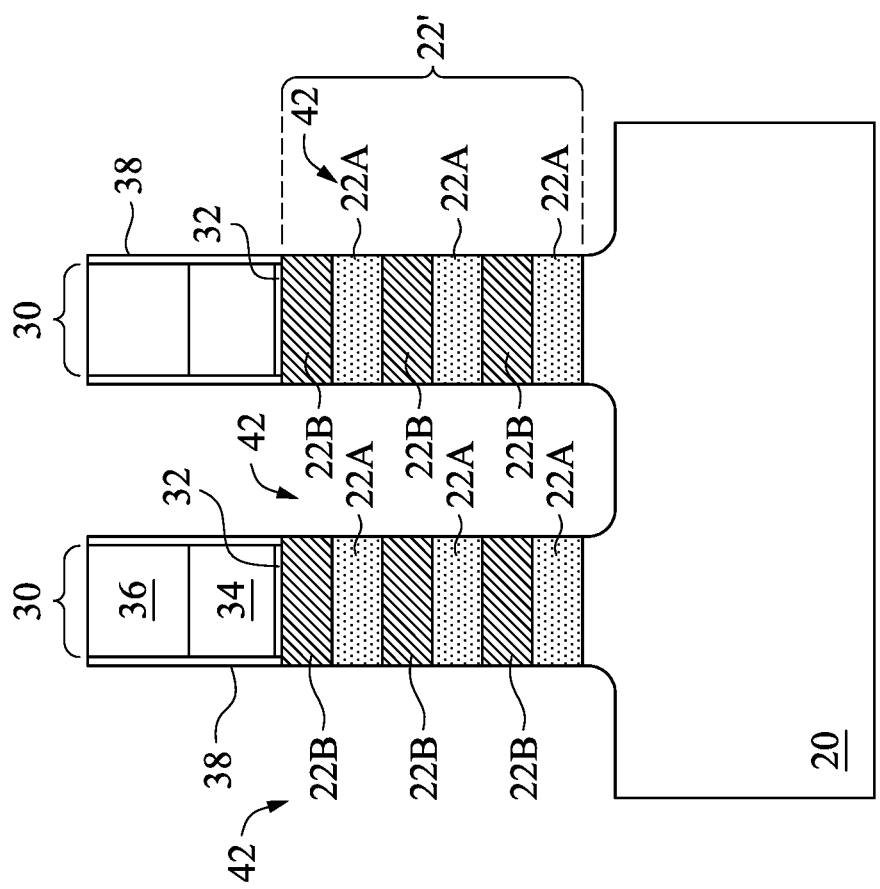
Figure 6A:
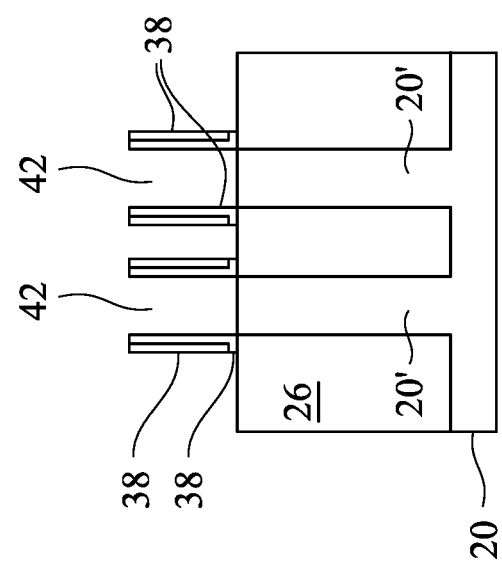

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 28. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch multilayer semiconductor stacks 22' and the underlying substrate strips 20'. The bottoms of recesses 42 are at least level with, or may be lower than (as shown in FIG. 6B), the bottoms of multilayer semiconductor stacks 22'. The etching may be anisotropic, so that the sidewalls of multilayer semiconductor stacks 22' facing recesses 42 are vertical and straight, as shown in FIG. 6B.

Figure 7B:
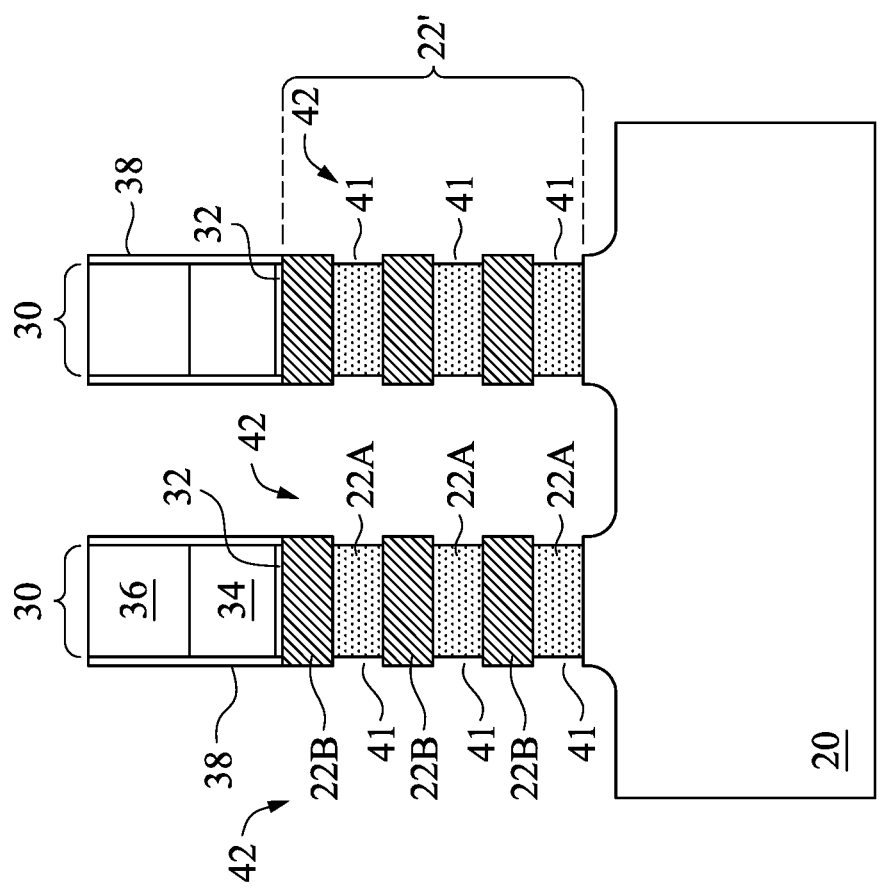
Figure 7A:
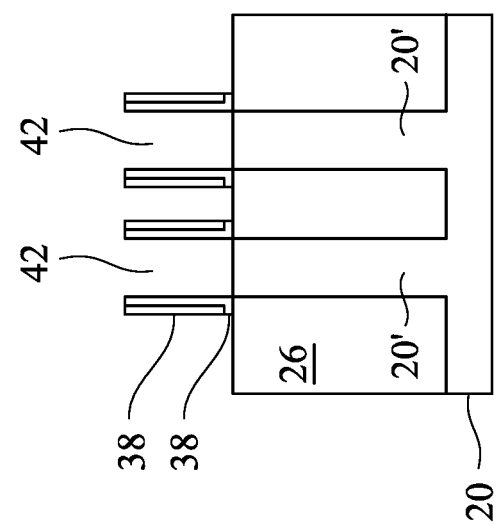

Referring to FIGS. 7A and 7B, sacrificial semiconductor layers 22A are laterally recessed to form lateral recesses 41, which are recessed from the edges of the respective overlying and underlying nanostructures 22B. The respective process is illustrated as process 212 in the process flow 200 shown in FIG. 28. The lateral recessing of sacrificial semiconductor layers 22A may be achieved through a wet etching process using an etchant that is more selective to the material (for example, silicon germanium (SiGe)) of sacrificial semiconductor layers 22A than the material (for example, silicon (Si)) of the nanostructures 22B and substrate 20. For example, in an embodiment in which sacrificial semiconductor layers 22A are formed of silicon germanium and the nanostructures 22B are formed of silicon, the wet etching process may be performed using an etchant such as hydrochloric acid (HCl). The wet etching process may be performed using a dip process, a spray process, or the like, and may be performed using any suitable process temperatures (for example, between about 400° C. and about 600° C.) and a suitable process time (for example, between about 100 seconds and about 1,000 seconds). In accordance with alternative embodiments, the lateral recessing of sacrificial semiconductor layers 22A is performed through an isotropic dry etching process or a combination of a dry etching process and a wet etching process.

Figure 8B:
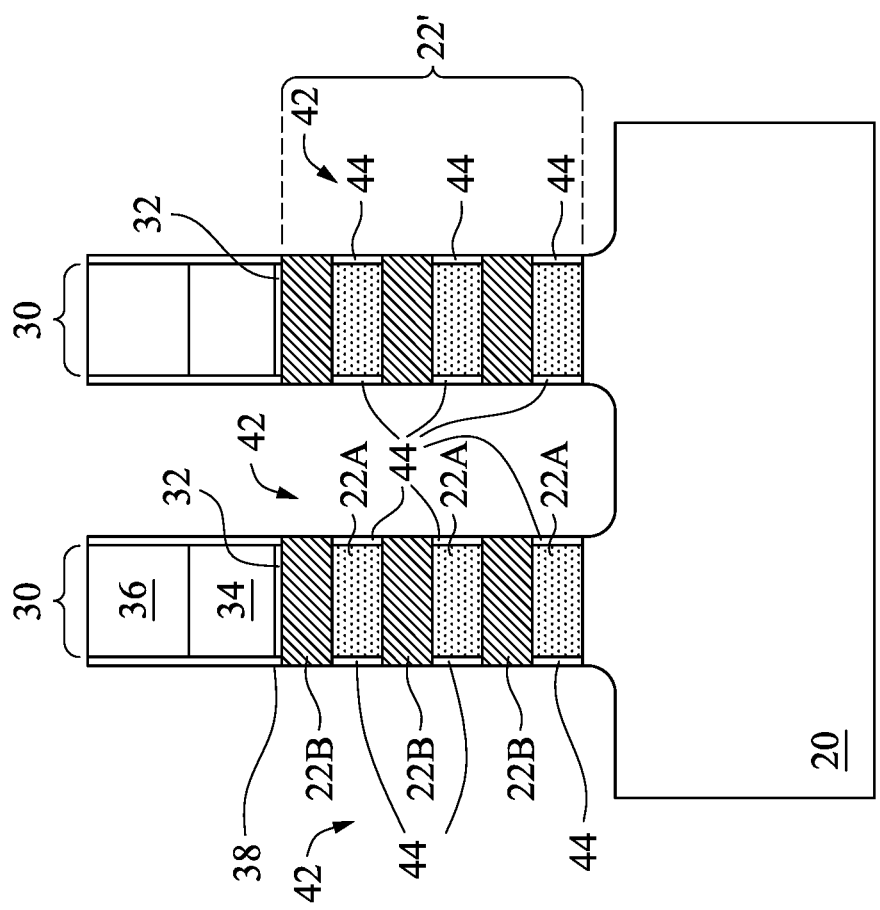
Figure 8A:
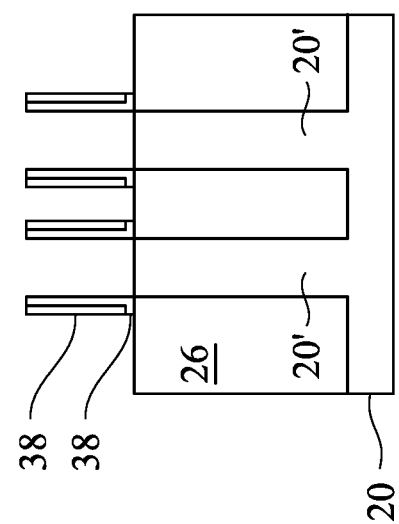

FIGS. 8A and 8B illustrate the formation of inner spacers 44. The respective process is illustrated as process 214 in the process flow 200 shown in FIG. 28. The formation process incudes depositing a spacer layer extending into recesses 41, and performing an etching process to remove the portions of inner spacer layer outside of recesses 41, thus leaving inner spacers 44 in recesses 41. Inner spacers 44 may be formed of or comprise SiOCN, SiON, SiOC, SiCN, or the like. Inner spacers 44 may also be porous so that they have a lower-k value lower than, for example, about 3.5. In accordance with some embodiments, the etching of the spacer layer may be performed through a wet etching process, in which the etching chemical may include $H_2SO_4$, diluted HF, ammonia solution ($NH_4OH$, ammonia in water), or the like, or combinations thereof.

Figure 9B:
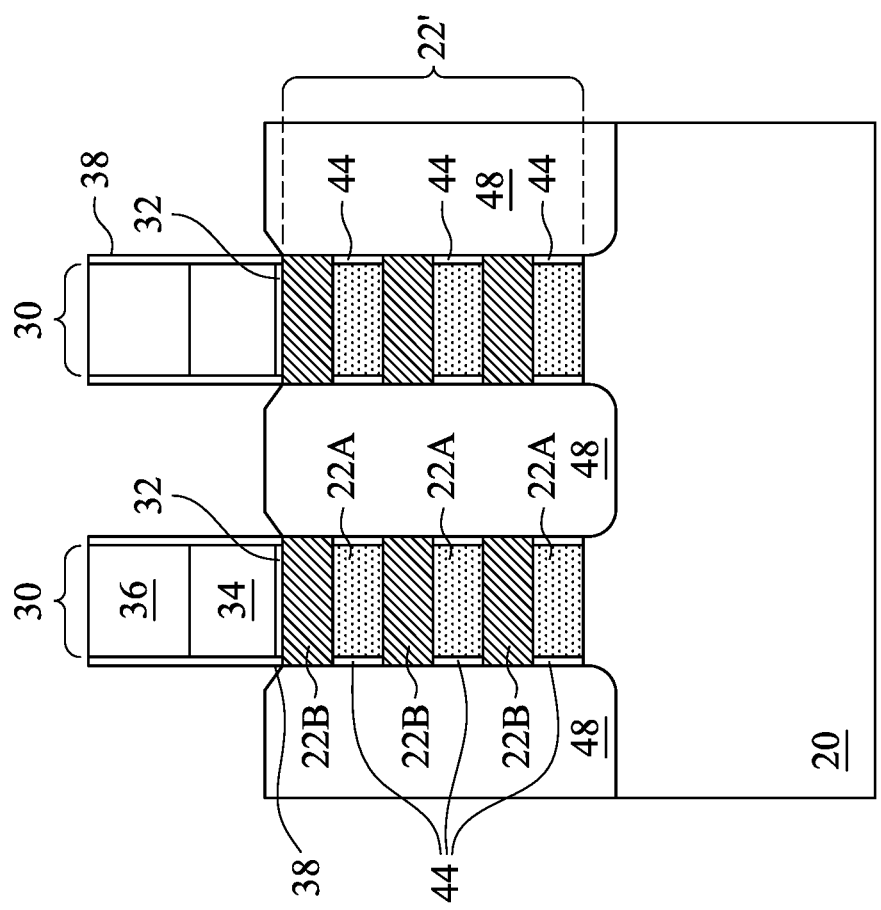
Figure 9A:
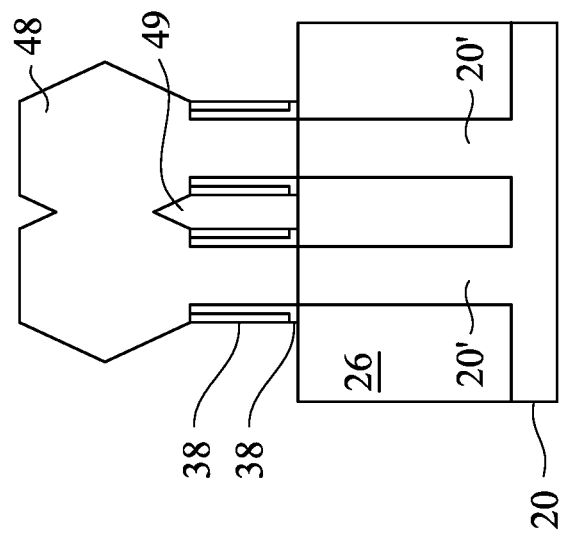

Referring to FIGS. 9A and 9B, epitaxial source/drain regions 48 are formed in recesses 42. The respective process is illustrated as process 216 in the process flow 200 shown in FIG. 28. In accordance with some embodiments, the source/drain regions 48 may exert stress on the nanostructures 22B, which are used as the channels of the corresponding GAA transistors, thereby improving performance. In accordance with some embodiments, the corresponding transistor is n-type, and epitaxial source/drain regions 48 are accordingly formed as of n-type by doping an n-type dopant. For example, silicon phosphorous (SiP), silicon carbon phosphorous (SiCP), or the like may be grown to form epitaxial source/drain regions 48. After recesses 42 are filled with epitaxy regions 48, the further epitaxial growth of epitaxy regions 48 causes epitaxy regions 48 to expand horizontally, and facets may be formed. The further growth of epitaxy regions 48 may also cause neighboring epitaxy regions 48 to merge with each other.

After the epitaxy process, epitaxy regions 48 may be further implanted with an n-type impurity to form source and drain regions, which are also denoted using reference numeral 48. In accordance with alternative embodiments of the present disclosure, the implantation process is skipped when epitaxy regions 48 are in-situ doped with the n-type impurity during the epitaxy, and the epitaxy regions 48 are also source/drain regions.

Figure 10B:
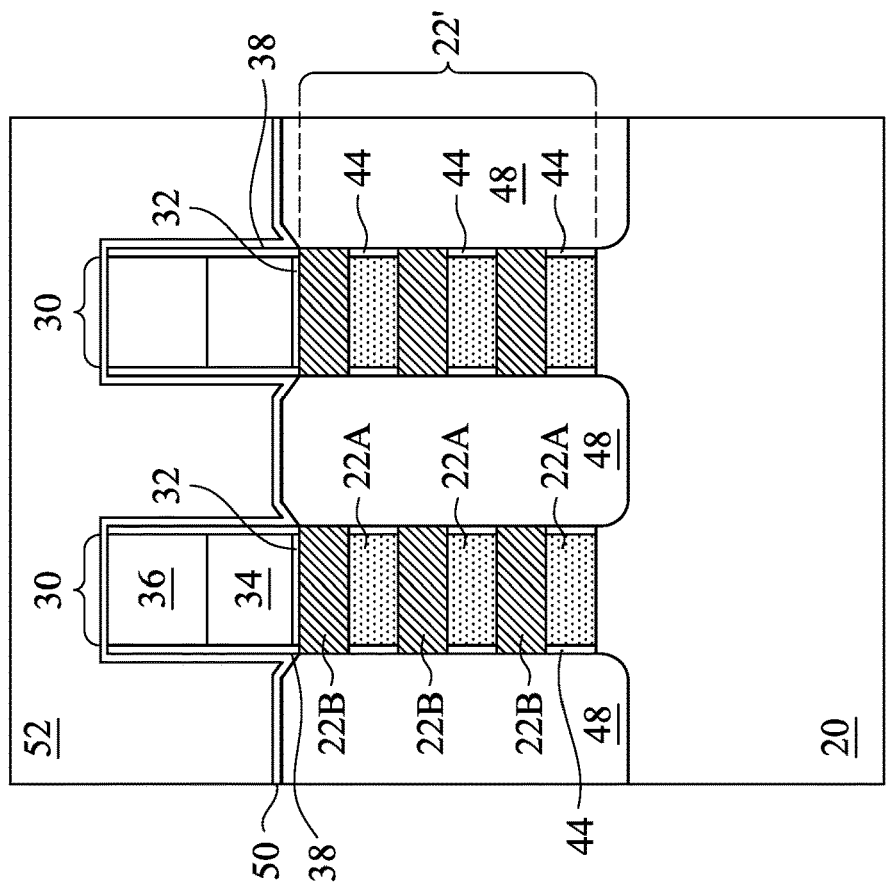
Figure 10A:
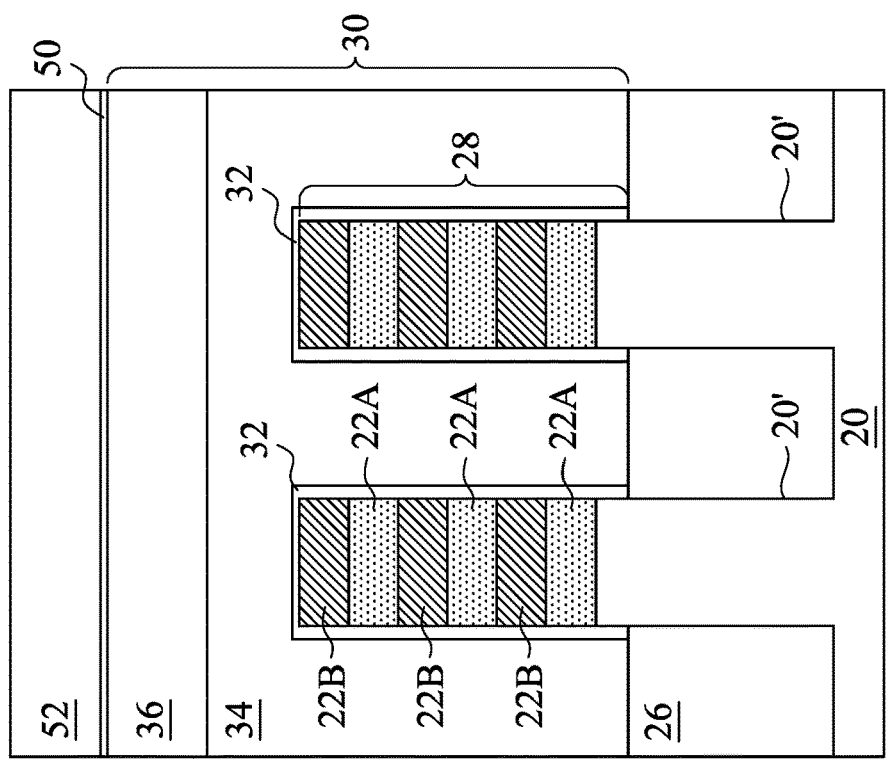
Figure 10C:
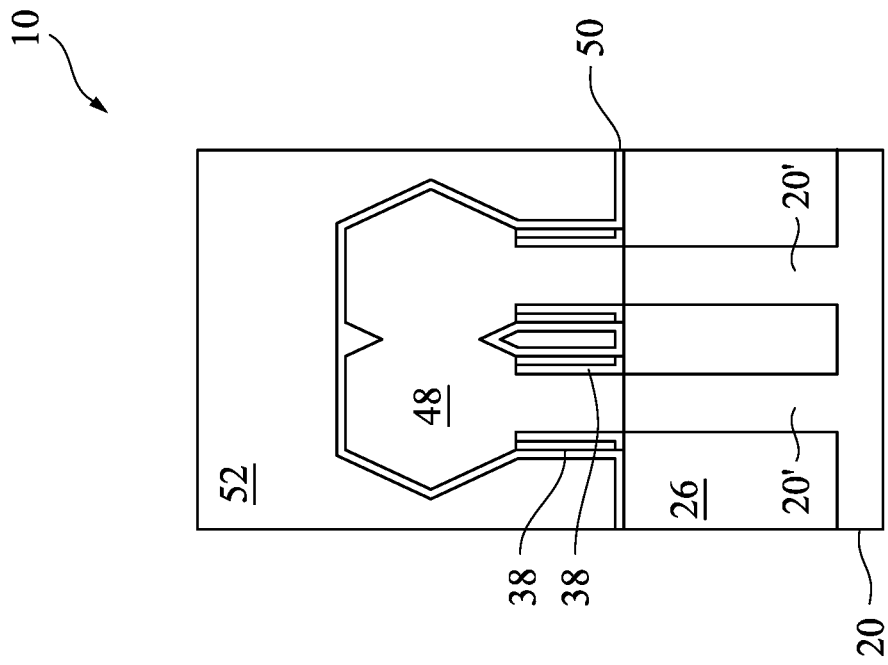

FIGS. 10A, 10B, and 10C illustrate the cross-sectional views of the structure after the formation of Contact Etch Stop Layer (CESL) 50 and Inter-Layer Dielectric (ILD) 52. FIGS. 10A, 10B, and 10C are obtained from the same cross-section same as the cross-sections A2-A2, B-B, and A1-A1, respectively, in FIG. 4. The respective process is illustrated as process 218 in the process flow 200 shown in FIG. 28. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

Figure 11B:
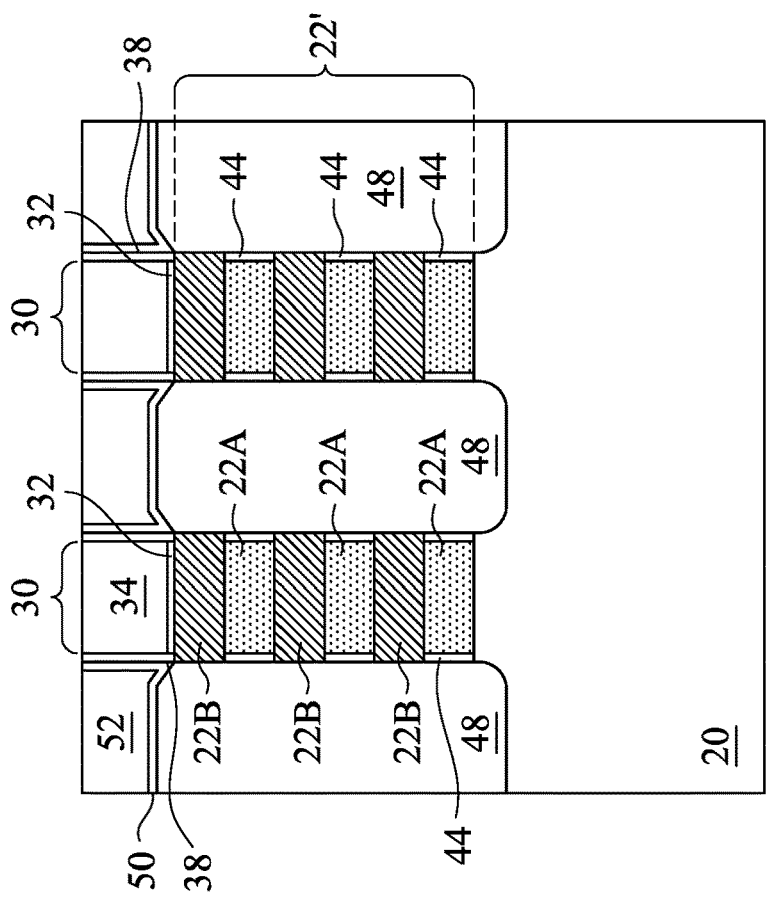
Figure 11A:
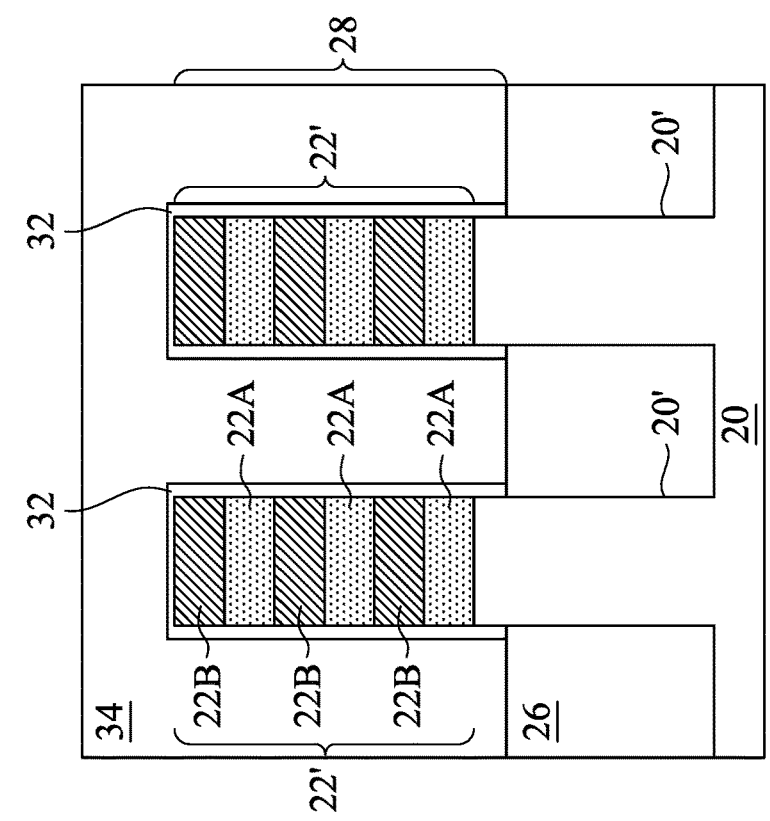

In subsequent processes, replacement gate stacks are formed to replace dummy gate stacks 30. Referring to FIGS. 11A and 11B, a planarization process such as a CMP process or a mechanical grinding process is performed to level the top surface of ILD 52. The respective process is illustrated as process 220 in the process flow 200 shown in FIG. 28. In accordance with some embodiments, the planarization process may remove hard masks 36 to reveal dummy gate electrodes 34, as shown in FIG. 11B. In accordance with alternative embodiments, the planarization process may reveal, and is stopped on, hard masks 36. In accordance with some embodiments, after the planarization process, the top surfaces of dummy gate electrodes 34 (or hard masks 36), gate spacers 38, and ILD 52 are level with each other within process variations.

Figure 12C:
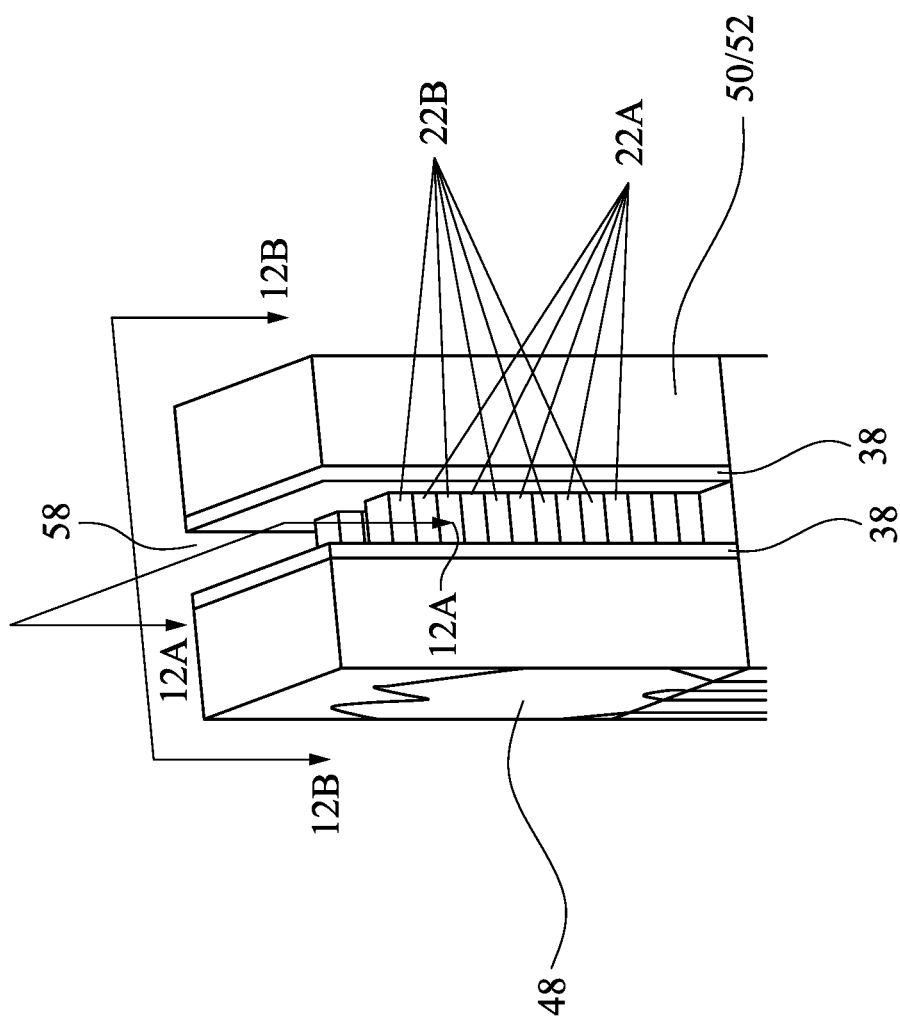

Next, dummy gate electrodes 34 (and hard masks 36, if remaining) are removed in one or more etching processes, so that recesses 58 are formed, as shown in FIGS. 12A, 12B and 12C. The respective process is illustrated as process 222 in the process flow 200 shown in FIG. 28. FIG. 12C illustrates a perspective view of the structure, and FIGS. 12A and 12B illustrate the cross-sections 12A-12A and 12B-12B, respectively, in FIG. 12C. The portions of the dummy gate dielectrics 32 in recesses 58 are also removed. In accordance with some embodiments, dummy gate electrodes 34 and dummy gate dielectrics 32 are removed through dry etching processes. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The corresponding portions of the multilayer stacks 22' are between neighboring pairs of the epitaxial source/drain regions 48.

Figure 13B:
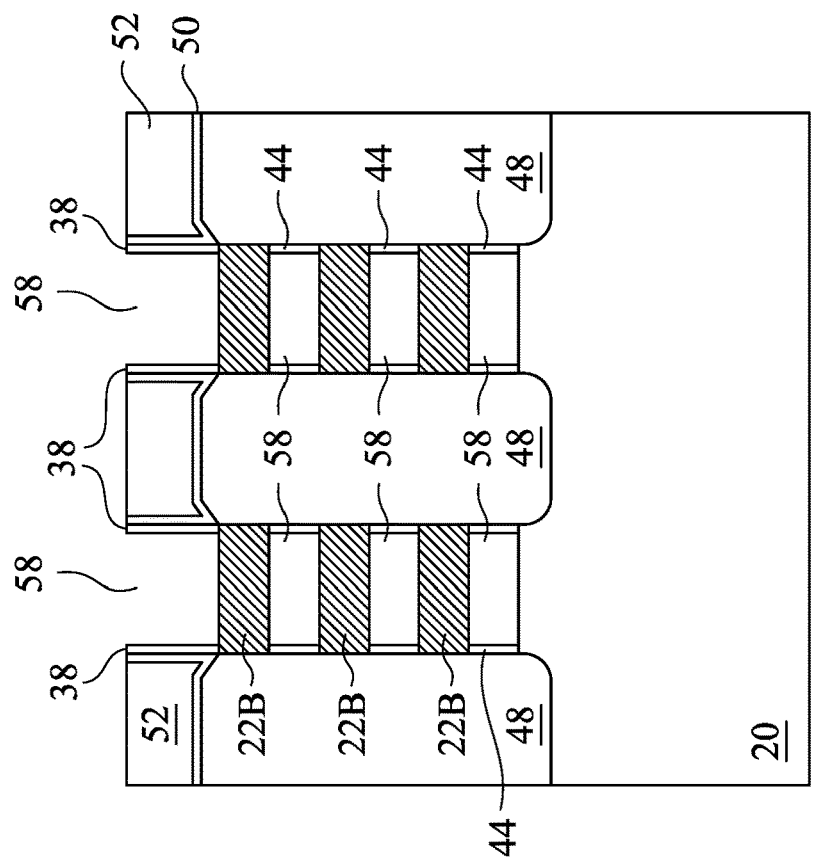
Figure 13A:
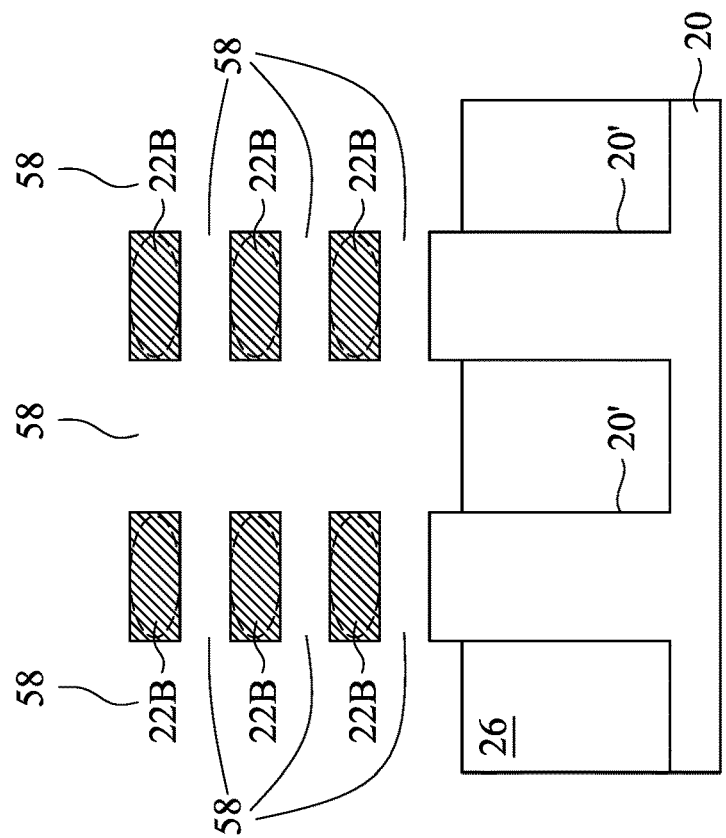

Sacrificial layers 22A are then removed to extend recesses 58 between nanostructures 22B, and the resulting structure is shown in FIGS. 13A and 13B. The respective process is illustrated as process 224 in the process flow 200 shown in FIG. 28. Sacrificial layers 22A may be removed by performing an isotropic etching process such as a wet etching process using etchants which are selective to the materials of sacrificial layers 22A. Nanostructures 22B, substrate 20, STI regions 26 remain relatively un-etched as compared to sacrificial layers 22A. In accordance with some embodiments in which sacrificial layers 22A include, for example, SiGe, and nanostructures 22B include, for example, Si or SiC, tetra methyl ammonium hydroxide (TMAH), ammonium hydroxide ($NH_4OH$), or the like may be used to remove sacrificial layers 22A. It is appreciated that although FIG. 13A and subsequent figures illustrate the cross-sections of nanostructures 22B as being rectangular, nanostructures 22B may have rounded corners, as illustrated by dashed lines in FIG. 13A.

Figure 14:
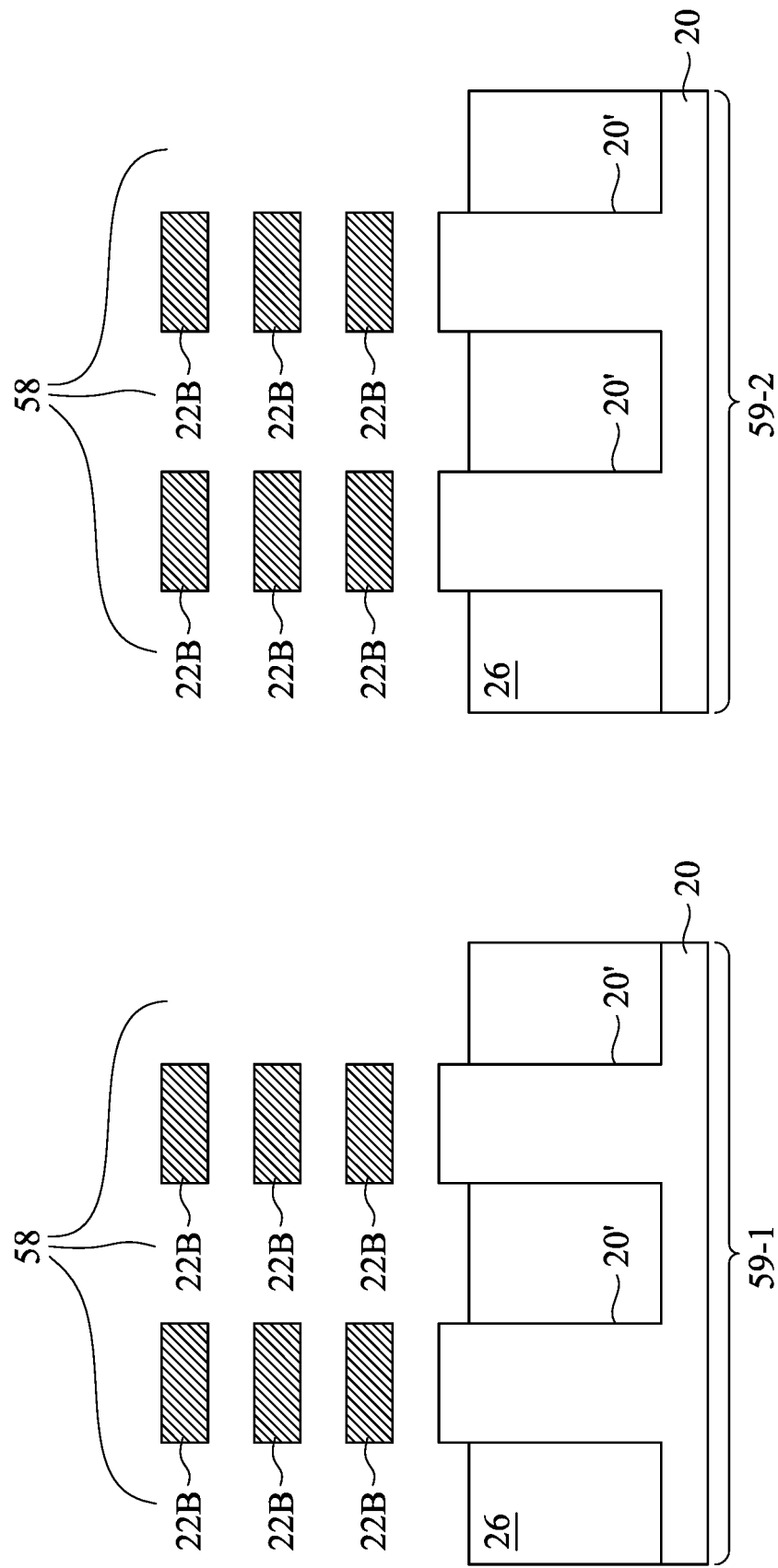

The preceding processes may be used for forming multiple types of GAA transistors. In subsequent discussion, two device regions are illustrated, each for forming a transistor therein. For example, FIG. 14 illustrates two device regions 59-1 and 59-2, and the structures shown therein are formed using the processes as discussed in preceding paragraphs. Each of device regions 59-1 and 59-2 may include an n-type transistor region or a p-type transistor region in any combination. For example, device regions 59-1 and 59-2 may be an n-type transistor region and a p-type transistor region, respectively, or may be a p-type transistor region and an n-type transistor region, respectively. Alternatively, both of device regions 59-1 and 59-2 are n-type transistor regions, or both of device regions 59-1 and 59-2 are p-type transistor regions.

Figure 15:
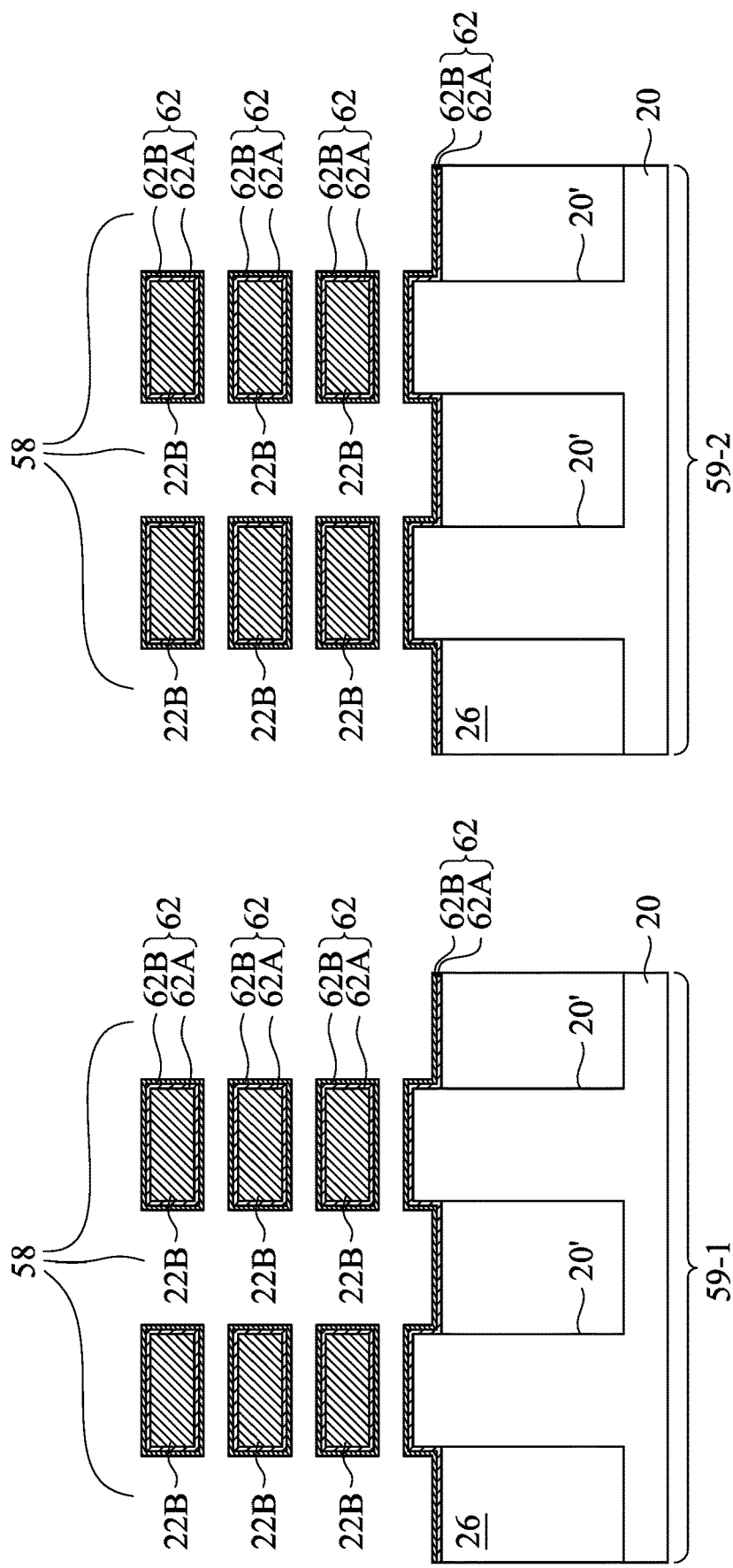

Referring to FIG. 15, gate dielectrics 62 are formed. The respective process is illustrated as process 226 in the process flow 200 shown in FIG. 28. In accordance with some embodiments, each of gate dielectrics 62 includes interfacial layer 62A and high-k dielectric layer 62B on the interfacial layer 62A. The interfacial layer 62A may be formed of or comprises silicon oxide, which may be deposited through a conformal deposition process such as ALD or CVD. In accordance with alternative embodiments, interfacial layer 62A is formed through thermal oxidation. When formed through thermal oxidation, the portions of interfacial layer 62A on the top surfaces of STI regions 26 will not be formed. In accordance with some embodiments, the high-k dielectric layers 62B comprise one or more dielectric layers. For example, the high-k dielectric layer(s) 62B may include a metal oxide or a silicate of hafnium, aluminum, zirconium, lanthanum, manganese, barium, titanium, lead, or combinations thereof.

Figure 16A:
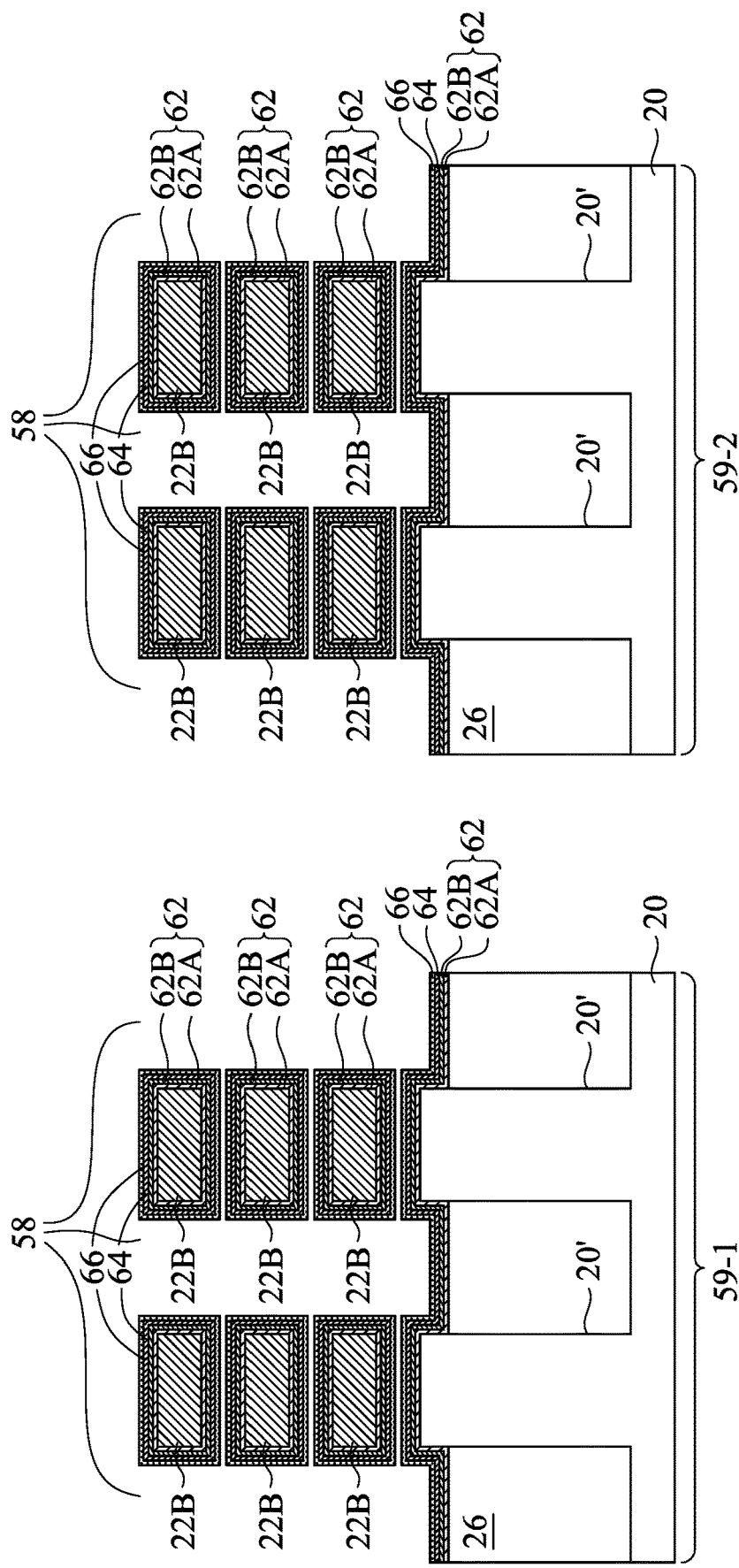

Referring to FIG. 16A, protection layer 64 is deposited conformally over the gate dielectrics 62. The respective process is illustrated as process 228 in the process flow 200 shown in FIG. 28. In accordance with some embodiments, protection layer 64 comprises titanium nitride, tantalum nitride, titanium silicon nitride (TiSiN), or the like. Protection layer 64 may be deposited through a conformal deposition process such as CVD, ALD, or the like, so that protection layer 64 includes portions encircling each of gate dielectrics 62.

The thickness of protection layer 64 affects the results, and hence is controlled to be in a selected range. When the thickness is too small, protection layer 64 may not form a complete mono layer that fully encircles gate dielectrics 62, and cannot protect gate dielectrics 62. When the thickness is too big, it is difficult for fluorine to diffuse through it to reach gate dielectric layer 62 in a short annealing time and at a low annealing temperature. Also, by controlling protection layer 64 not to be too thick, and with the subsequent annealing being finished in a short period of time, the metal elements in subsequently deposited fluorine-containing layer 66, which metal elements diffuse slower than fluorine, is advantageously not significantly diffused through protection layer 64 and diffuse into gate dielectrics 62.

Further referring to FIG. 16A, fluorine-containing layer 66 is formed on gate dielectric 62. The respective process is illustrated as process 230 in the process flow 200 shown in FIG. 28. In accordance with some embodiments, the formation process includes a deposition process, which includes CVD, ALD, or the like. The precursor used in the deposition process may include a fluorine-containing precursor and a reducing agent. The fluorine-containing precursor may include $WF_6$, and the reducing agent may include $SiH_4$, $B_2H_6$, $H_2$, the like, or combinations thereof. Protection layer 64 has may protect gate dielectrics 62 in the deposition process, and may prevent the precursors (e.g., the fluorine-containing precursor) from etching gate dielectrics 62. The fluorine-containing layer 66 may be deposited at temperatures in the range between about 250° C. and about 475° C. The pressure of the respective chamber may be in the range between about 0.5 Torr and about 400 Torr. In accordance with some embodiments, at a time the deposition of fluorine-containing layer 66 is finished, an atomic percentage of fluorine in the deposited fluorine-containing layer 66 may be in the range between about 3.5 percent and about 40 percent. It is appreciated that although fluorine-containing layer 66 may be a continuous layer fully encircling the corresponding protection layer 64, fluorine-containing layer 66 may form a discontinuous layer in accordance with alternative embodiments.

Figure 16B:
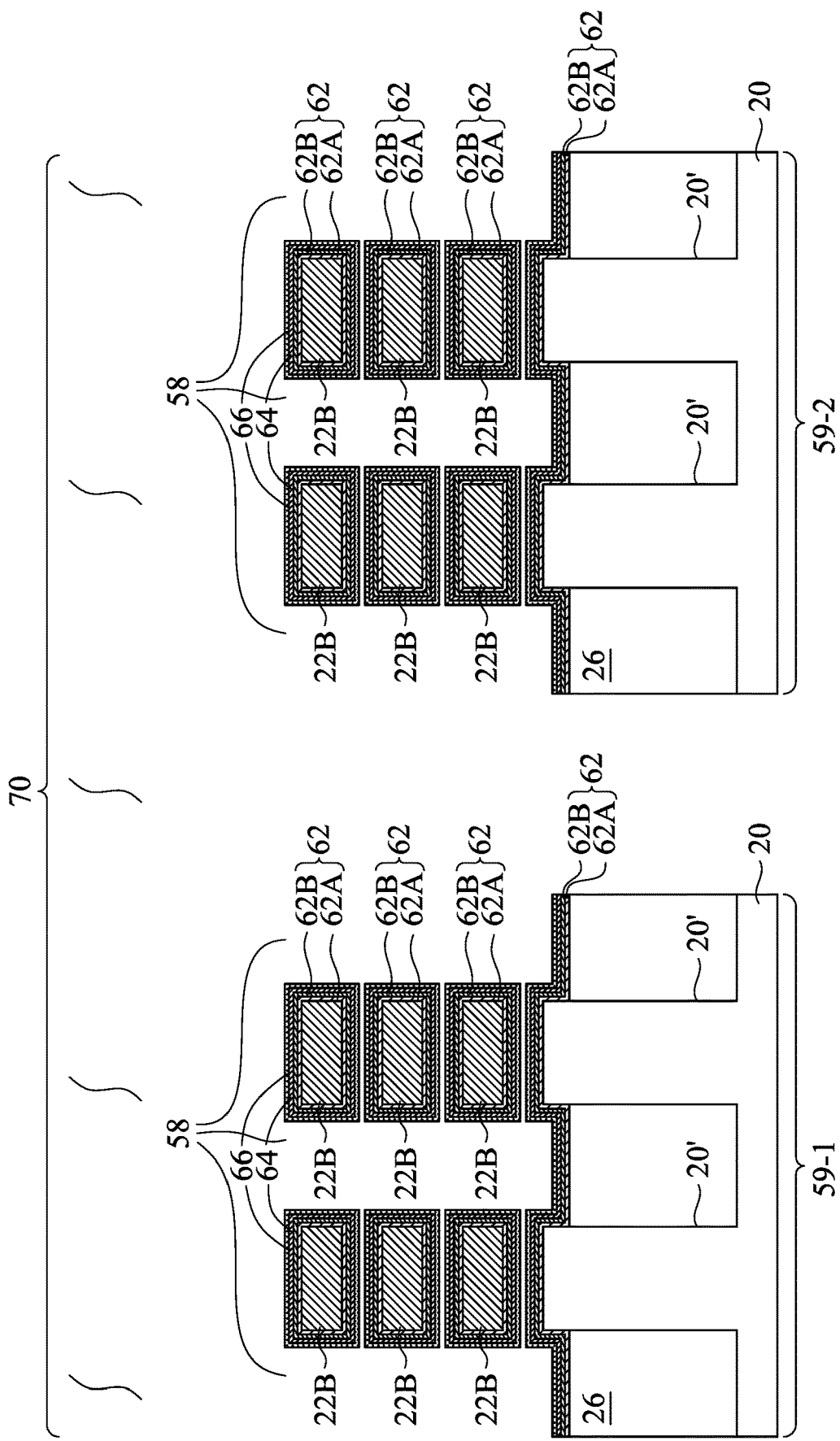

In accordance with alternative embodiments, as shown in FIG. 16B, instead of forming a fluorine-contain layer on protection layer 64, fluorine is doped into protection layer 64 through a soaking process 70. In the soaking process, a fluorine-containing gas is used to soak the exposed protection layer 64. As a result of the soaking process, a surface layer (or an entirety) of protection layer 64 has a high atomic percentage of fluorine, and hence forms the fluorine-containing layer 66. The respective process is again illustrated as process 230 in the process flow 200 shown in FIG. 28. The corresponding fluorine-containing gas may include $WF_6$, $NF_3$, $CF_4$, $CaF_2$, $CrF_6$, $MoF_6$, or the like, or combinations thereof. Some molecules of the fluorine-containing gas may remain intact while diffusing into the surface portion of protection layer 64, while some other molecules of the fluorine-containing precursor may at least partially dissociate, in which case, fluorine diffuses deeper into protection layer 64, while the metal elements such as tungsten may remain at the surface of protection layer 64.

The soaking process may be performed at temperatures in the range between about 250° C. and about 475° C., at a pressure in the range between about 0.5 Torr and about 50 Torr, and for a duration of between about 0.1 seconds and about 1 hour. In accordance with some embodiments, at a time the soaking process is finished, an atomic percentage of fluorine in fluorine-containing layer 66 may be in the range between about 1.5 percent and about 55 percent.

Figure 25:
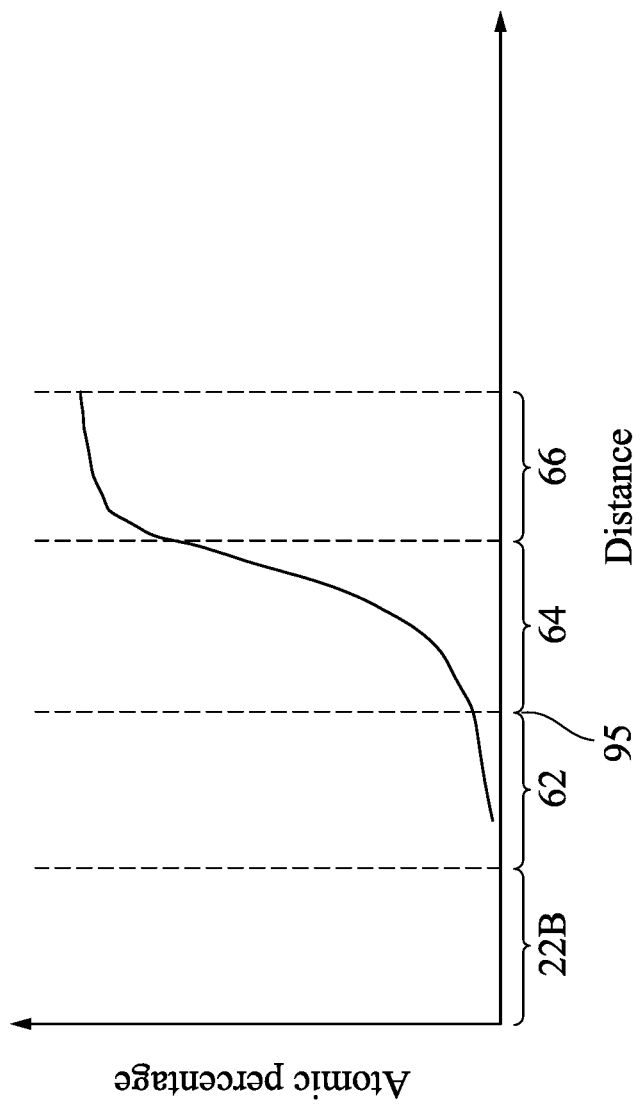
FIGS. 25-27 illustrate the distribution of the atomic percentages of fluorine in accordance with some embodiments.

FIG. 25 schematically illustrates the distribution of fluorine in wafer 10 immediately after the formation of fluorine-containing layer 66. Fluorine has a highest atomic percentage in fluorine-containing layer 66, which is either a deposited layer, or a surface layer of the original protection layer 64. The fluorine atomic percentage drops when going toward nanostructure 22B.

Figure 17:
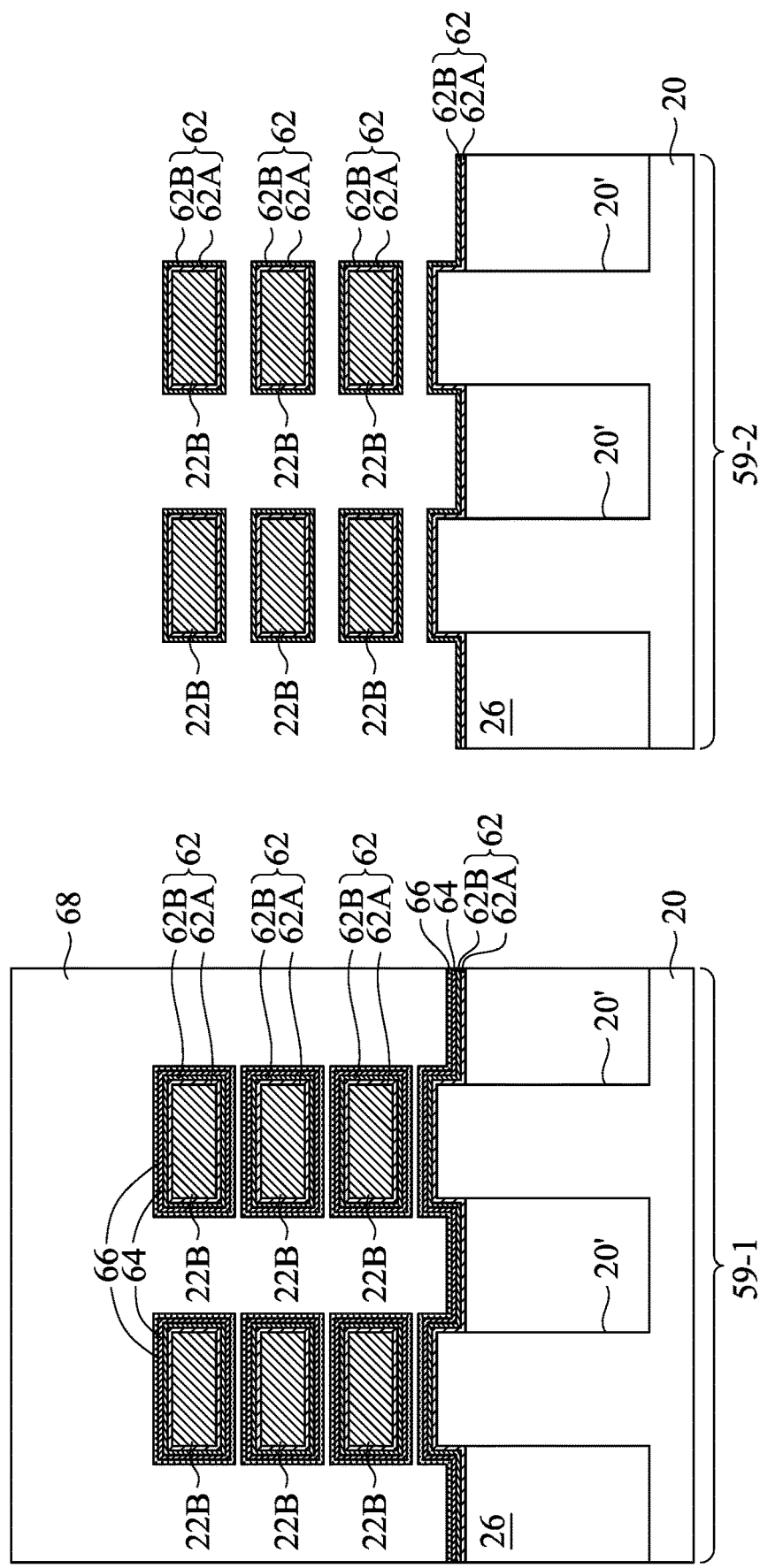
Figure 18:
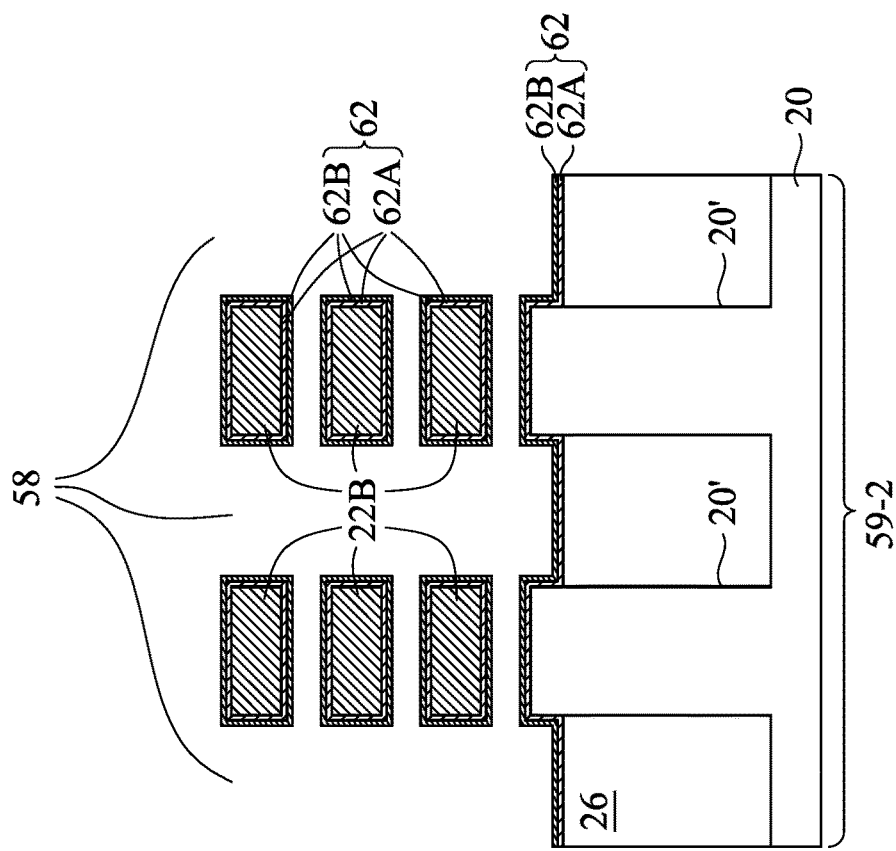
Figure 18:
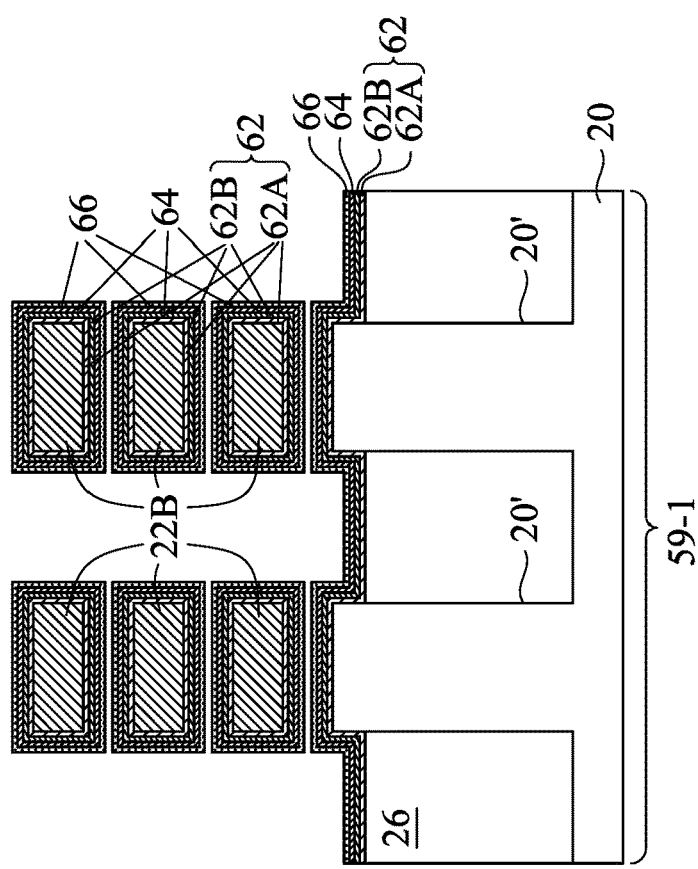

FIG. 17 illustrates the formation of etching mask 68, which is used to remove the portions of fluorine-containing layer 66 and protection layer 64 in device region 59-2. Etching mask 68 may include a photoresist, and may be a single-layer mask, a tri-layer mask, a quadri-layer mask, or the like. Etching mask 68 is patterned, and is removed from device region 59-2, while still has a portion left in device region 59-1. Next, the portions of fluorine-containing layer 66 and protection layer 64 in device region 59-2 are removed through an etching process. The respective process is illustrated as process 232 in the process flow 200 shown in FIG. 28. The etching process may include a wet etching process. For example, the etching solution may include HCl, $H_2O_2$, $NH_4OH$, $H_2O$, or the like, or the combinations thereof. In accordance with some embodiments, the etching solution includes HCl, $H_2O_2$, and $H_2O$. In accordance with alternative embodiments, the etching solution includes $H_2O_2$ and $H_2O$. In accordance with yet alternative embodiments, the etching solution includes $NH_4OH$ and $H_2O_2$. The etching time may range between about 15 seconds and about 600 seconds. After the etching process, etching mask 68 is removed, and the resulting structure is shown in FIG. 18.

In accordance with alternative embodiments, after the etching of fluorine-containing layer 66 in device region 59-2, the portion of protection layer 64 in device region 59-2 is exposed, but is not removed in this stage. Rather, it will be removed after the subsequent annealing process.

The subsequent figure numbers in FIGS. 19A and 19B through FIGS. 24A and 24B may have the corresponding numbers followed by letter A or B. The letter A indicates that the corresponding figure shows a cross-section same as the cross-section A2-A2 in FIG. 4, the letter B indicates that the corresponding figure shows a reference cross-section same as the reference cross-section B-B in FIG. 4.

Figure 19A:
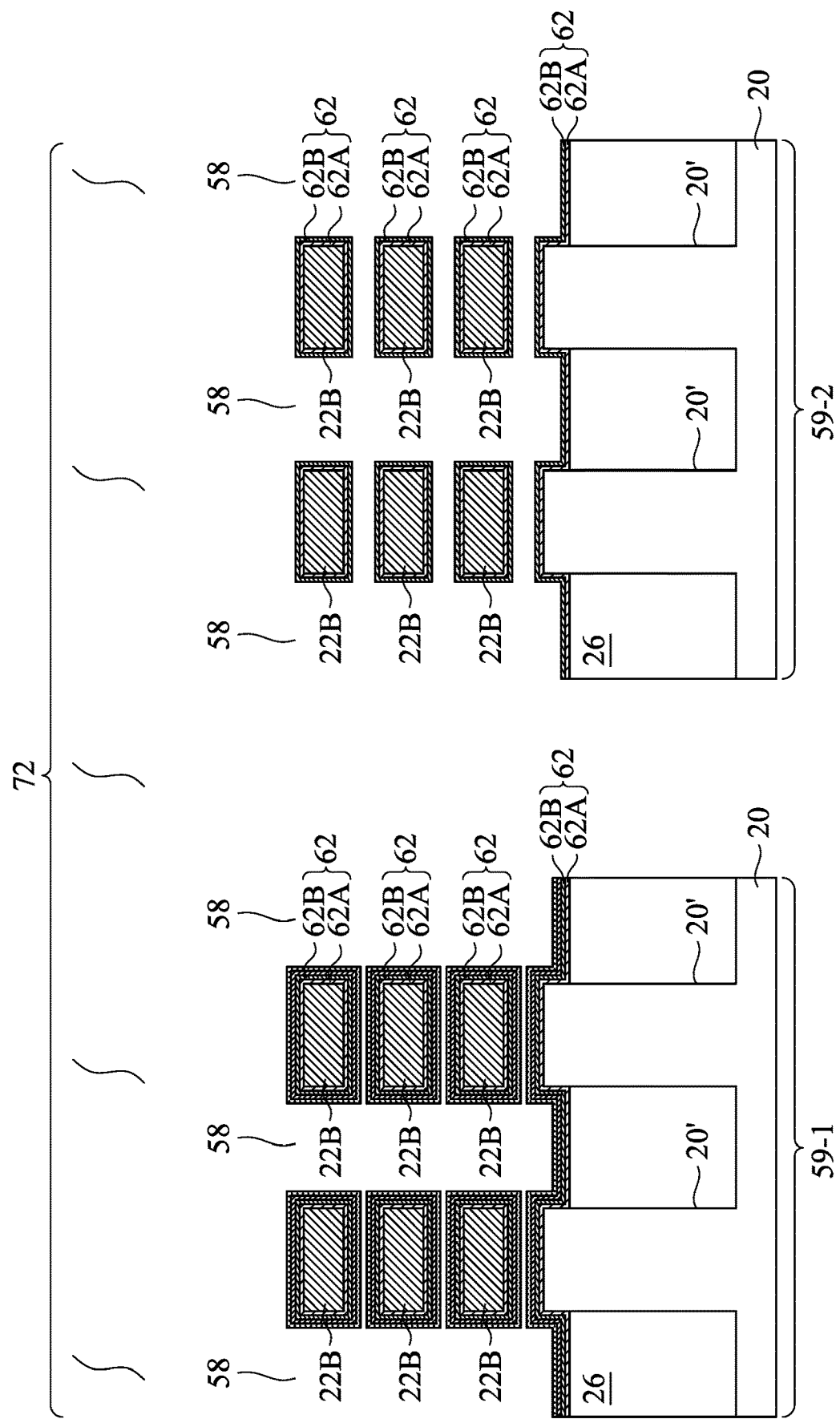
Figure 19B:
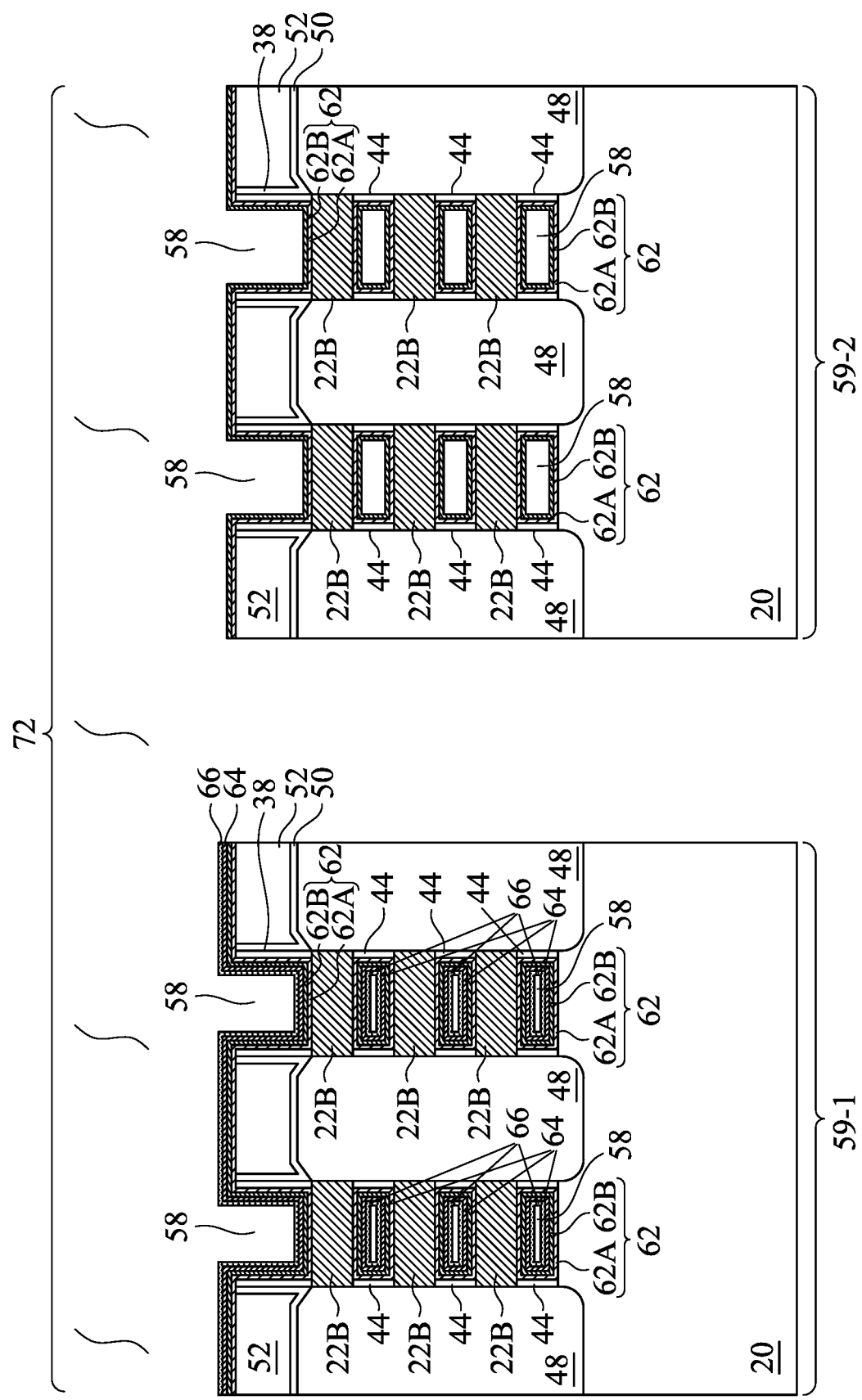

In FIGS. 19A and 19B, an annealing process 72 is performed to diffuse fluorine from the fluorine-containing layer 66 into protection layer 64 and the gate dielectrics 62. The respective process is illustrated as process 234 in the process flow 200 shown in FIG. 28. Some of the fluorine may fill vacancies or micro-voids in the gate dielectrics 62, and some of the fluorine may attach to dangling silicon bonds at the interface between the interfacial layer 62A and nanostructures 22B. The reliability of the resulting device is thus improved. The Time-Dependent Dielectric breakdown (TDDB) of gate dielectrics 62 may be advantageously reduced. The annealing process 72 may be performed at a temperature in the range between about 150° C. and about 750° C. The Annealing duration may be in the range between about 0.5 seconds and about 60 seconds.

As a result of the annealing process, the gate dielectrics 62 in device region 59-1 have an increased fluorine atomic percentage FAP1, which fluorine atomic percentage is also higher than the fluorine atomic percentage FAP2 in the gate dielectrics 62 in device regions 59-2. In accordance with some embodiments, the fluorine atomic percentage FAP1 is in the range between about 0.5 percent and about 20 percent. Furthermore, the difference (FAP1-FAP2) may be greater than about 0.5 atomic percent, and may be in the range between about 0.5 percent and about 20 percent.

Figure 20A:
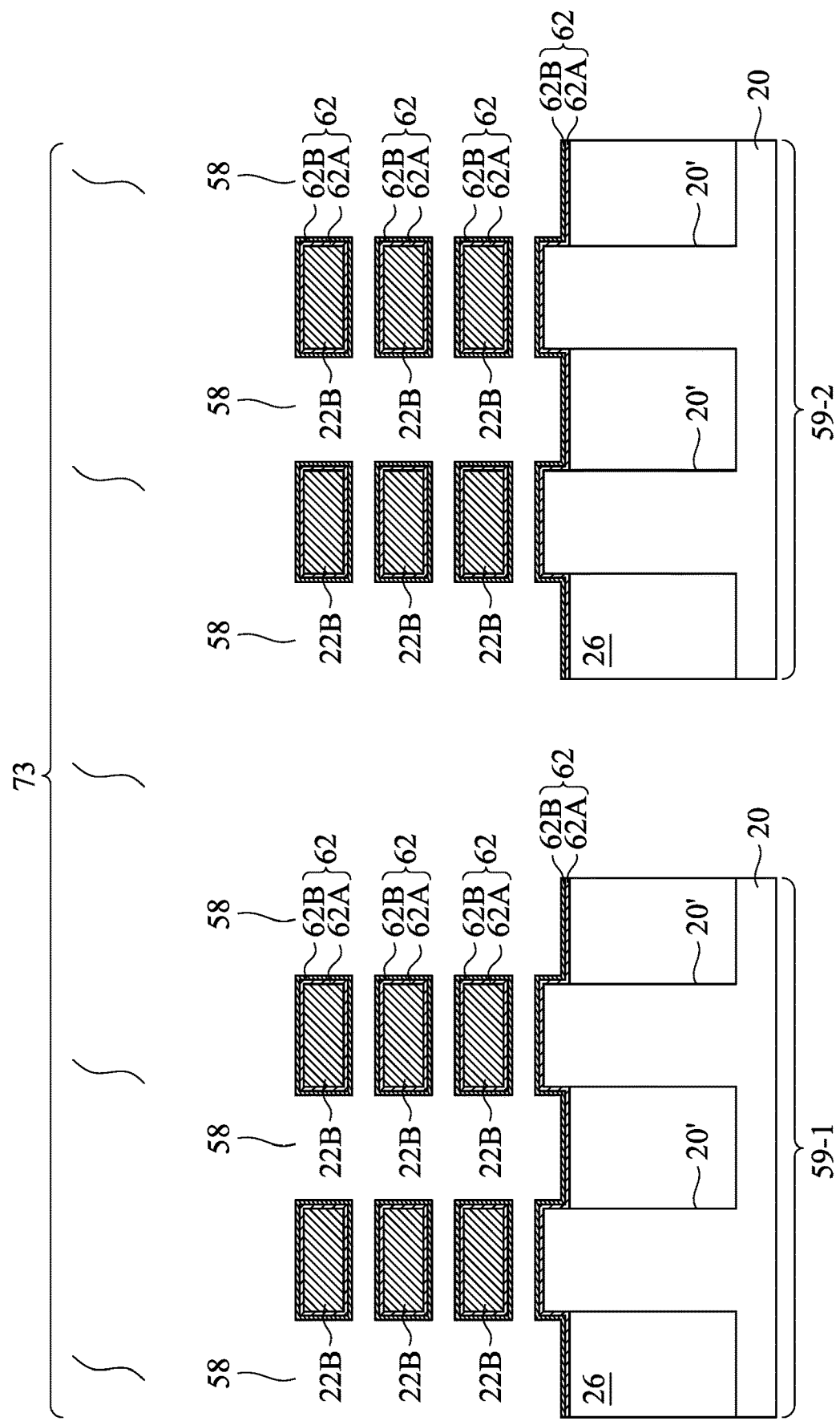
Figure 20B:
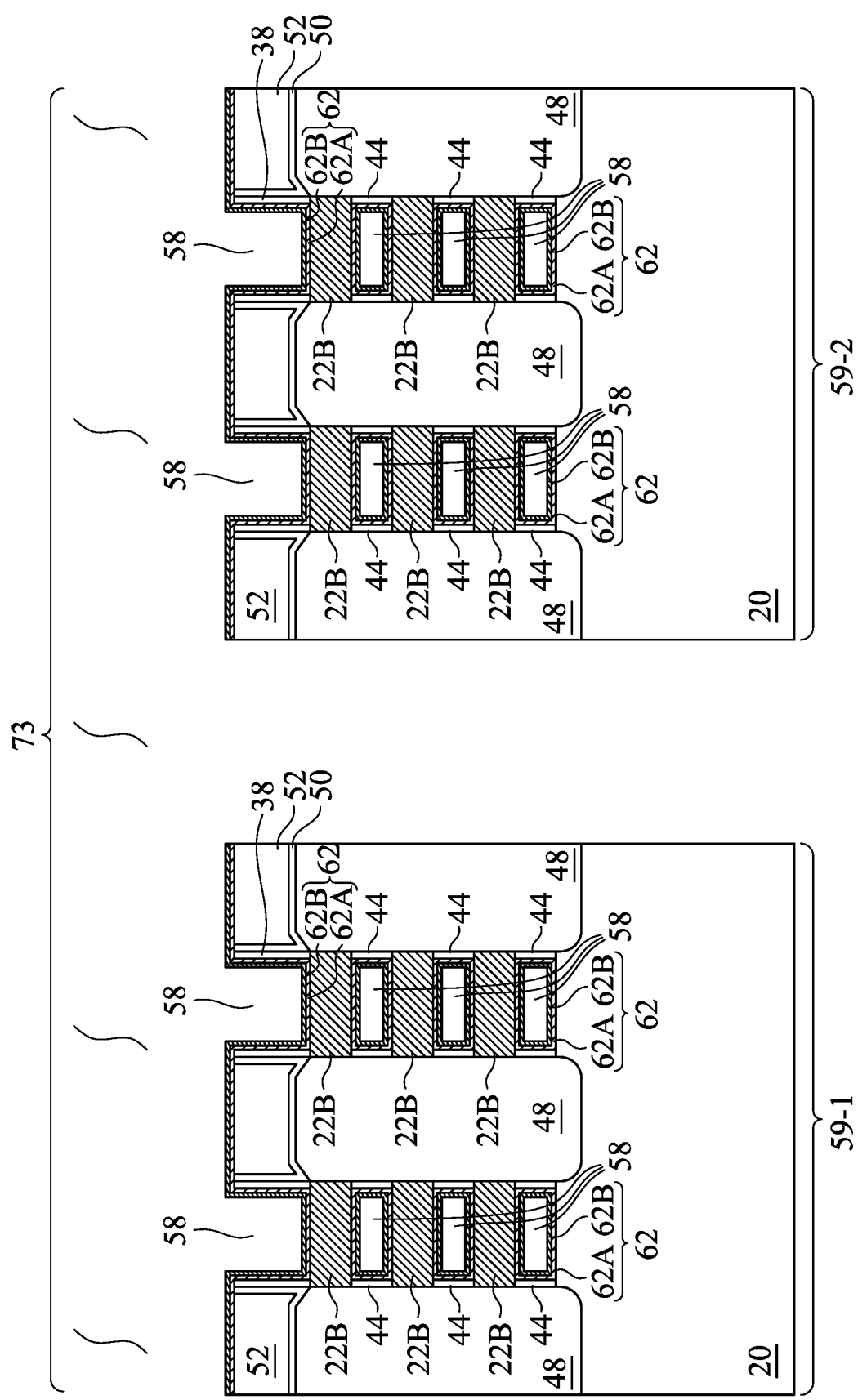

After the annealing process, the remaining portions of protection layer 64 and fluorine-containing layer 66 are removed from device region 59-1 through etching process 73, and the resulting structures are shown in FIGS. 20A and 20B. The respective process is illustrated as process 236 in the process flow 200 shown in FIG. 28. The etching process may also be performed through wet etching processes or dry etching processes. The etching chemicals may be selected from the candidate chemicals that may be used in the process shown in FIG. 17. For example, the etching process may include be a wet etching process, and HCl, $H_2O_2$, $NH_4OH$, $H_2O$, or the like, or the combinations thereof may be used.

In accordance with alternative embodiments, in which the portion of protection layer 64 in device region 59-2 have not been removed in preceding processes, the portion of protection layer 64 in device region 59-2 may be removed simultaneously when the portions of fluorine-containing layer 66 and protection layer 64 in device region 59-1 are removed.

In above discussed embodiments, the fluorine-containing layer 66 is formed on protection layer 64, and is separated from high-k dielectric layer 62B by protection layer 64. In accordance with alternative embodiments, the formation of protection layer 64 is skipped, and fluorine-containing layer 66 is deposited directly on high-k dielectric layer 62B. When fluorine-containing layer 66 is formed through deposition, as discussed above, the precursor such as $WF_6$ may etch a surface portion of high-k dielectric layer 62B before the newly deposited fluorine-containing layer 66 acts as a protection layer to prevent the further etching of high-k dielectric layer 62B.

Before the newly deposited fluorine-containing layer 66 is thick enough to protect high-k dielectric layer 62B, the thickness of high-k dielectric layer 62B may have been reduced by a value up to 2 Å. On the other hand, if soaking process is used to form the fluorine-containing layer 66, a surface layer (or an entirety) of high-k dielectric layer 62B has an increased fluorine atomic percentage, and hence is converted to fluorine-containing layer 66. In accordance with these embodiments, following the annealing process 72, fluorine-containing layer 66 may either be removed, or remain unremoved since it is a part of the original high-k dielectric layer 62B.

Figure 24A:
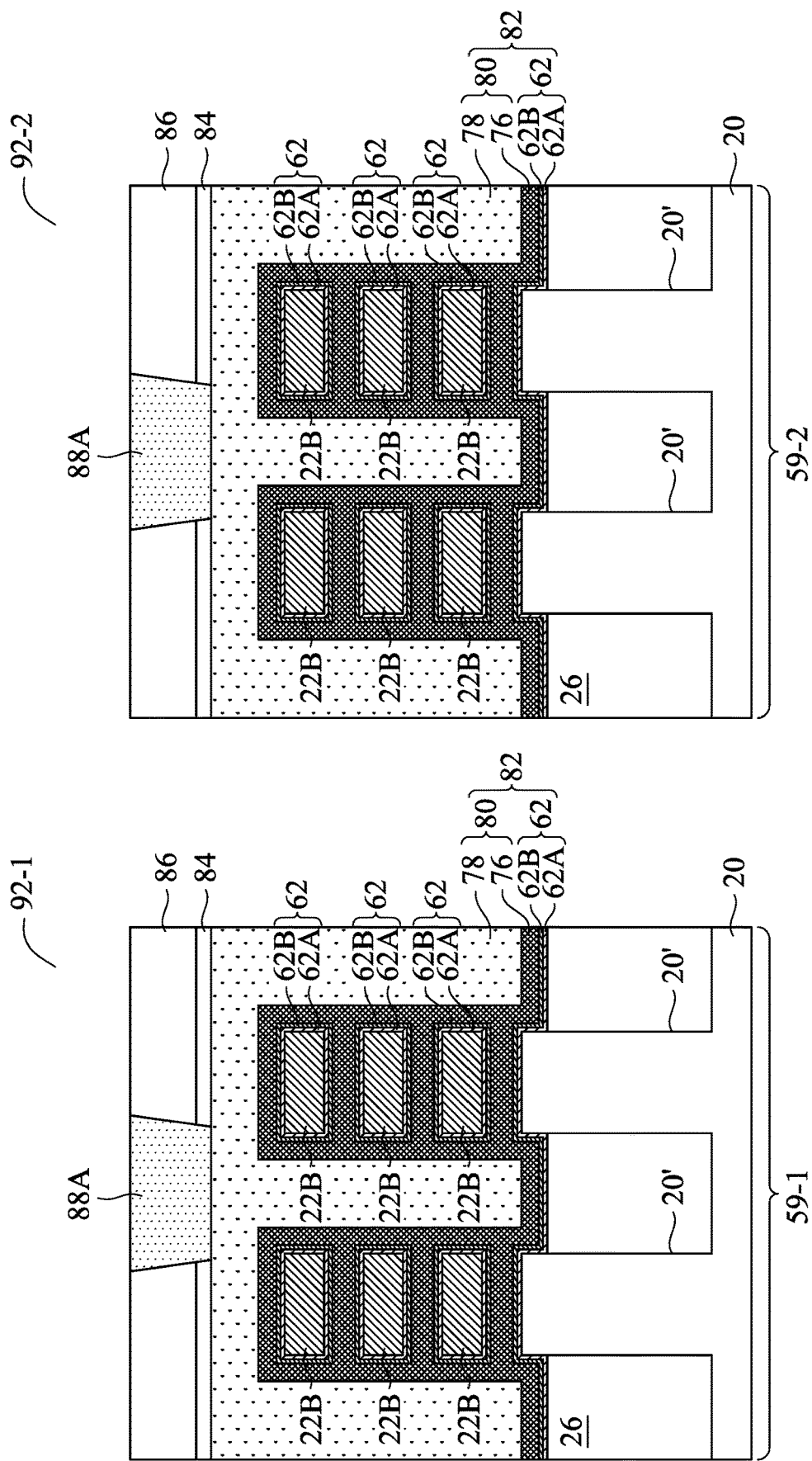
Figure 24B:
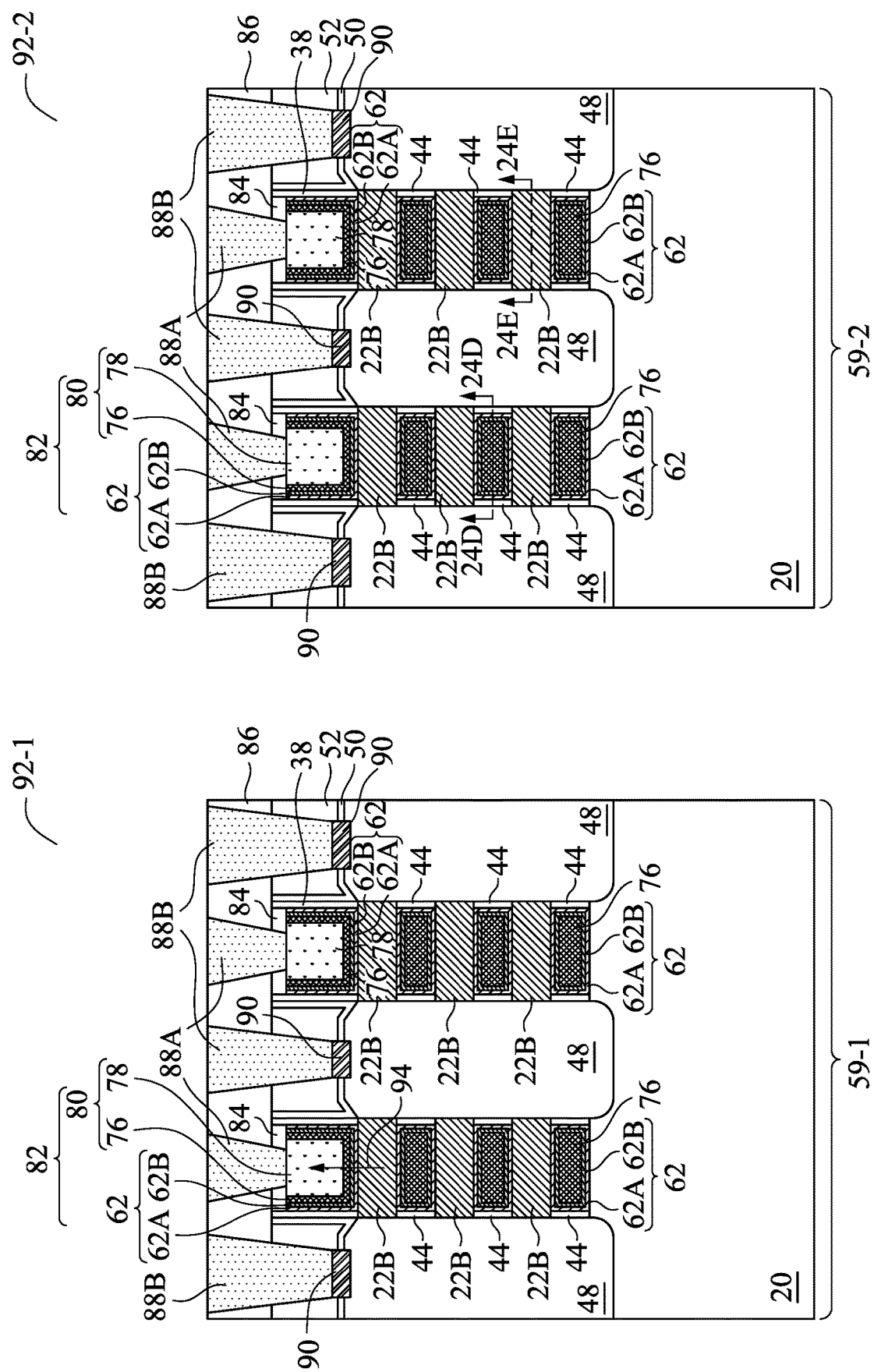

In accordance with yet alternative embodiments, in the etching process as shown in FIGS. 20A and 20B, instead of etching both of fluorine-containing layer 66 and protection layer 64, fluorine-containing layer 66 is etched, while protection layer 64 is left as a part of the final structure. For example, when device region 59-1 is a p-type transistor region, protection layer 64 may be used as a lower part or an entirety of the work-function layer of the resulting GAA transistor 92-1 (FIGS. 24A and 24B). Alternatively, when device region 59-1 is an n-type transistor region, protection layer 64 may be used as a capping layer that is underlying an n-type work-function layer of the resulting GAA transistor 92-1 (FIGS. 24A and 24B). Accordingly, the thickness of protection layer 64 may be adjusted in the preceding processes to a desirable thickness fitting to its function.

Figure 21A:
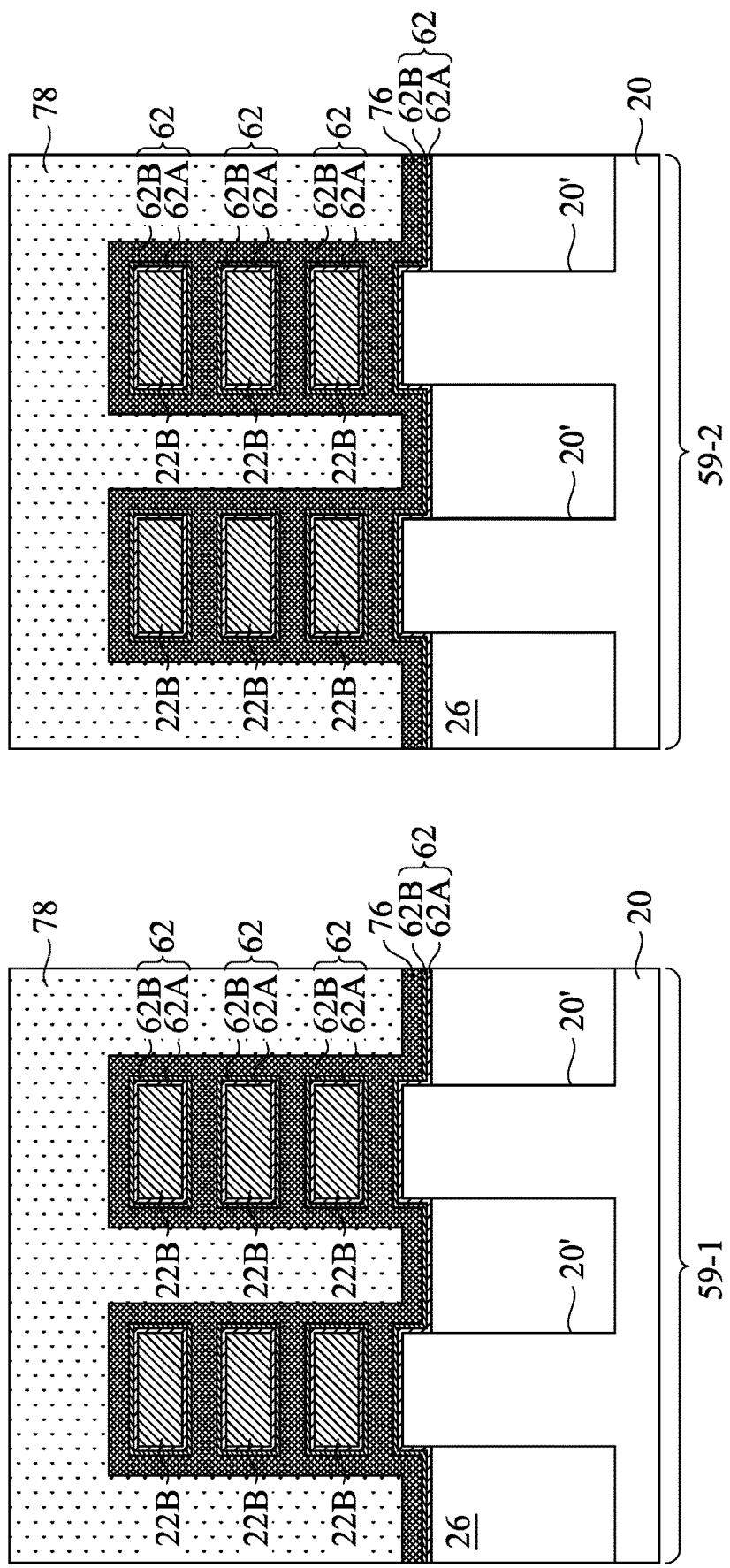
Figure 21B:
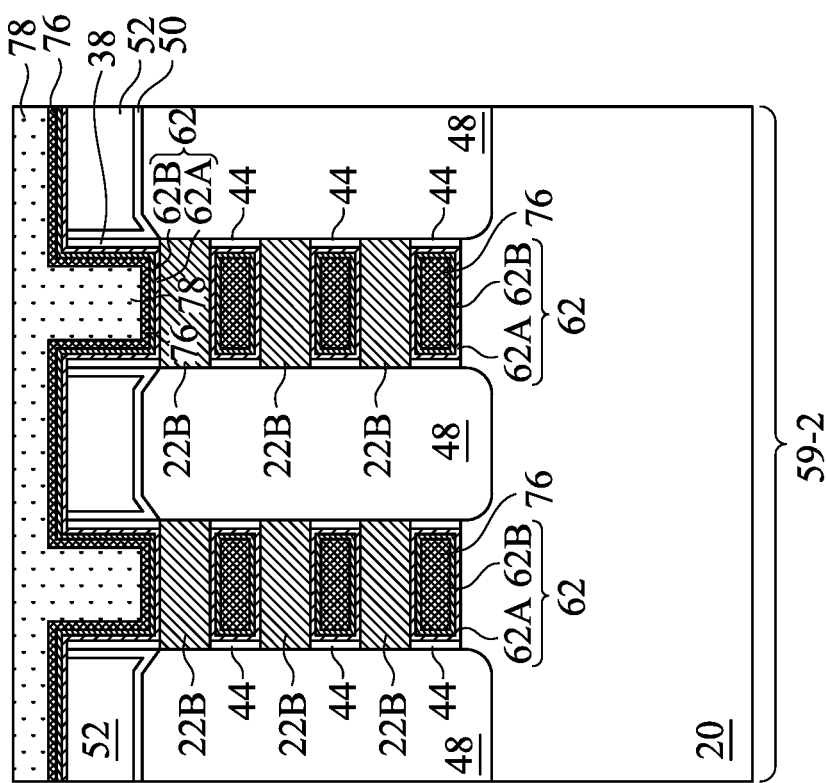
Figure 21B:
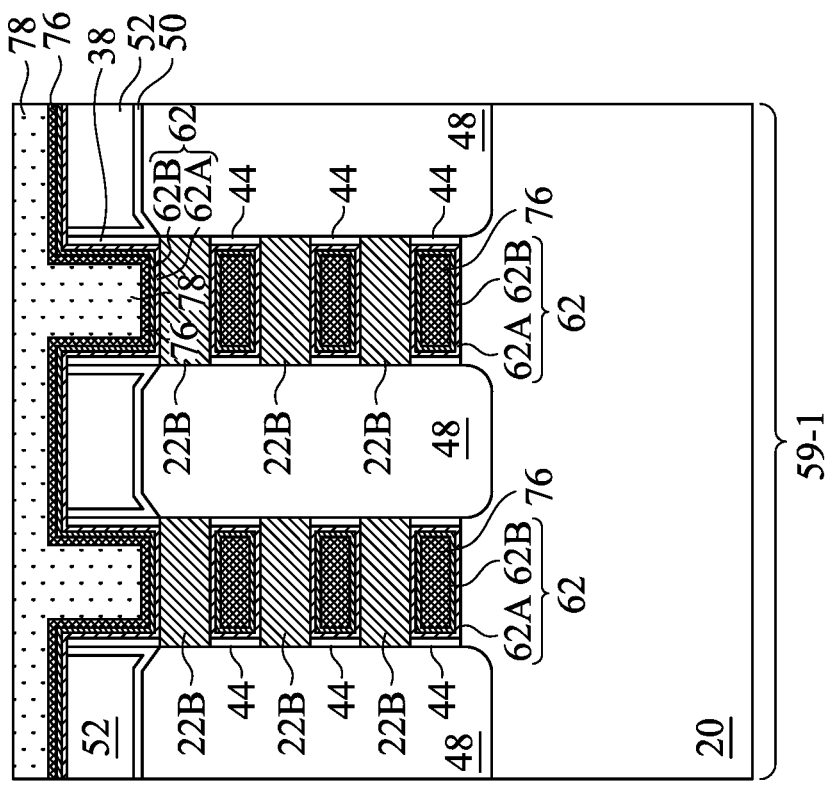

Referring to FIGS. 21A and 21B, stacked conductive layers 76 and filling metal 78 are formed. The respective process is illustrated as process 238 in the process flow 200 shown in FIG. 28. In accordance with some embodiments, conductive layers 76 and filling metal 78 in device regions 59-1 and 59-2 are formed in common processes and using common materials. In accordance with alternative embodiments, conductive layers 76 and filling metal 78 are formed through separate processes, and may be formed of same materials or different material. For example, when the transistors formed in device regions 59-1 and 59-2 are of opposite conductivity types, the work-function layers in device regions 59-1 and 59-2 are formed of different materials, and are formed in separate processes. In accordance with alternative embodiments, the transistors formed in device region 59-1 and 59-2 are of the same conductivity type (both of p-type or both of n-type), but have different performance requirements such as different threshold voltages. Accordingly, the stacked conductive layers 76 in device regions 59-1 and 59-2 may also be formed of different processes and/or different materials.

Conductive layers 76 may include a work-function layer, and may or may not include other layers such as capping layers, blocking layers, or the like. For example, when one or both of device regions 59-1 and 59-2 is a p-type transistor region, the corresponding work-function layer may include TiN, TaN, TiSiN, WCN, MOON, or the combinations thereof. When one or both of device regions 59-1 and 59-2 is an n-type transistor region, the corresponding work-function layer may include TiAlC, TiAlN, TaAlC, TaAlN, or the like, or combinations thereof. The stacked conductive layers 76 may or may not include a capping layer such as a TiN layer or a TiSiN layer formed between the work-function layer and the gate dielectric 62. The stacked conductive layers 76 may or may not include a blocking layer such as a TiN layer over the work-function layer. Filling metal 78 may be formed to fill the remaining recesses 58 if they are not fully filled yet. Filling metal 78 may include a metal-containing material such as cobalt, ruthenium, aluminum, tungsten, combinations thereof, and/or multilayers thereof.

Figure 22A:
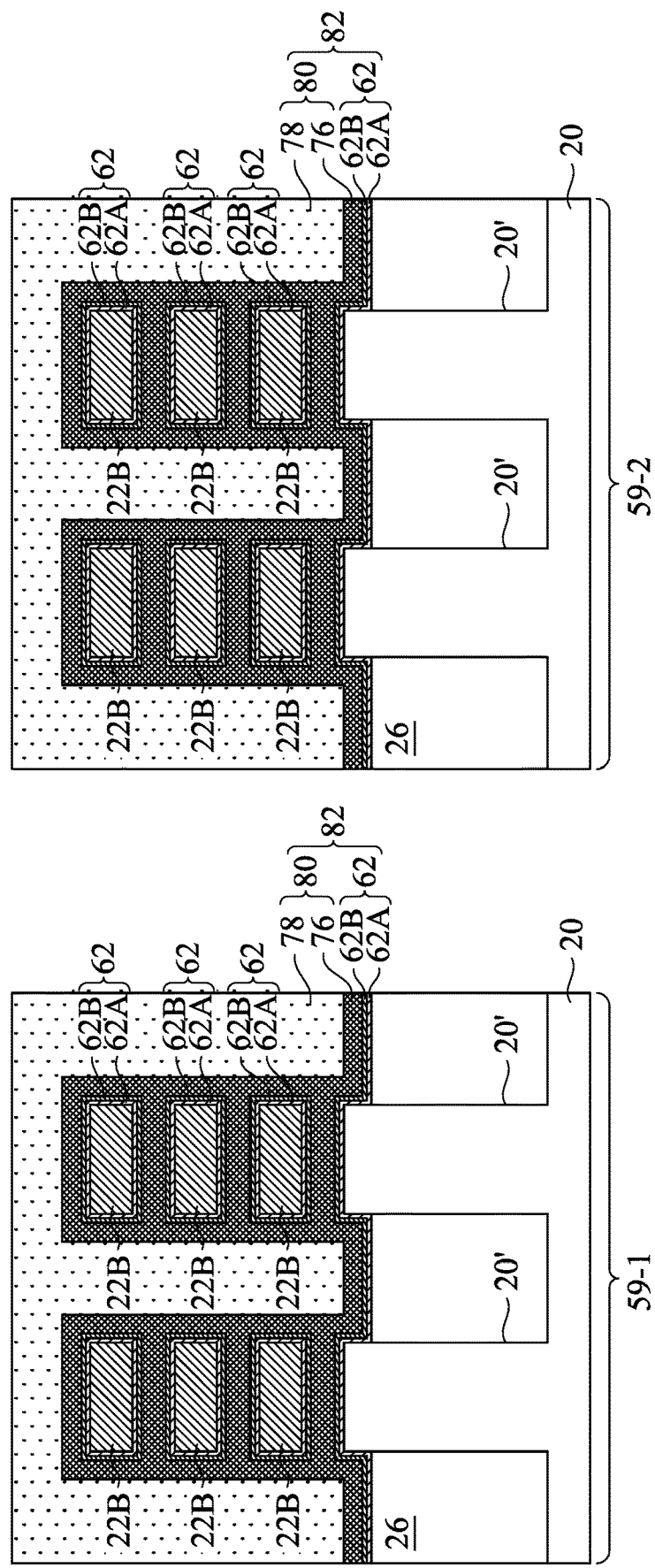
Figure 22B:
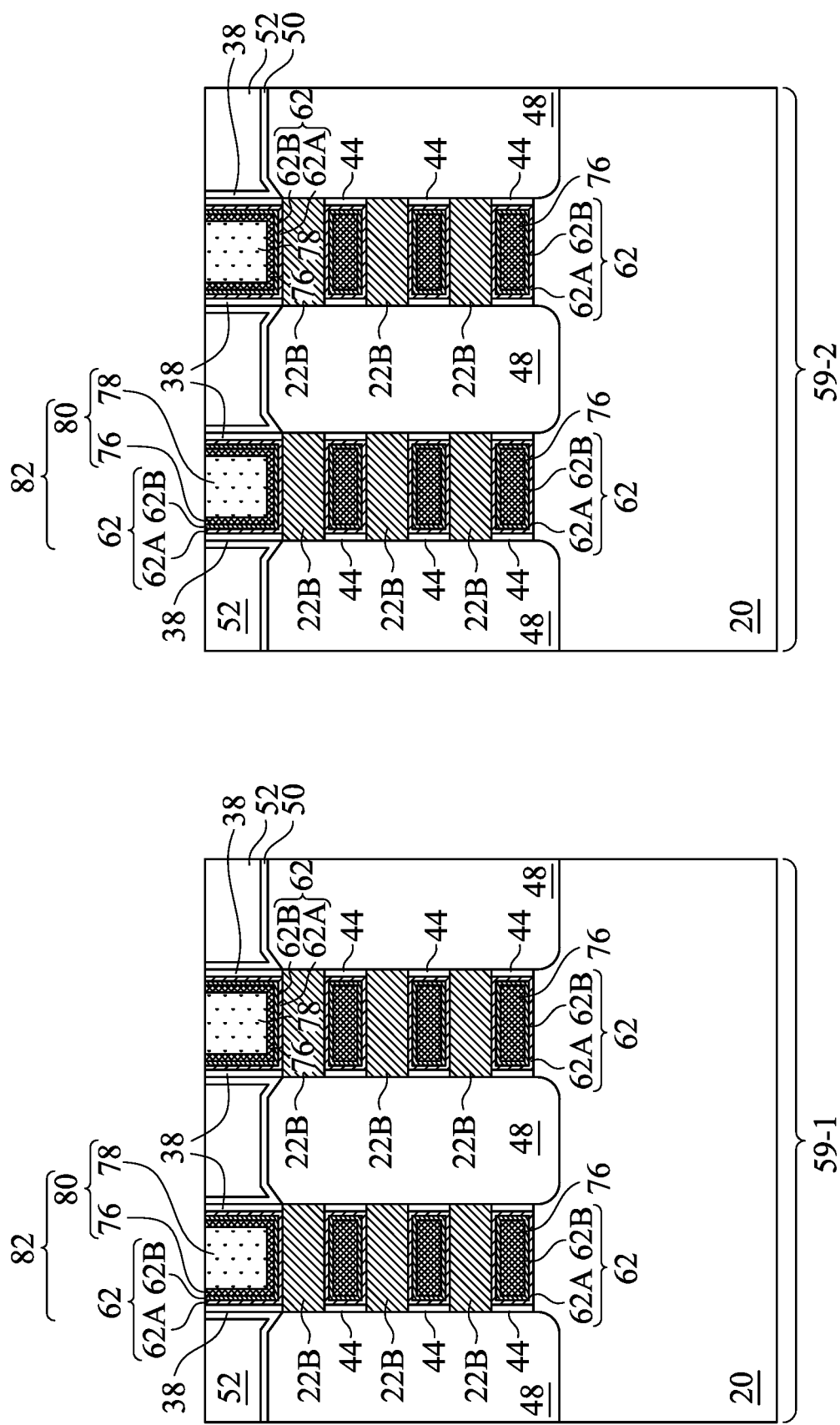

Referring to FIGS. 22A and 22B, after the filling of recesses 58, a planarization process such as a CMP process or a mechanical grinding process is performed to remove the excess portions of the gate dielectrics and the material of gate electrodes 80, which excess portions are over the top surface of ILD 52. The remaining portions of the conductive layers 76 and filling metal 78 form gate electrodes 80. Gate electrodes 80 and gate dielectrics 62 are collectively referred to as gate stacks 82.

Figure 23A:
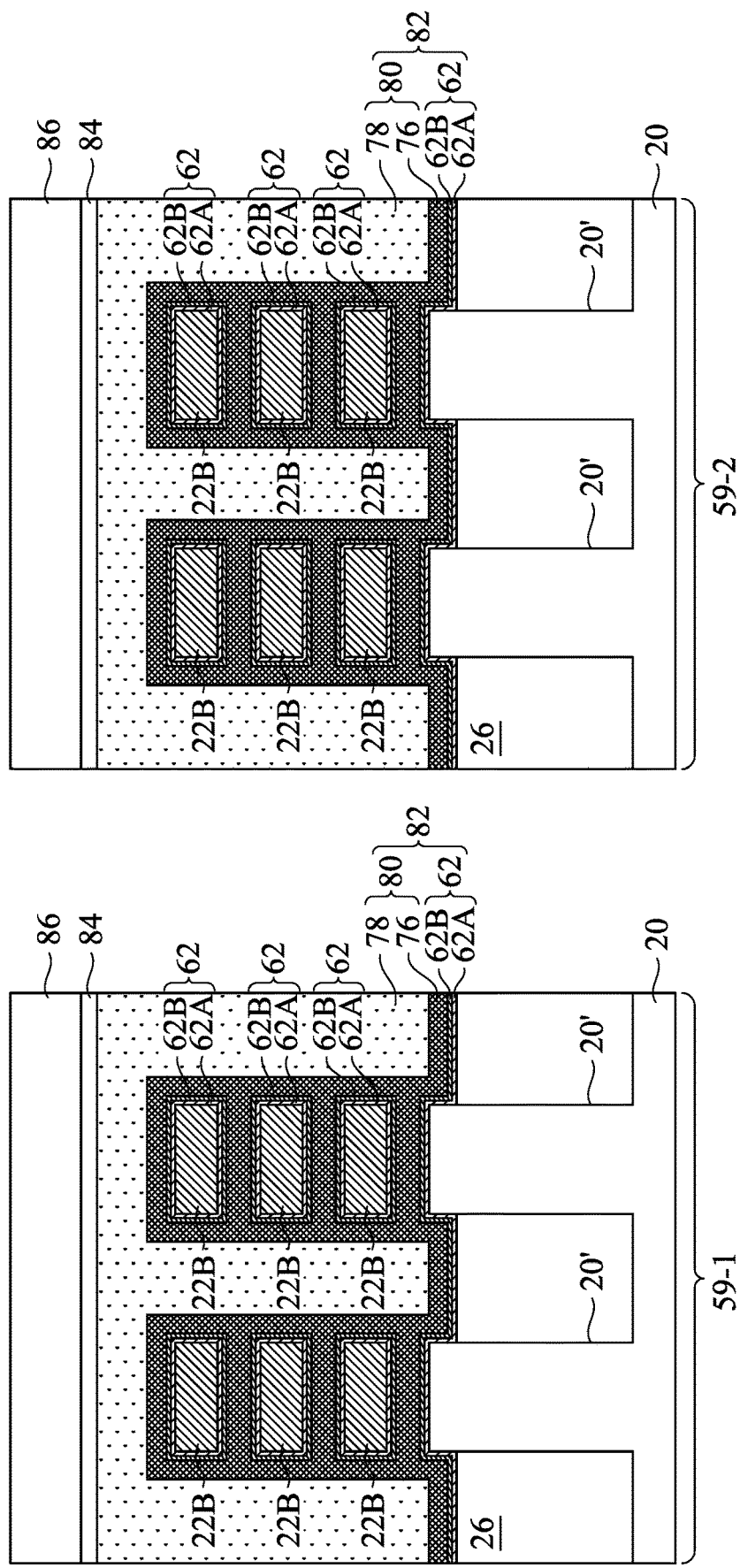
Figure 23B:
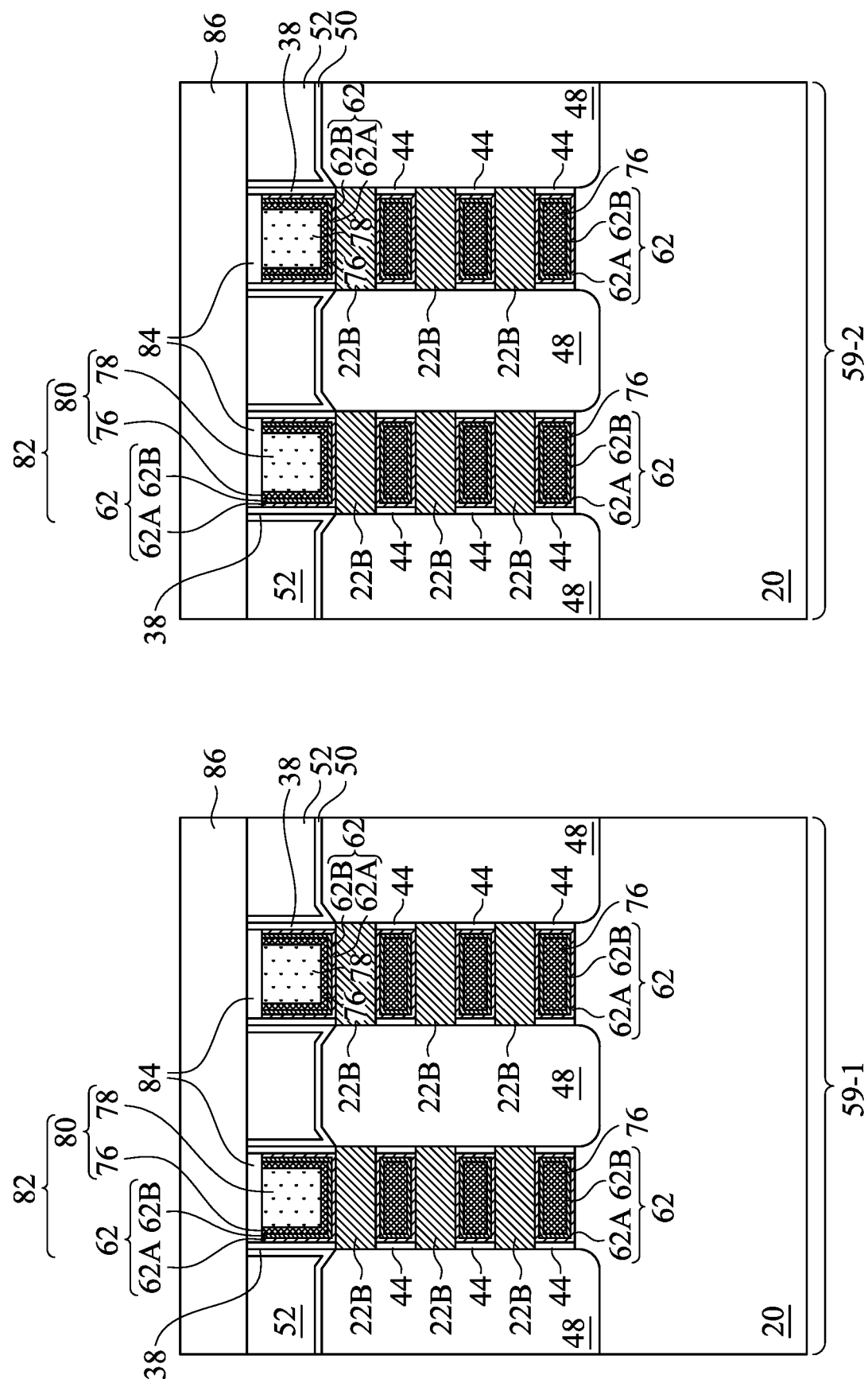

Next, as shown in FIGS. 23A and 23B, gate stacks 82 are recessed, so that recesses are formed directly over gate stacks 82 and between opposing portions of gate spacers 38. A gate mask 84 comprising one or more layers of dielectric material, such as silicon nitride, silicon oxynitride, or the like, is filled in each of the recesses, followed by a planarization process to remove excess portions of the dielectric material extending over ILD 52. The respective process is illustrated as process 240 in the process flow 200 shown in FIG. 28.

As further illustrated by FIGS. 23A and 23B, ILD 86 is deposited over ILD 52 and over gate masks 84. The respective process is illustrated as process 242 in the process flow 200 shown in FIG. 28. An etch stop layer (not shown), may be, or may not be, deposited before the formation of ILD 86.

In accordance with some embodiments, ILD 86 is formed through FCVD, CVD, PECVD, or the like. ILD 86 is formed of a dielectric material, which may be selected from silicon oxide, PSG, BSG, BPSG, USG, or the like.

In FIGS. 24A and 24B, ILD 86, ILD 52, CESL 50, and gate masks 84 are etched to form recesses (occupied by contact plugs 88A and 88B) exposing surfaces of the epitaxial source/drain regions 48 and/or gate stacks 82. The recesses may be formed through etching using an anisotropic etching process, such as RIE, NBE, or the like. In accordance with some embodiments, the recesses may be formed by etching-through ILD 86 and ILD 52 using a first etching process, etching-through gate masks 84 using a second etching process, and etching-through CESL 50 possibly using a third etching process.

After the recesses are formed, silicide regions 90 (FIG. 24B) are formed over the epitaxial source/drain regions 48. The respective process is illustrated as process 244 in the process flow 200 shown in FIG. 28. In accordance with some embodiments, silicide regions 90 are formed by first depositing a metal layer (not shown) capable of reacting with the semiconductor materials of the underlying epitaxial source/drain regions 48 (for example, silicon, silicon germanium, germanium) to form silicide and/or germanide regions, then performing a thermal annealing process to form silicide regions 90. The metal may include nickel, cobalt, titanium, tantalum, platinum, tungsten, or the like. The un-reacted portions of the deposited metal are then removed, for example, by an etching process.

Contact plugs 88B are then formed over silicide regions 90. Also, contacts 88A (may also be referred to as gate contact plugs) are also formed in the recesses, and are over and contacting gate electrodes 80. The respective processes are illustrated as process 246 in the process flow 200 shown in FIG. 28. Although FIG. 24B illustrates that contact plugs 88A and 88B are in a same cross-section, in various embodiments, contact plugs 88A and 88B may be formed in different cross-sections, thereby reducing the risk of shorting with each other.

Contact plugs 88A and 88B may each comprise one or more layers, such as a barrier layer, a diffusion barrier layer, and a filling material, and are electrically coupled to the underlying conductive feature (for example, gate stacks 82 or silicide region 90 in the illustrated embodiment). The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP process, may be performed to remove excess material from a surface of ILD 86. GAA transistors 92-1 and 92-2 are thus formed in device regions 59-1 and 59-2, respectively.

Figure 24D:
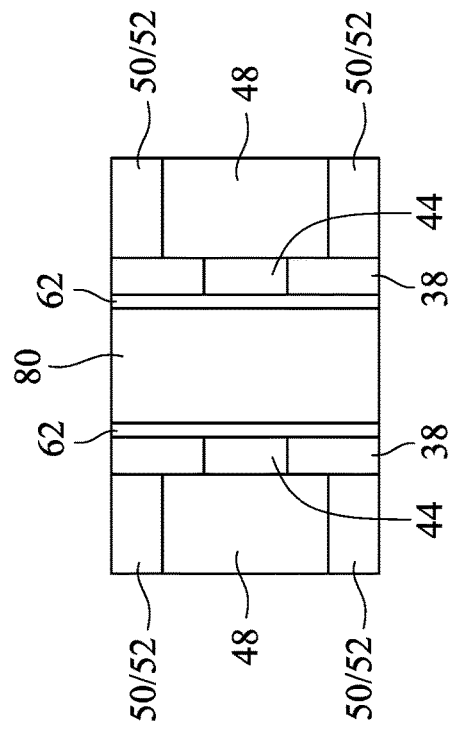
Figure 24E:
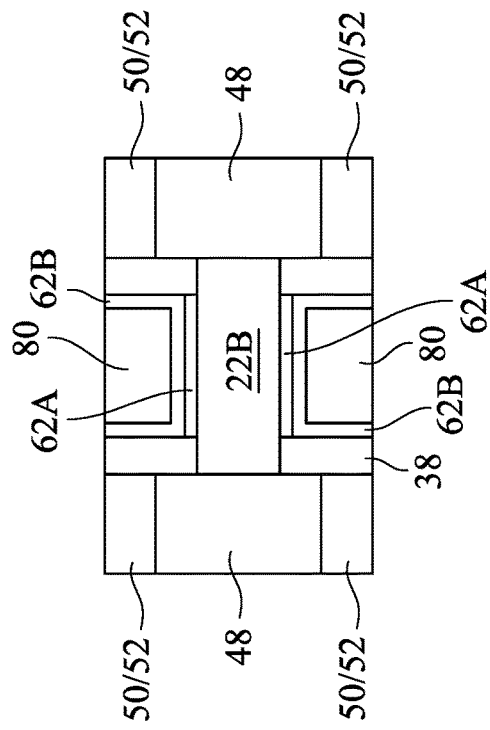
Figure 24C:
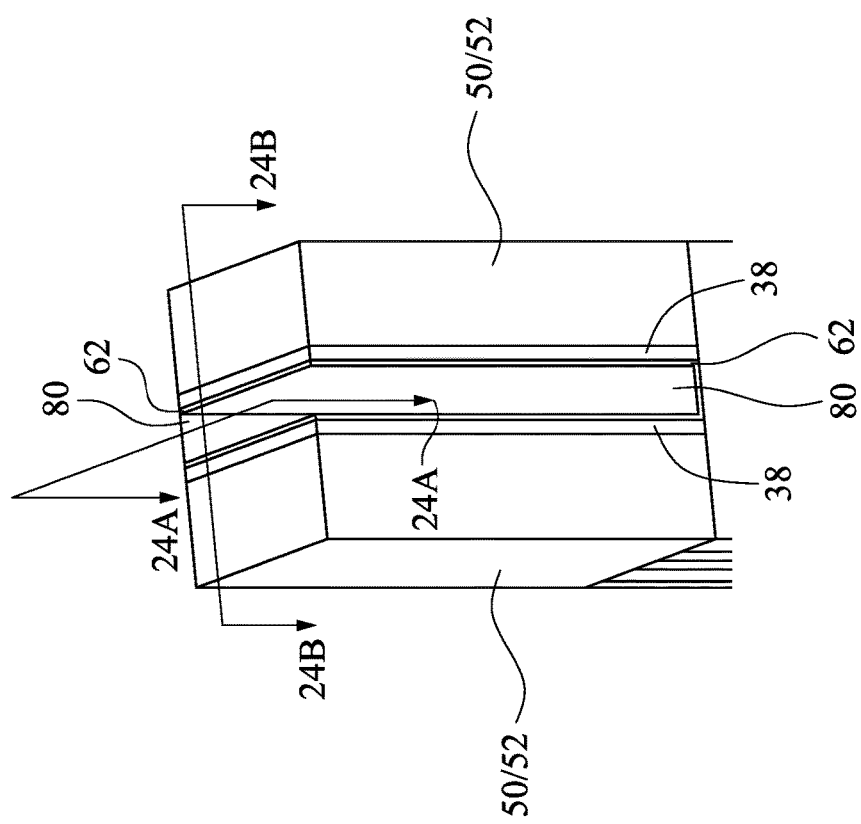

FIG. 24C illustrates a perspective view of the structure shown in FIGS. 24A and 24B, wherein the cross-sectional views shown in FIGS. 24A and 24B are obtained from the cross-sections 24A-24A and 24B-24B, respectively, in FIG. 24C. FIGS. 24D and 24E illustrate the horizontal cross-sectional views of the structure shown in FIGS. 24A, 24B, and 24C, wherein the horizontal cross-sectional views are obtained from the horizontal planes 24D-24D and 24E-24E, respectively, in FIG. 24B.

Figure 26:
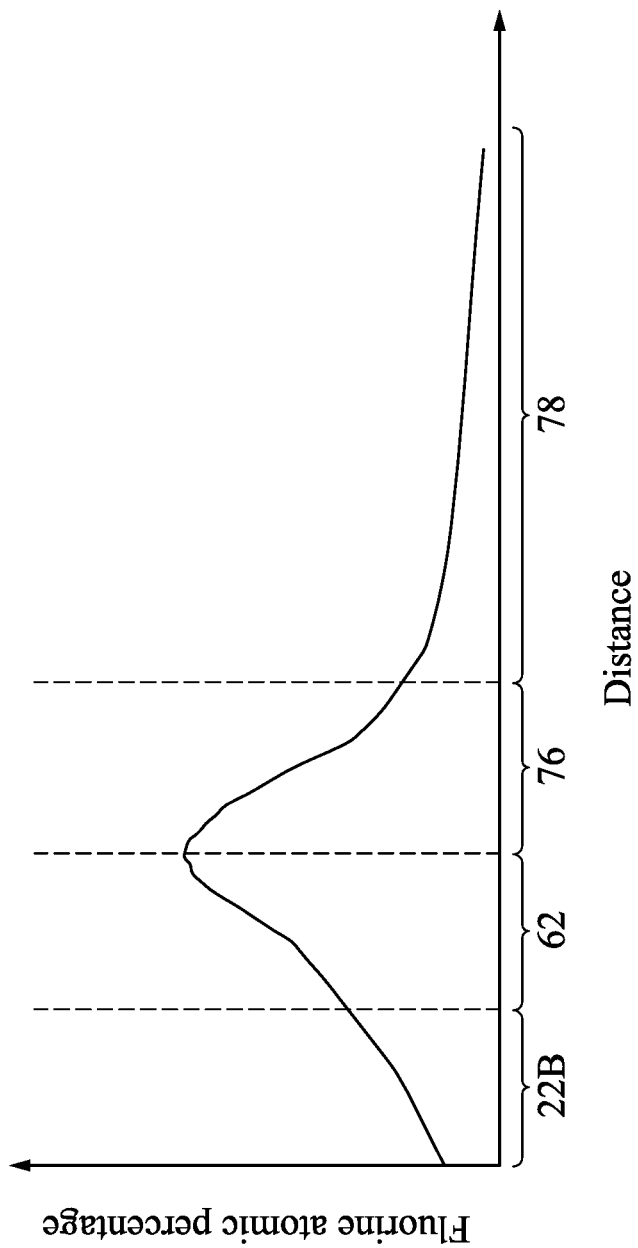

FIG. 26 illustrates the fluorine atomic percentage in gate stacks 82 in accordance with some embodiments, wherein the X-axis represents the distance in the direction of arrow 94 (in device region 59-1) in FIG. 24B. Since the protection layer 64 and fluorine-containing layer 66 in FIG. 25 are removed, at a time before the conductive layers 76 and filling metal 78 as shown in FIG. 26 are formed, the peak fluorine atomic percentage will be at the outer surfaces of gate dielectrics 62, as shown as at position 95 in FIG. 25. In the subsequent annealing process and due to other thermal budgets, fluorine will out diffuse. The peak fluorine atomic percentage, however, may remain to be at or close to the interface between gate dielectric 62 and conductive layers 76.

Figure 27:
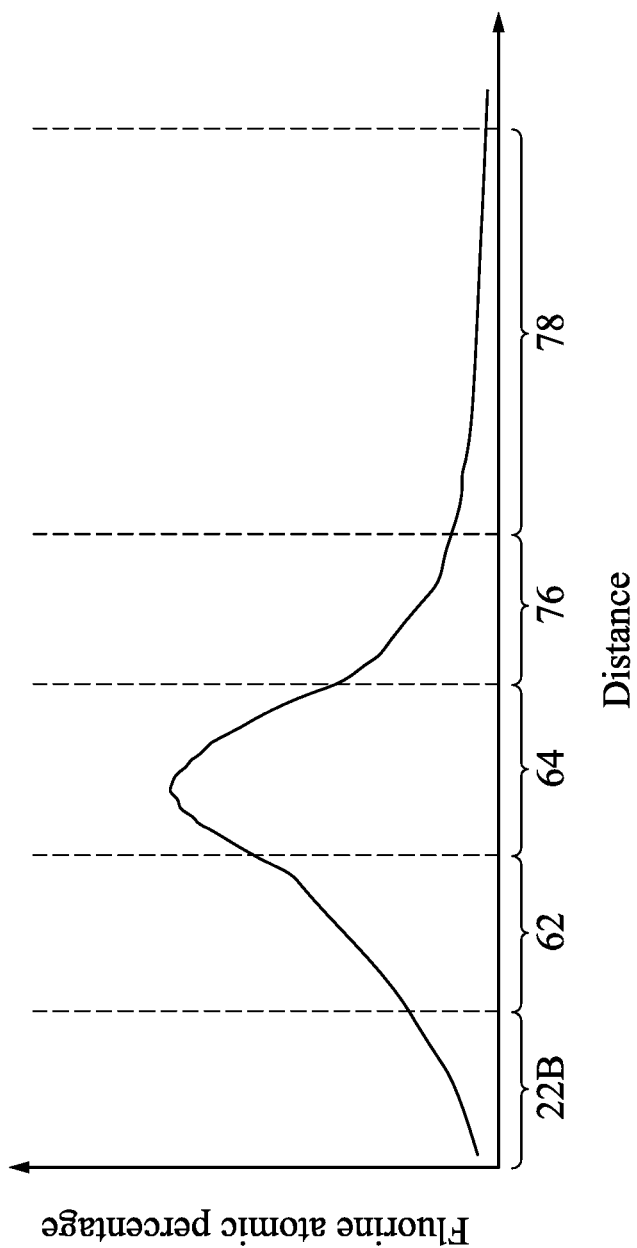

FIG. 27 illustrates the fluorine atomic percentage in gate stacks 82 in accordance with alternative embodiments. In these embodiments, protection layer 64 is not removed. Accordingly, the peak fluorine atomic percentage may be inside protection layer 64, which may act as either a part of a work-function layer, or as a capping layer under the work-function layer.

Figure 29:
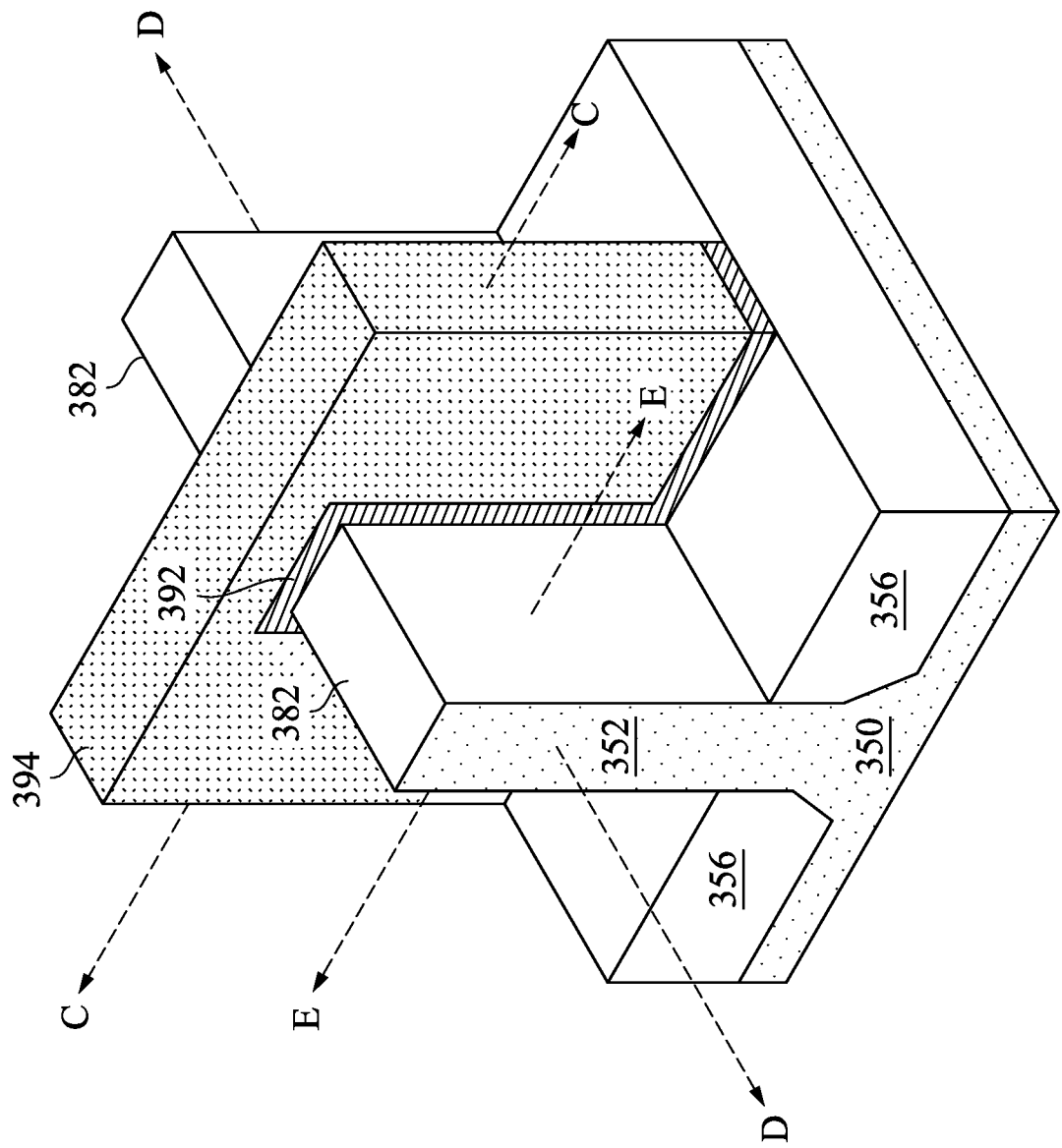
FIG. 29 illustrates an example of a FinFET in a three-dimensional view, in accordance with some embodiments.

The following Figures illustrate some alternative embodiments. FIG. 29 illustrates an example of a FinFET in a three-dimensional view, in accordance with some embodiments. The FinFET comprises a fin 352 on a substrate 350 (e.g., a semiconductor substrate). Isolation regions 356 are disposed in the substrate 350, and the fin 352 protrudes above and from between neighboring isolation regions 356. Although the isolation regions 356 are described/illustrated as being separate from the substrate 350, as used herein the term "substrate" may be used to refer to just the semiconductor substrate or a semiconductor substrate inclusive of isolation regions. Additionally, although the fin 352 is illustrated as a single, continuous material as the substrate 350, the fin 352 and/or the substrate 350 may comprise a single material or a plurality of materials. In this context, the fin 352 refers to the portion extending between the neighboring isolation regions 356.

A gate dielectric layer 392 is along sidewalls and over a top surface of the fin 352, and a gate electrode 394 is over the gate dielectric layer 392. Source/drain regions 382 are disposed in opposite sides of the fin 352 with respect to the gate dielectric layer 392 and gate electrode 394. FIG. 29 further illustrates reference cross-sections that are used in later figures. Cross-section C-C is along a longitudinal axis of the gate electrode 394 and in a direction, for example, perpendicular to the direction of current flow between the source/drain regions 382 of the FinFET. Cross-section D-D is perpendicular to cross-section C-C and is along a longitudinal axis of the fin 352 and in a direction of, for example, a current flow between the source/drain regions 382 of the FinFET. Cross-section E-E is parallel to cross-section C-C and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, gate-all-around field effect transistors (GAAFETs), or the like.

Figure 30:
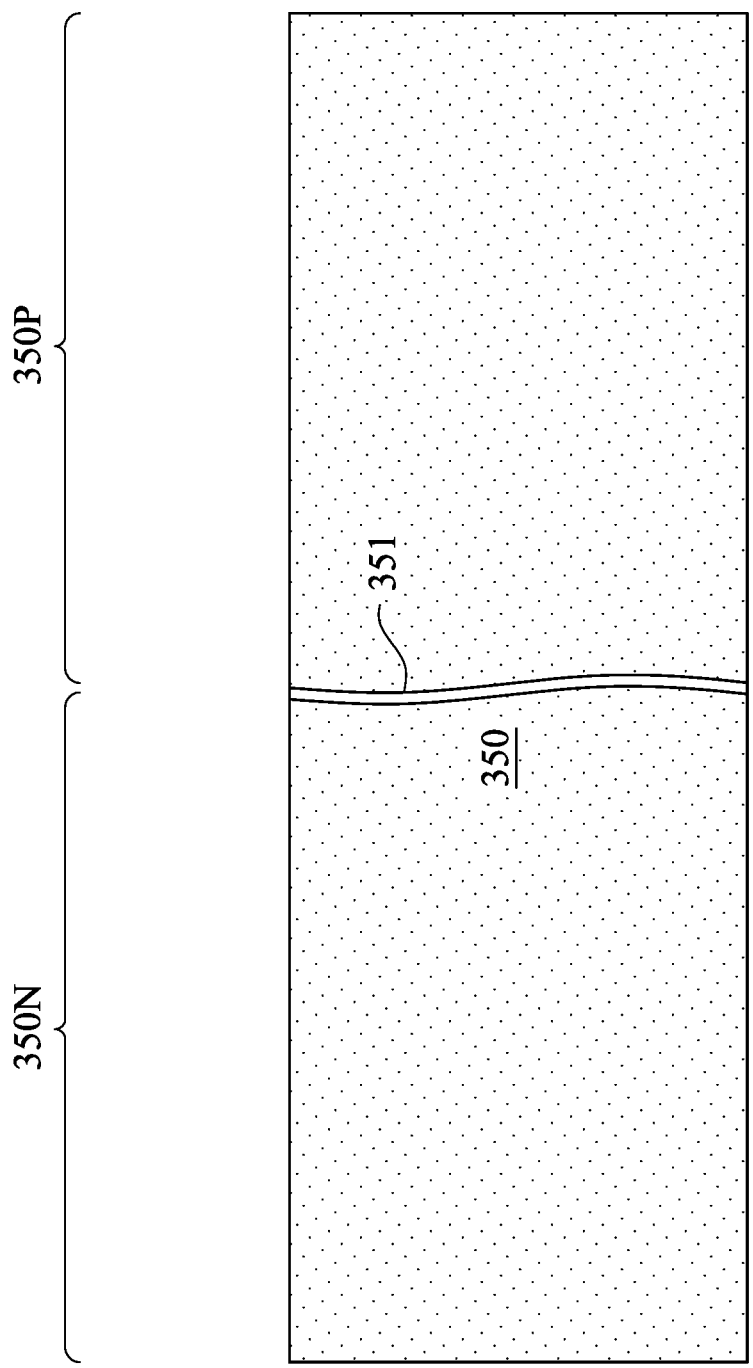

In FIG. 30, a substrate 350 is provided. The substrate 350 may be a semiconductor substrate, such as a bulk semiconductor, a semiconductor-on-insulator (SOI) substrate, or the like, which may be doped (e.g., with a p-type or an n-type dopant) or undoped. The substrate 350 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 350 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 350 has an n-type region 350N and a p-type region 350P. The n-type region 350N can be for forming n-type devices, such as NMOS transistors, e.g., n-type FinFETs. The p-type region 350P can be for forming p-type devices, such as PMOS transistors, e.g., p-type FinFETs. The n-type region 350N may be physically separated from the p-type region 350P (as illustrated by divider 351), and any number of device features (e.g., other active devices, doped regions, isolation structures, etc.) may be disposed between the n-type region 350N and the p-type region 350P.

Figure 31:
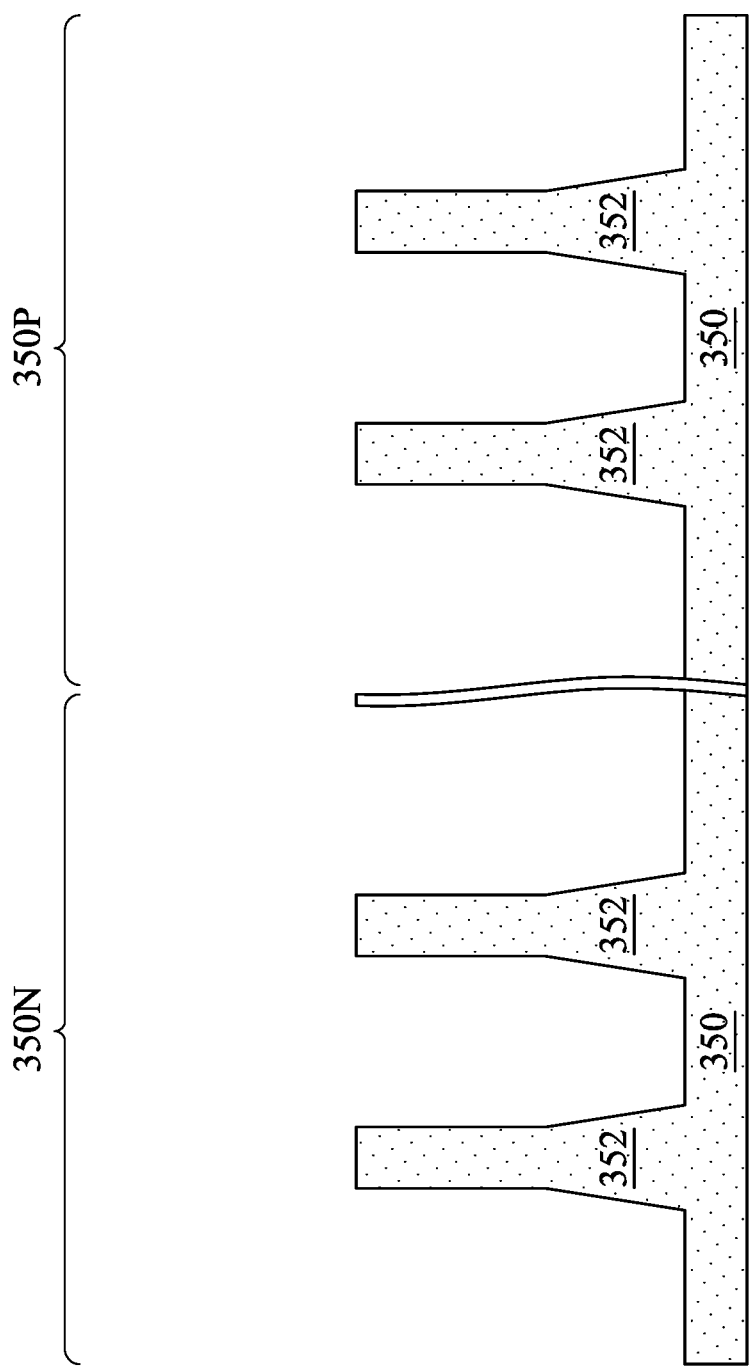

In FIG. 31, fins 352 are formed in the substrate 350. The fins 352 are semiconductor strips. In some embodiments, the fins 352 may be formed in the substrate 350 by etching trenches in the substrate 350. The etching may be any acceptable etch process, such as a reactive ion etch (RIE), neutral beam etch (NBE), the like, or a combination thereof. The etch may be anisotropic.

The fins may be patterned by any suitable method. For example, the fins 352 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 352.

Figure 32:
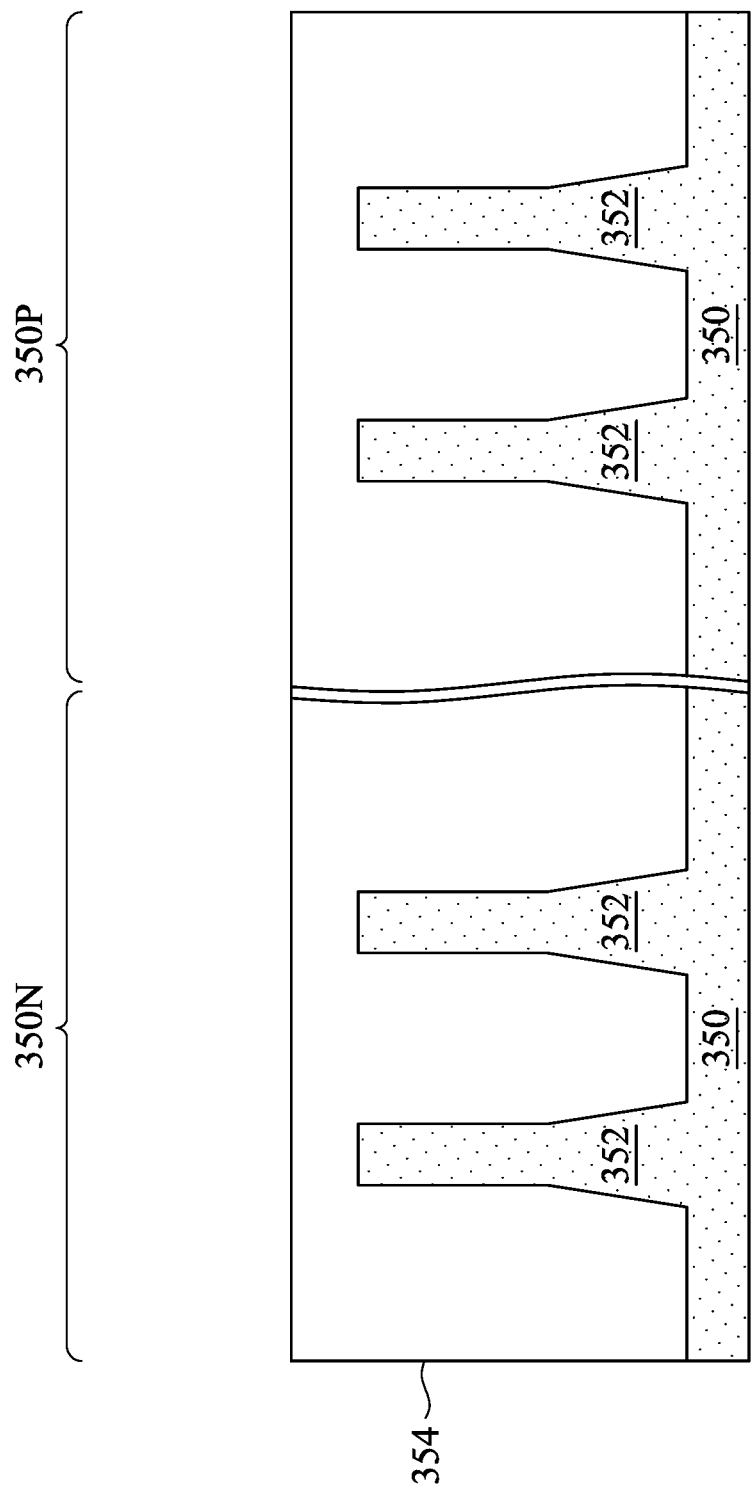

In FIG. 32, an insulation material 354 is formed over the substrate 350 and between neighboring fins 352. The insulation material 354 may be an oxide, such as silicon oxide, a nitride, the like, or a combination thereof, and may be formed by a high-density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 354 is silicon oxide formed by a FCVD process. An anneal process may be performed once the insulation material is formed. In an embodiment, the insulation material 354 is formed such that excess insulation material 354 covers the fins 352. Although the insulation material 354 is illustrated as a single layer, some embodiments may utilize multiple layers. For example, in some embodiments a liner (not shown) may first be formed along a surface of the substrate 350 and the fins 352. Thereafter, a fill material, such as those discussed above may be formed over the liner.

Figure 33:
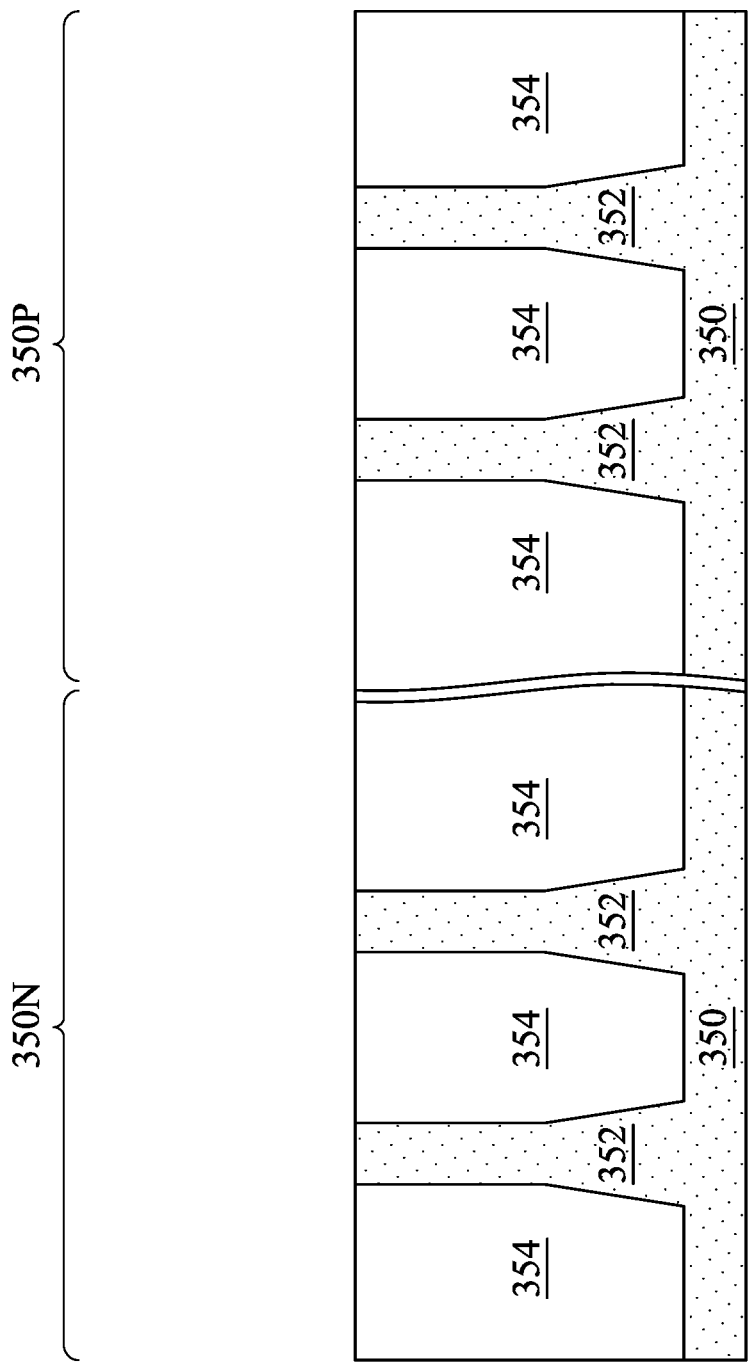

In FIG. 33, a removal process is applied to the insulation material 354 to remove excess insulation material 354 over the fins 352. In some embodiments, a planarization process such as a chemical mechanical polish (CMP), an etch-back process, combinations thereof, or the like may be utilized. The planarization process exposes the fins 352 such that top surfaces of the fins 352 and the insulation material 354 are level after the planarization process is complete. In embodiments in which a mask remains on the fins 352, the planarization process may expose the mask or remove the mask such that top surfaces of the mask or the fins 352, respectively, and the insulation material 354 are level after the planarization process is complete.

Figure 34:
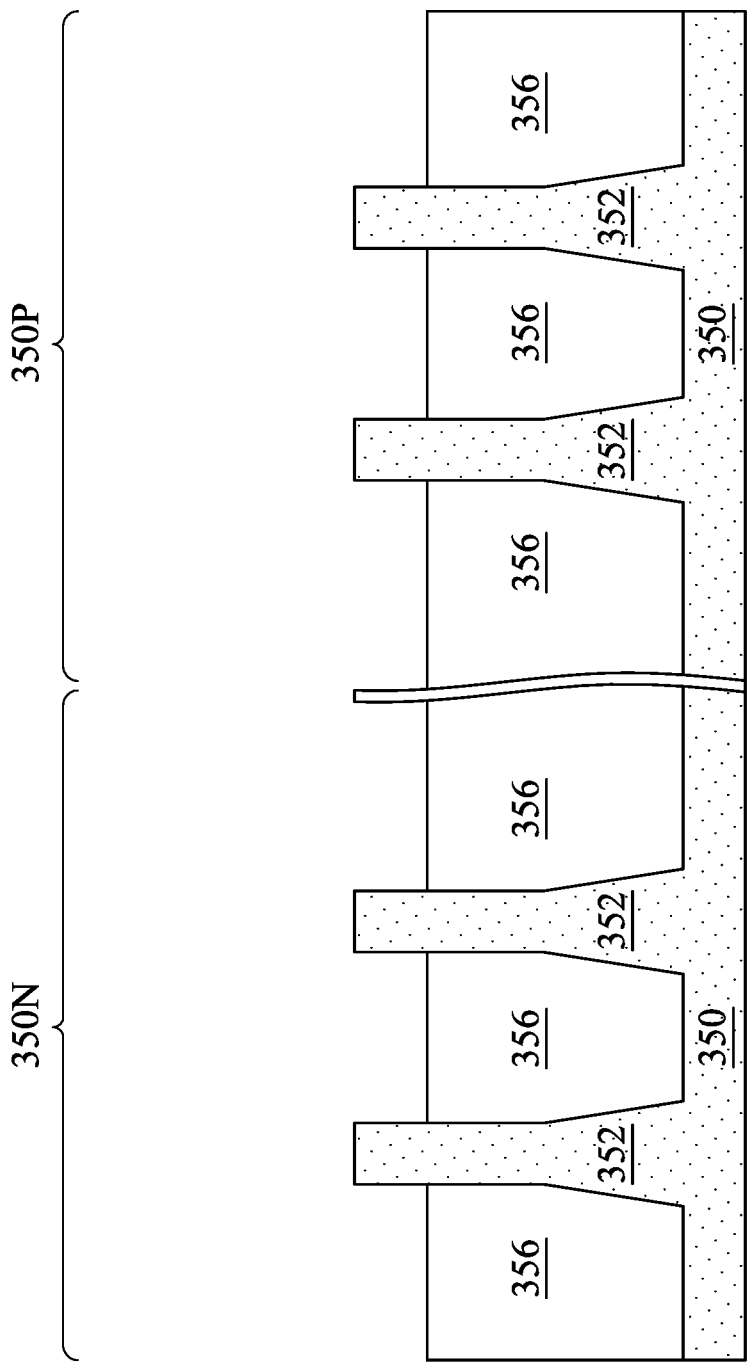

In FIG. 34, the insulation material 354 is recessed to form Shallow Trench Isolation (STI) regions 356. The insulation material 354 is recessed such that upper portions of fins 352 in the n-type region 350N and in the p-type region 350P protrude from between neighboring STI regions 356. Further, the top surfaces of the STI regions 356 may have a flat surface as illustrated, a convex surface, a concave surface (such as dishing), or a combination thereof. The top surfaces of the STI regions 356 may be formed flat, convex, and/or concave by an appropriate etch. The STI regions 356 may be recessed using an acceptable etching process, such as one that is selective to the material of the insulation material 354 (e.g., etches the material of the insulation material 354 at a faster rate than the material of the fins 352). For example, an oxide removal using, for example, dilute hydrofluoric (dHF) acid may be used.

The process described with respect to FIGS. 30 through 34 is just one example of how the fins 352 may be formed. In some embodiments, the fins may be formed by an epitaxial growth process. For example, a dielectric layer can be formed over a top surface of the substrate 350, and trenches can be etched through the dielectric layer to expose the underlying substrate 350. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 352. For example, the fins 352 in FIG. 33 can be recessed, and a material different from the fins 352 may be epitaxially grown over the recessed fins 352. In such embodiments, the fins 352 comprise the recessed material as well as the epitaxially grown material disposed over the recessed material.

In an even further embodiment, a dielectric layer can be formed over a top surface of the substrate 350, and trenches can be etched through the dielectric layer. Heteroepitaxial structures can then be epitaxially grown in the trenches using a material different from the substrate 350, and the dielectric layer can be recessed such that the heteroepitaxial structures protrude from the dielectric layer to form the fins 352. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 350N (e.g., an NMOS region) different from the material in p-type region 350P (e.g., a PMOS region). In various embodiments, upper portions of the fins 352 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 34, appropriate wells (not shown) may be formed in the fins 352 and/or the substrate 350. In some embodiments, a P well may be formed in the n-type region 350N, and an N well may be formed in the p-type region 350P. In some embodiments, a P well or an N well are formed in both the n-type region 350N and the p-type region 350P.

In the embodiments with different well types, the different implant steps for the n-type region 350N and the p-type region 350P may be achieved using a photoresist and/or other masks (not shown). For example, a photoresist may be formed over the fins 352 and the STI regions 356 in the n-type region 350N. The photoresist is patterned to expose the p-type region 350P of the substrate 350. The photoresist can be formed by using a spin-on technique and can be patterned using acceptable photolithography techniques. Once the photoresist is patterned, an n-type impurity implant is performed in the p-type region 350P, and the photoresist may act as a mask to substantially prevent n-type impurities from being implanted into the n-type region 350N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 350P, a photoresist is formed over the fins 352 and the STI regions 356 in the p-type region 350P. The photoresist is patterned to expose the n-type region 350N of the substrate 350. The photoresist can be formed by using a spin-on technique and can be patterned using acceptable photolithography techniques. Once the photoresist is patterned, a p-type impurity implant may be performed in the n-type region 350N, and the photoresist may act as a mask to substantially prevent p-type impurities from being implanted into the p-type region 350P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 350N and the p-type region 350P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 35:
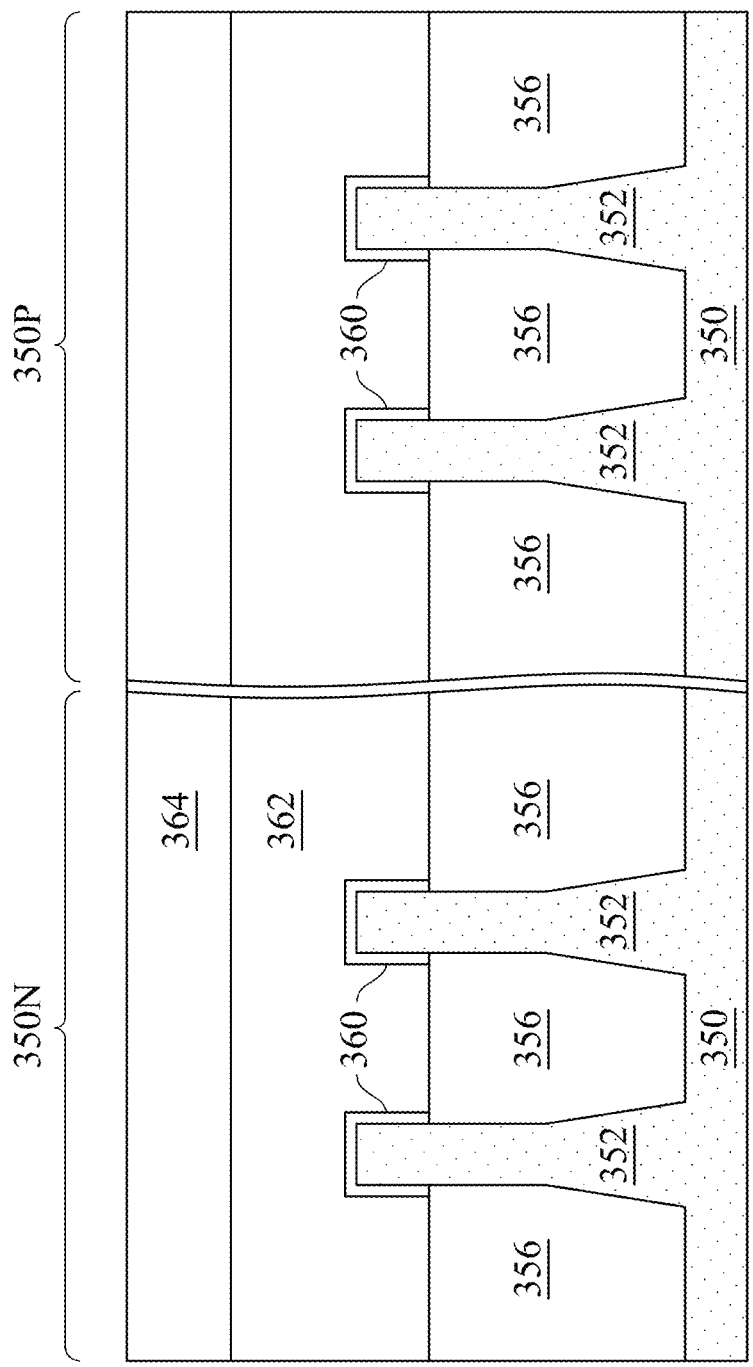

In FIG. 35, a dummy dielectric layer 360 is formed on the fins 352. The dummy dielectric layer 360 may be, for example, silicon oxide, silicon nitride, a combination thereof, or the like, and may be deposited or thermally grown according to acceptable techniques. A dummy gate layer 362 is formed over the dummy dielectric layer 360, and a mask layer 364 is formed over the dummy gate layer 362. The dummy gate layer 362 may be deposited over the dummy dielectric layer 360 and then planarized, such as by a CMP. The mask layer 364 may be deposited over the dummy gate layer 362. The dummy gate layer 362 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals.

The dummy gate layer 362 may be deposited by physical vapor deposition (PVD), CVD, sputter deposition, or other techniques for depositing the selected material. The dummy gate layer 362 may be made of other materials that have a high etching selectivity from the etching of isolation regions, e.g., the STI regions 356 and/or the dummy dielectric layer 360. The mask layer 364 may include one or more layers of, for example, silicon nitride, silicon oxynitride, or the like. In this example, a single dummy gate layer 362 and a single mask layer 364 are formed across the n-type region 350N and the p-type region 350P.

It is noted that the dummy dielectric layer 360 is shown covering only the fins 352 for illustrative purposes only. In some embodiments, the dummy dielectric layer 360 may be deposited such that the dummy dielectric layer 360 covers the STI regions 356, extending over the STI regions and between the dummy gate layer 362 and the STI regions 356.

FIGS. 36A through 48 and 50A through 52B illustrate various additional steps in the manufacturing of embodiment devices. FIGS. 36A through 48 and 50A through 52B illustrate features in either of the n-type region 350N and the p-type region 350P. For example, the structures illustrated in FIGS. 36A through 48 and 50A through 52B may be applicable to both the n-type region 350N and the p-type region 350P. Differences (if any) in the structures of the n-type region 350N and the p-type region 350P are described in the text accompanying each figure.

Figure 36B:
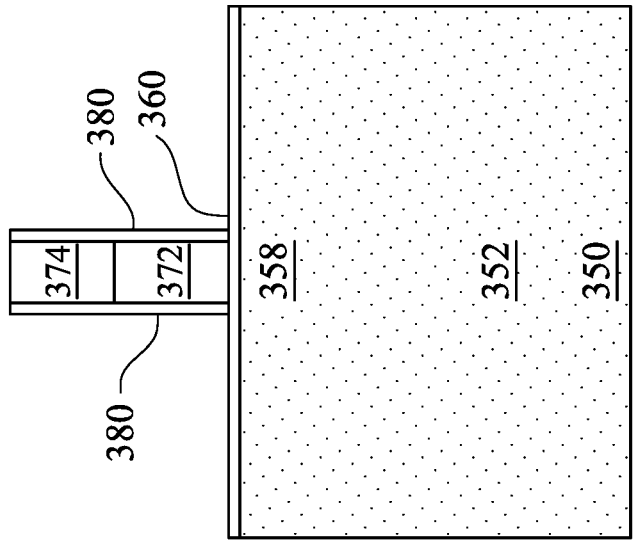
Figure 36A:
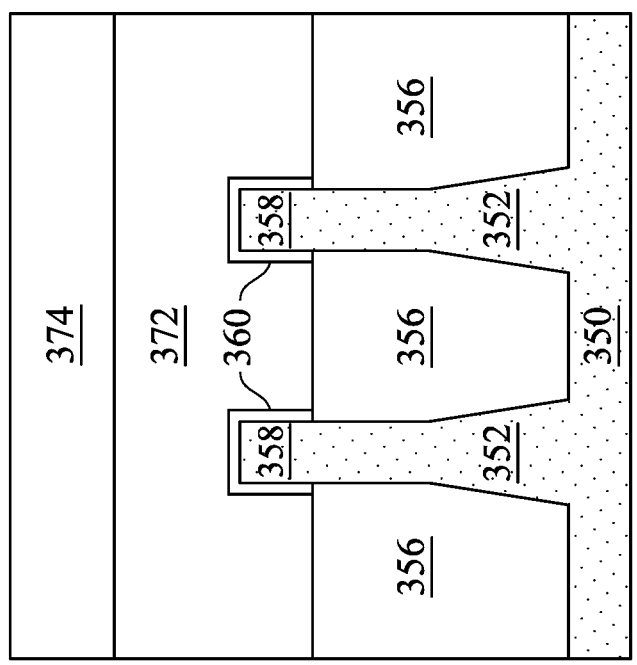

In FIGS. 36A and 36B, the mask layer 364 (see FIG. 35) may be patterned using acceptable photolithography and etching techniques to form masks 374. The pattern of the masks 374 then may be transferred to the dummy gate layer 362. In some embodiments (not illustrated), the pattern of the masks 374 may also be transferred to the dummy dielectric layer 360 by an acceptable etching technique to form dummy gates 372. The dummy gates 372 cover respective channel regions 358 of the fins 352. The pattern of the masks 374 may be used to physically separate each of the dummy gates 372 from adjacent dummy gates. The dummy gates 372 may also have a lengthwise direction substantially perpendicular to the lengthwise direction of respective epitaxial fins 352.

Further in FIGS. 36A and 36B, gate seal spacers 380 can be formed on exposed surfaces of the dummy gates 372, the masks 374, and/or the fins 352. A thermal oxidation or a deposition followed by an anisotropic etch may form the gate seal spacers 380. The gate seal spacers 380 may be formed of silicon oxide, silicon nitride, silicon oxynitride, or the like.

After the formation of the gate seal spacers 380, implants for lightly doped source/drain (LDD) regions (not explicitly illustrated) may be performed. In the embodiments with different device types, similar to the implants discussed above in FIG. 34, a mask, such as a photoresist, may be formed over the n-type region 350N, while exposing the p-type region 350P, and appropriate type (e.g., p-type) impurities may be implanted into the exposed fins 352 in the p-type region 350P. The mask may then be removed. Subsequently, a mask, such as a photoresist, may be formed over the p-type region 350P while exposing the n-type region 350N, and appropriate type impurities (e.g., n-type) may be implanted into the exposed fins 352 in the n-type region 350N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 37B:
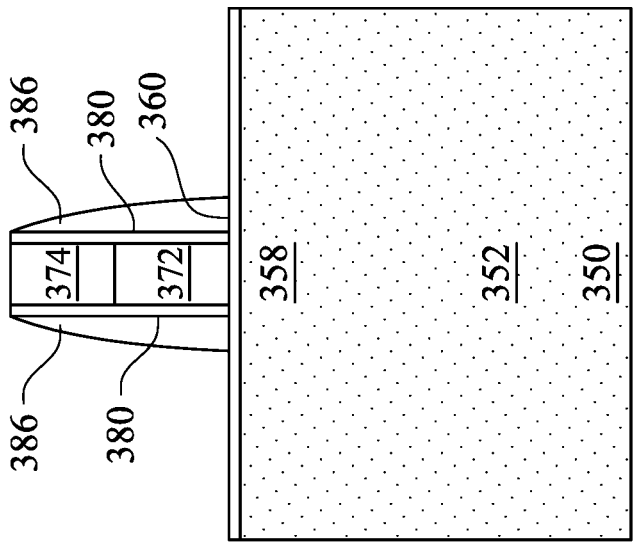
Figure 37A:
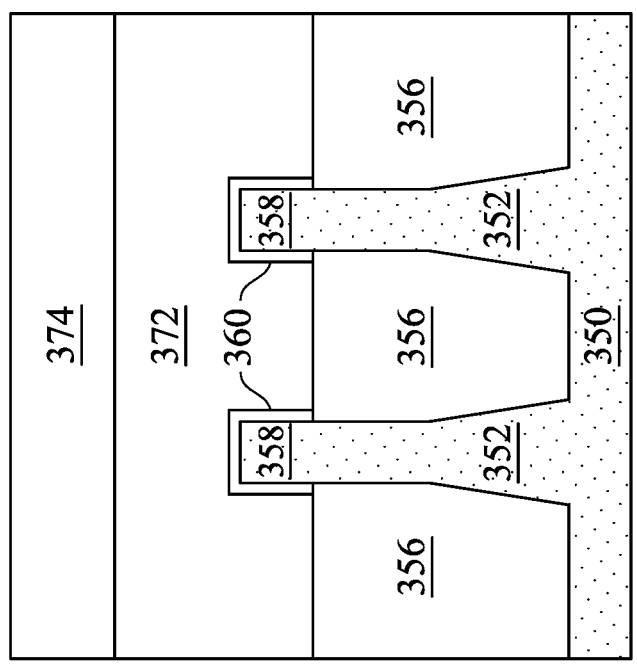

In FIGS. 37A and 37B, gate spacers 386 are formed on the gate seal spacers 380 along sidewalls of the dummy gates 372 and the masks 374. The gate spacers 386 may be formed by conformally depositing an insulating material and subsequently anisotropically etching the insulating material. The insulating material of the gate spacers 386 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 380 may not be etched prior to forming the gate spacers 386), yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 380 while the LDD regions for p-type devices may be formed after forming the gate seal spacers 380.

Figure 38B:
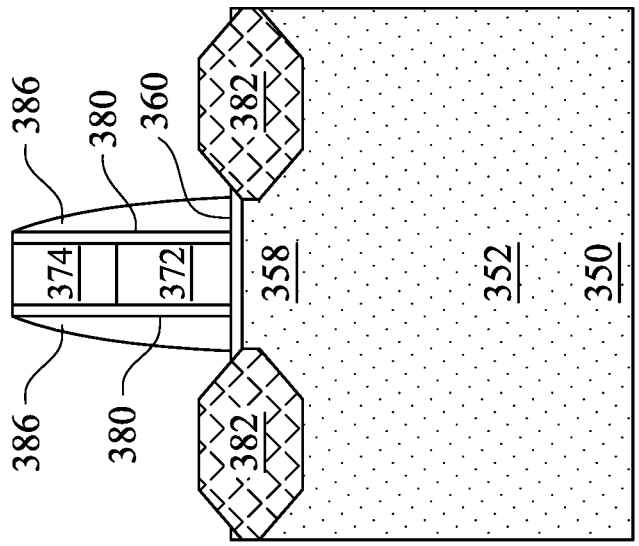
Figure 38A:
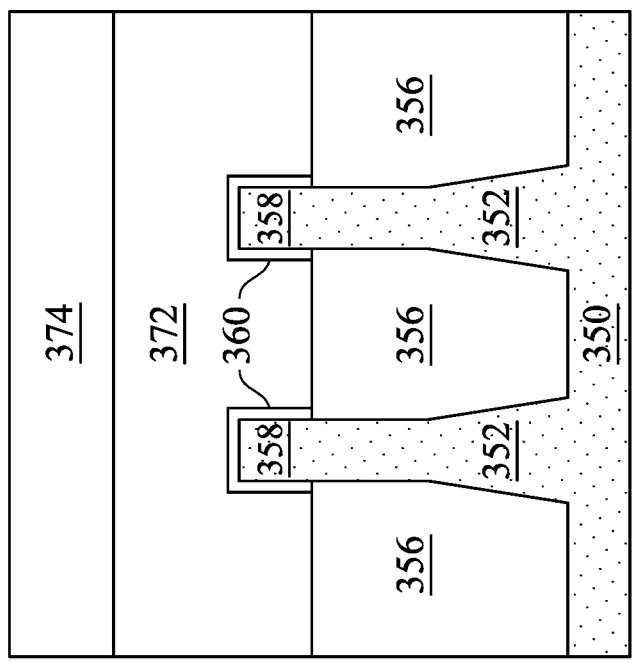

In FIGS. 38A and 38B epitaxial source/drain regions 382 are formed in the fins 352. The epitaxial source/drain regions 382 are formed in the fins 352 such that each dummy gate 372 is disposed between respective neighboring pairs of the epitaxial source/drain regions 382. In some embodiments the epitaxial source/drain regions 382 may extend into, and may also penetrate through, the fins 352. In some embodiments, the gate spacers 386 are used to separate the epitaxial source/drain regions 382 from the dummy gates 372 by an appropriate lateral distance so that the epitaxial source/drain regions 382 do not short out subsequently formed gates of the resulting FinFETs. A material of the epitaxial source/drain regions 382 may be selected to exert stress in the respective channel regions 358, thereby improving performance.

The epitaxial source/drain regions 382 in the n-type region 350N may be formed by masking the p-type region 350P and etching source/drain regions of the fins 352 in the n-type region 350N to form recesses in the fins 352. Then, the epitaxial source/drain regions 382 in the n-type region 350N are epitaxially grown in the recesses. The epitaxial source/drain regions 382 may include any acceptable material, such as appropriate for n-type FinFETs. For example, if the fin 352 is silicon, the epitaxial source/drain regions 382 in the n-type region 350N may include materials exerting a tensile strain in the channel region 358, such as silicon, silicon carbide, phosphorous doped silicon carbide, silicon phosphide, or the like. The epitaxial source/drain regions 382 in the n-type region 350N may have surfaces raised from respective surfaces of the fins 352 and may have facets.

The epitaxial source/drain regions 382 in the p-type region 350P may be formed by masking the n-type region 350N and etching source/drain regions of the fins 352 in the p-type region 350P to form recesses in the fins 352. Then, the epitaxial source/drain regions 382 in the p-type region 350P are epitaxially grown in the recesses. The epitaxial source/drain regions 382 may include any acceptable material, such as appropriate for p-type FinFETs. For example, if the fin 352 is silicon, the epitaxial source/drain regions 382 in the p-type region 350P may comprise materials exerting a compressive strain in the channel region 358, such as silicon-germanium, boron doped silicon-germanium, germanium, germanium tin, or the like. The epitaxial source/ drain regions 382 in the p-type region 350P may have surfaces raised from respective surfaces of the fins 352 and may have facets.

The epitaxial source/drain regions 382 and/or the fins 352 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 382 may be in situ doped during growth.

Figure 38D:
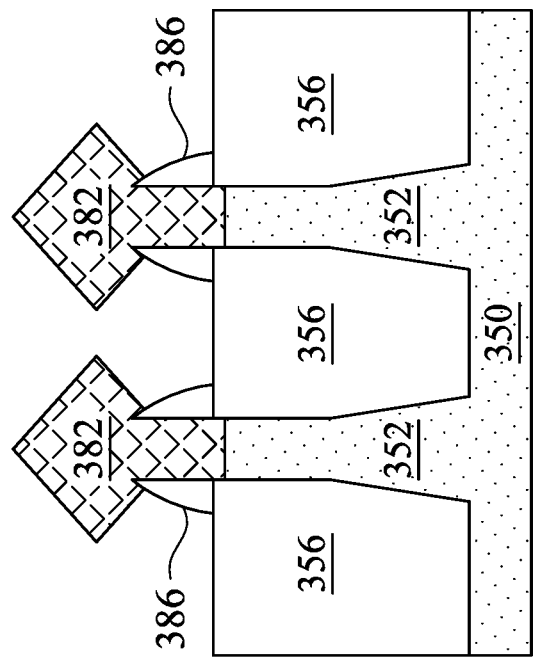
Figure 38C:
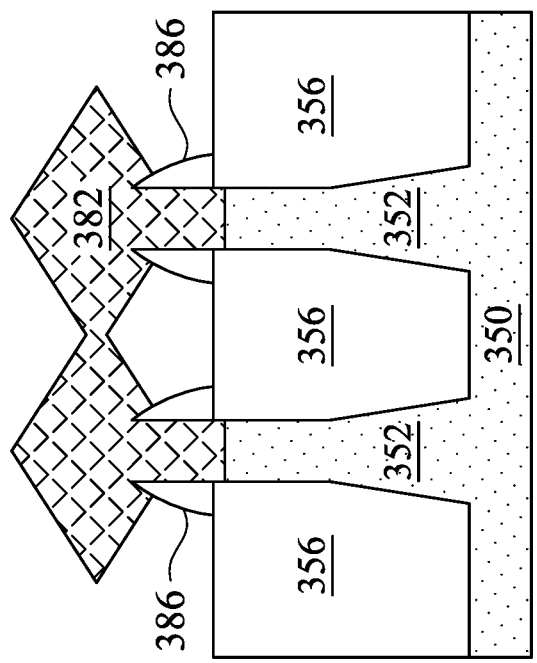

As a result of the epitaxy processes used to form the epitaxial source/drain regions 382 in the n-type region 350N and the p-type region 350P, upper surfaces of the epitaxial source/drain regions have facets which expand laterally outward beyond sidewalls of the fins 352. In some embodiments, these facets cause adjacent source/drain regions 382 of a same FinFET to merge as illustrated by FIG. 38C. In other embodiments, adjacent source/drain regions 382 remain separated after the epitaxy process is completed as illustrated by FIG. 38D. In the embodiments illustrated in FIGS. 38C and 38D, gate spacers 386 are formed covering a portion of the sidewalls of the fins 352 that extend above the STI regions 356 thereby blocking the epitaxial growth. In some other embodiments, the spacer etch used to form the gate spacers 386 may be adjusted to remove the spacer material to allow the epitaxially grown region to extend to the surface of the STI region 356.

Figure 39B:
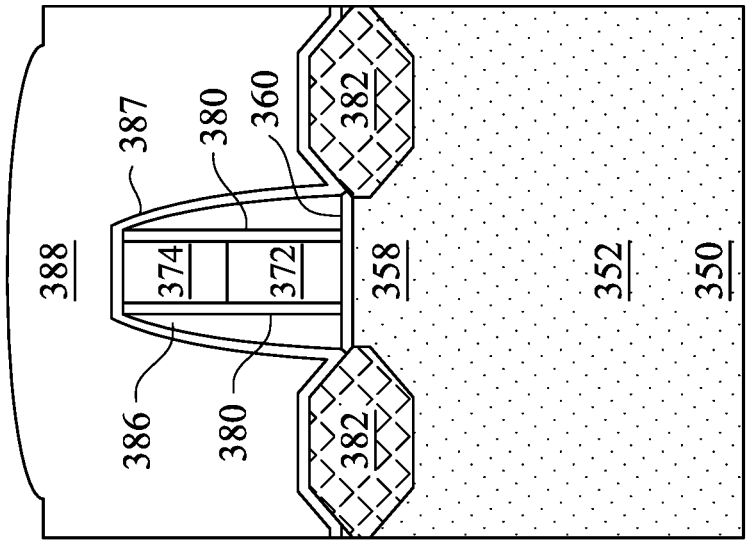
Figure 39A:
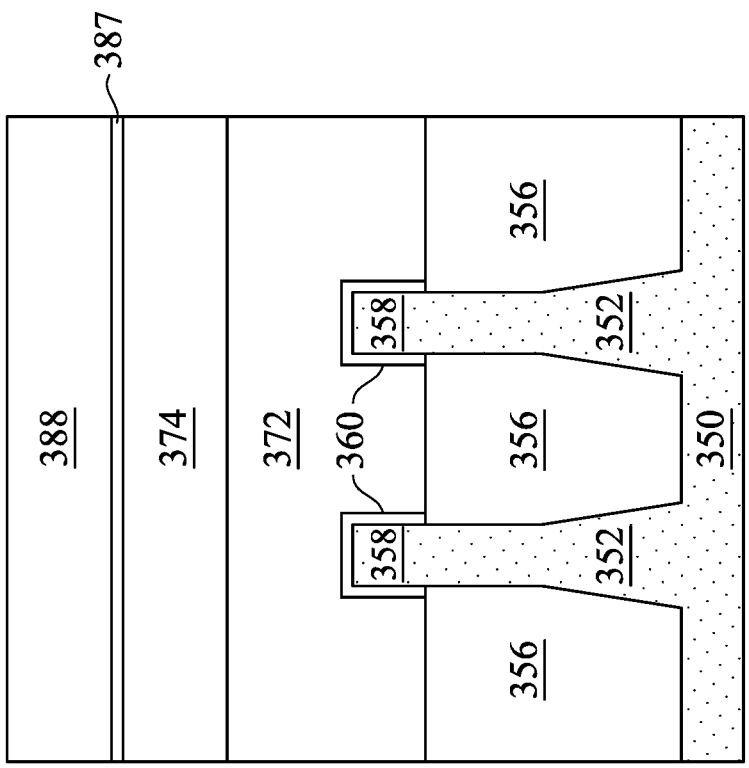

In FIGS. 39A and 39B, a first interlayer dielectric (ILD) 388 is deposited over the structure illustrated in FIGS. 38A and 38B. The first ILD 388 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 387 is disposed between the first ILD 388 and the epitaxial source/drain regions 382, the masks 374, and the gate spacers 386. The CESL 387 may comprise a dielectric material such as silicon nitride, silicon oxide, silicon oxynitride, or the like, having a lower etch rate than the material of the overlying first ILD 388.

In FIGS. 40A and 40B, a planarization process, such as a CMP, may be performed to level the top surface of the first ILD 388 with the top surfaces of the dummy gates 372 or the masks 374. The planarization process may also remove the masks 374 on the dummy gates 372, and portions of the gate seal spacers 380 and the gate spacers 386 along sidewalls of the masks 374. After the planarization process, top surfaces of the dummy gates 372, the gate seal spacers 380, the gate spacers 386, and the first ILD 388 are level. Accordingly, the top surfaces of the dummy gates 372 are exposed through the first ILD 388. In some embodiments, the masks 374 may remain, in which case the planarization process levels the top surface of the first ILD 388 with the top surfaces of the masks 374.

Figure 41B:
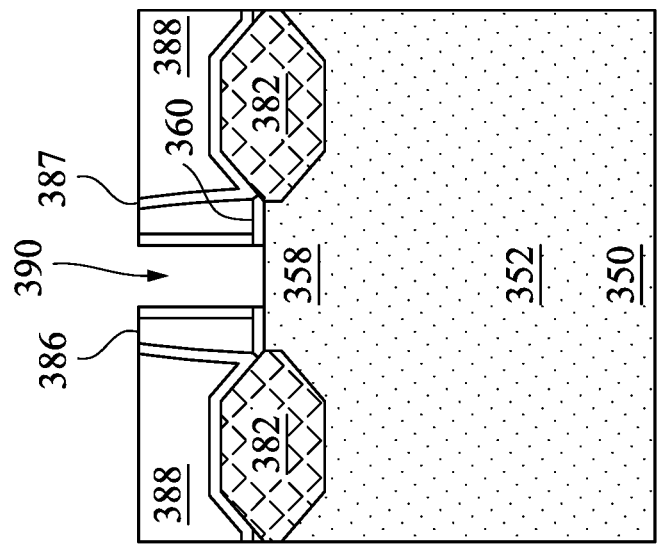
Figure 41A:
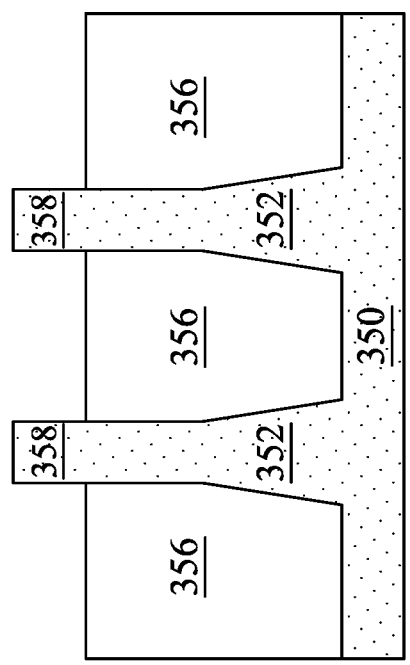

In FIGS. 41A and 41B, the dummy gates 372, and the masks 374 if present, are removed in an etching step(s), so that recesses 390 are formed. Portions of the dummy dielectric layer 360 in the recesses 390 may also be removed. In some embodiments, only the dummy gates 372 are removed and the dummy dielectric layer 360 remains and is exposed by the recesses 390. In some embodiments, the dummy dielectric layer 360 is removed from recesses 390 in a first region of a die (e.g., a core logic region) and remains in recesses 390 in a second region of the die (e.g., an input/output region).

In some embodiments, the dummy gates 372 are removed by an anisotropic dry etch process. For example, the etching process may include a dry etch process using reaction gas(es) that selectively etch the dummy gates 372 with little or no etching of the first ILD 388 or the gate spacers 386. Each recess 390 exposes and/or overlies a channel region 358 of a respective fin 352. Each channel region 358 is disposed between neighboring pairs of the epitaxial source/drain regions 382. During the removal, the dummy dielectric layer 360 may be used as an etch stop layer when the dummy gates 372 are etched. The dummy dielectric layer 360 may then be optionally removed after the removal of the dummy gates 372.

Figure 42B:
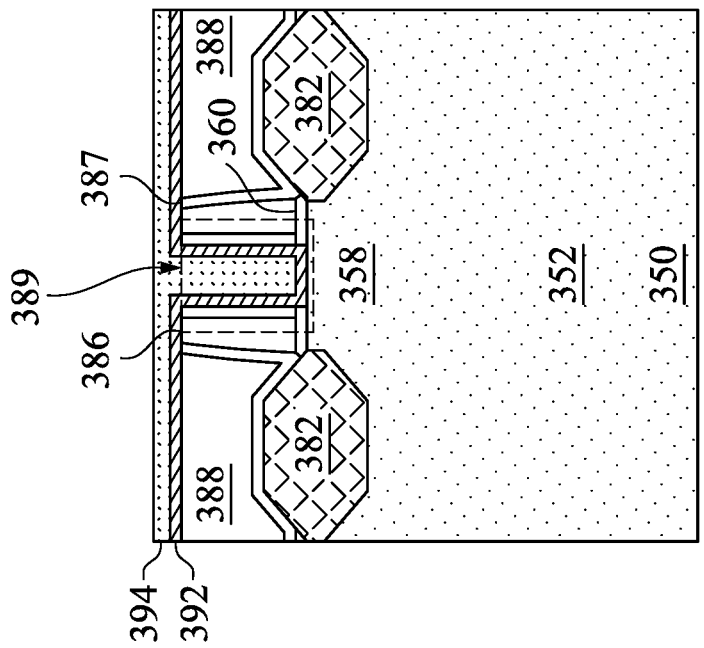
Figure 42A:
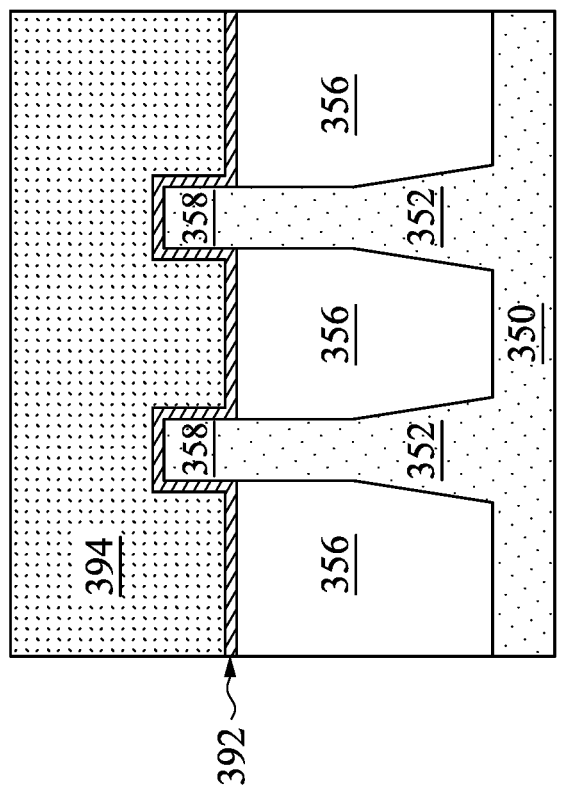
Figure 42C:
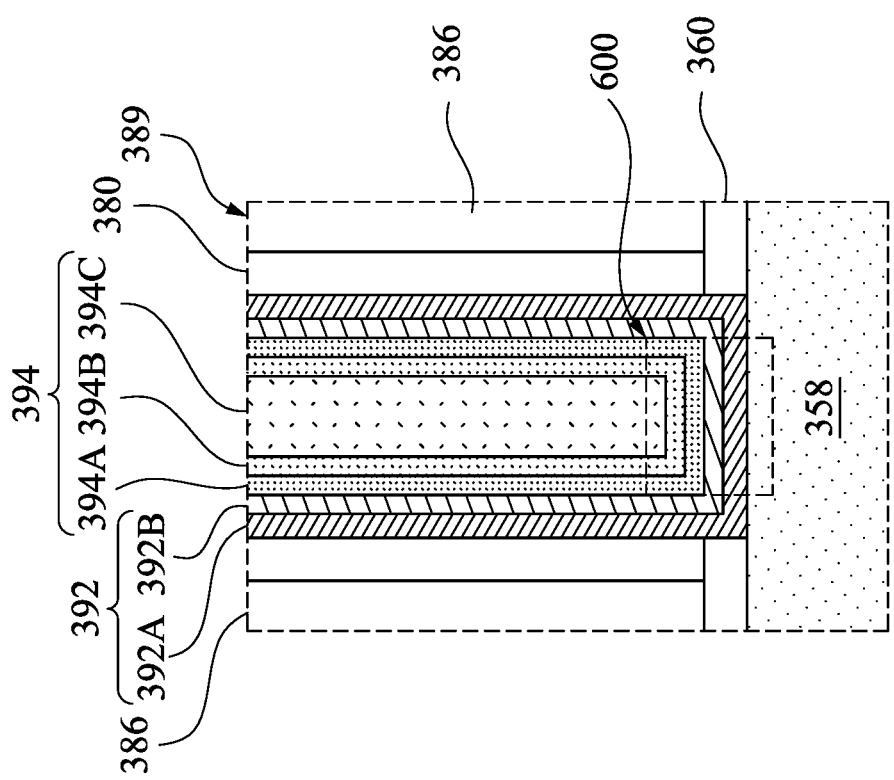

In FIGS. 42A and 42B, a gate dielectric layer 392 and a gate electrode layer 394 are formed for replacement gates. The gate dielectric layer 392 is formed in the recesses 390, and the gate electrode layer 394 is formed on the gate dielectric layer 392. FIG. 42C illustrates a detailed view of region 389 of FIG. 42B, showing additional details of the gate dielectric layer 392 and the gate electrode layer 394.

The gate dielectric layer 392 includes one or more layers deposited in the recesses 390, such as on the top surfaces and the sidewalls of the fins 352 and on sidewalls of the gate seal spacers 380/gate spacers 386. In some embodiments, the gate dielectric layer 392 includes one or more dielectric layers, such as one or more layers of silicon oxide, silicon nitride, metal oxide, metal silicate, or the like. For example, as illustrated by FIG. 42C, in some embodiments, the gate dielectric layer 392 includes an interfacial layer 392A of silicon oxide formed by thermal or chemical oxidation and an overlying high-k dielectric layer 392B of high-k dielectric material, such as a metal oxide or a silicate of hafnium, aluminum, zirconium, lanthanum, manganese, barium, titanium, lead, and combinations thereof. In some embodiments, the high-k dielectric layer 392B comprises hafnium oxide. The gate dielectric layer 392 may include a dielectric layer having a k value greater than about 7.0.

The gate electrode layer 394 is deposited over the gate dielectric layer 392, and fills the remaining portions of the recesses 390. The gate electrodes 394 may include a metal-containing material such as titanium nitride, titanium oxide, titanium aluminum, tantalum nitride, tantalum carbide, cobalt, ruthenium, aluminum, tungsten, combinations thereof, or multi-layers thereof. For example, although a single layered gate electrode layer 394 is illustrated in FIG. 42B, the gate electrode layer 394 may comprise any number of liner layers 394A, any number of work function tuning layers 394B, and a fill material 394C as illustrated by FIG. 42C.

The formation of the gate dielectric layers 392 in the n-type region 350N and the p-type region 350P may occur simultaneously such that the gate dielectric layers 392 in each region are formed from the same materials, and the formation of the gate electrode layers 394 may occur simultaneously such that the gate electrode layers 394 in each region are formed from the same materials.

In some embodiments, the gate dielectric layers 392 in each region may be formed by distinct processes, such that the gate dielectric layers 392 may be different materials, and/or the gate electrode layers 394 in each region may be formed by distinct processes, such that the gate electrode layers 394 may be different materials. Various masking steps may be used to mask and expose appropriate regions when using distinct processes. In the following description, at least portions of the gate dielectric layers 392 in the n-type region 350N and the gate dielectric layers 392 in the p-type region 350P are formed separately.

FIGS. 43 through 48 illustrate a process for forming layers for replacement gates in region 600. As will subsequently be described in greater detail, a gate dielectric layer 392 and a gate electrode layer 394 are formed in the recesses 390. A fluorine treatment 610 (see FIG. 44) is applied to the gate dielectric layer 392 so that fluorine is diffused into the gate dielectric layer 392. A dipole dopant species is also diffused into the gate dielectric layer 392 (see FIGS. 45-47). By controlling the concentration of the dipole dopant species in the gate dielectric layer 392, threshold voltages of subsequently formed transistors may be tuned without negatively affecting respective spacings for the gates of the transistors. These aspects can further be implemented in various combinations, with or without additional work function tuning layers (see below, FIG. 48) in the gates to tune threshold voltages.

The dipole dopant species introduced into the gate dielectric layer 392 (see below, FIGS. 45-47) may cause charge buildup within the gate dielectric layer 392, which may lead to leakage path and reliability issues of the transistors. The diffused fluorine in the gate dielectric layer 392 may bond with the diffused dipole dopant in the gate dielectric layer 392 and reduces charge buildup within the gate dielectric layer 392, which further reduces the leakage path and the reliability issues.

Figure 43:
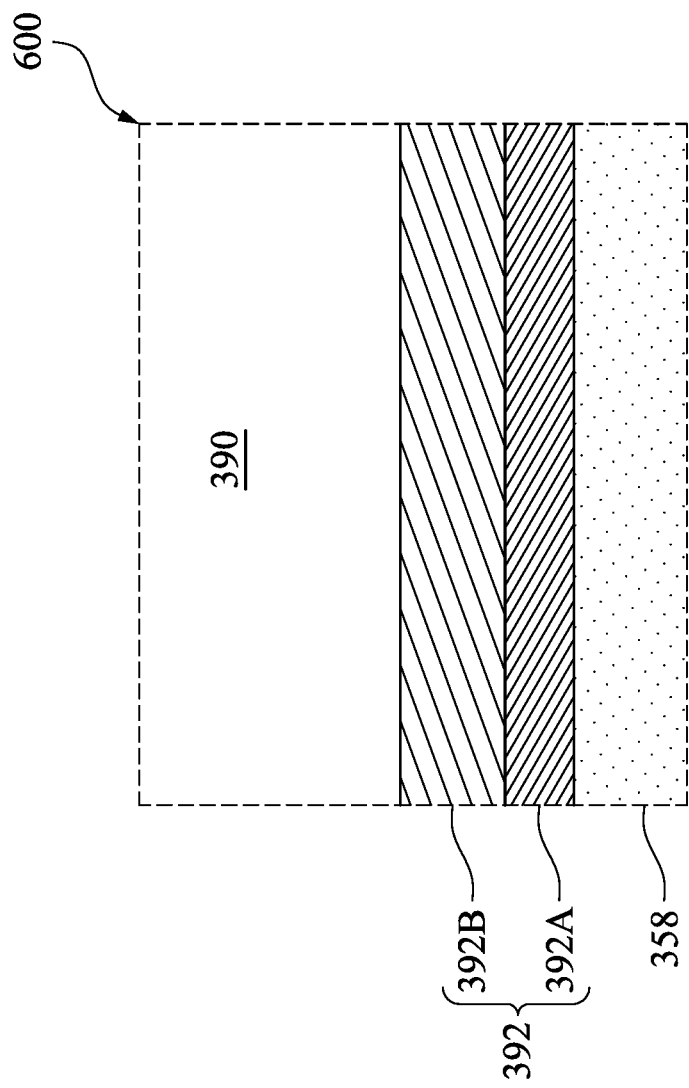

In FIG. 43, the gate dielectric layer 392 (including an interfacial layer 392A and a high-k dielectric layer 392B) is deposited in the recesses 390. The gate dielectric layer 392 may also be deposited on the top surface of the first ILD 388 (see FIG. 42B). The formation methods of the gate dielectric layer 392 may include Molecular-Beam Deposition (MBD), ALD, PECVD, and the like. In embodiments where portions of the dummy gate dielectric 361 remains in the recesses 390, the gate dielectric layer 392 includes a material of the dummy gate dielectric 361 (e.g., silicon oxide).

Figure 44:
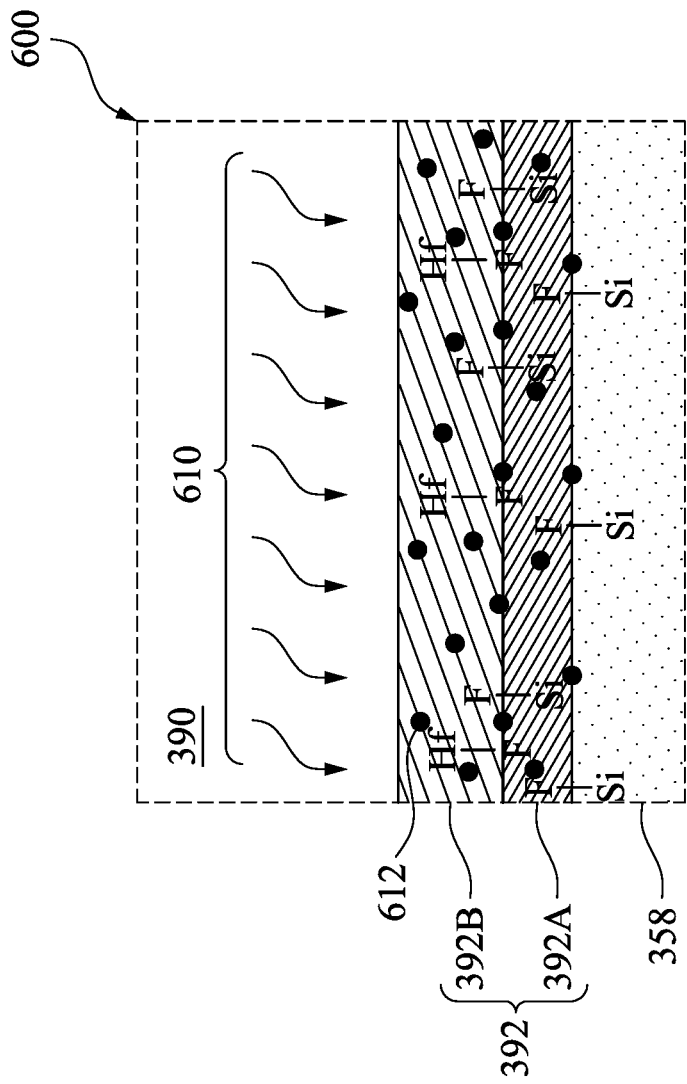

In FIG. 44, a fluorine treatment 610 is applied to the high-k dielectric layer 392B. In some embodiments, the fluorine treatment 610 is a chemical soak that flows a fluorine-containing precursor over surfaces of the high-k dielectric layer 392B. In some embodiments, the fluorine-containing precursor may be $WF_x$, $NF_x$, $TiF_x$, $TaF_x$, $HfF_x$, or the like, where x is an integer in a range of 1 to 6. For example, the fluorine-containing precursor is $WF_6$ and/or $NF_3$ in some embodiments. When the fluorine-containing precursor reaches the high-k dielectric layer 392B, fluorine atoms 612 dissociate from the fluorine-containing precursor and diffuse through the high-k dielectric layer 392B to the interface between the high-k dielectric layer 392B and the interfacial layer 392A. Some of the fluorine atoms 612 further diffuse through the interfacial layer 392A to the interface between the interfacial layer 392A and the channel region 358.

The fluorine atoms 612 may bond to atoms of the high-k dielectric layer 392B, the interfacial layer 392A, and the channel region 358, such as at the interface of the high-k dielectric layer 392B with the interfacial layer 392A and at the interface of the interfacial layer 392A with the channel region 358. For example, in some embodiments in which the high-k dielectric layer 392B comprises hafnium dioxide, the interfacial layer 392A comprises silicon oxide or dioxide, and the channel region comprises silicon, the fluorine atoms 612 form strong hafnium-fluoride (Hf—F) and silicon-fluoride (Si—F) bonds at the respective interfaces of the high-k dielectric layer 392B, the interfacial layer 392A, and the channel region 358. Dopants subsequently introduced into the gate dielectric layer 392 (see below, FIGS. 45-47) may cause charge buildup in the gate dielectric layer 392. As will be subsequently described in greater detail, the diffused fluorine atoms 612 help reduce that charge buildup, improving the performance of the transistors.

In some embodiments, the fluorine treatment 610 is performed at a temperature in a range of 250° C. to 550° C. (e.g., by soaking the gate dielectric layer 392 in the fluorine-containing precursor at such a temperature), which may be advantageous for diffusing sufficient fluorine into the gate dielectric layer 392 to reduce leakage path and reliability weaknesses caused by a subsequent introduction of dipole dopants. It has been observed that when the temperature of the fluorine treatment 610 is less than 250° C., the fluorine-containing precursor does not properly dissociate and affect a desired change in the high-k dielectric layer 392B and/or its underlying layers. It has been observed that when the temperature of the fluorine treatment 610 is greater than 550° C., the amount of fluorine that dissociates from the fluorine-containing precursor may be too large to be precisely controlled.

In some embodiments, the fluorine treatment 610 is performed at a pressure in a range of 0.5 torr to 40 torr (e.g., by soaking the gate dielectric layer 392 in the fluorine-containing precursor at such a pressure), which may be advantageous for diffusing sufficient fluorine into the gate dielectric layer 392 to reduce leakage path and reliability weaknesses caused by a subsequent introduction of dipole dopants. It has been observed that when the pressure of the fluorine treatment 610 is less than 0.5 torr, the fluorine-containing precursor does not properly dissociate and affect a desired change in the high-k dielectric layer 392B and/or its underlying layers. It has been observed that when the pressure of the fluorine treatment 610 is greater than 40 torr, the amount of fluorine that dissociates from the fluorine-containing precursor may be too large to be precisely controlled.

In some embodiments, the fluorine treatment 610 is performed with a flow rate of the fluorine-containing precursor being in a range of 100 standard cubic centimeter per minute (sccm) to 6000 sccm (e.g., by flowing the fluorine-containing precursor over the gate dielectric layer 392 at such a flow rate), which may be advantageous for diffusing sufficient fluorine into the gate dielectric layer 392 to reduce leakage path and reliability weaknesses caused by a subsequent introduction of dipole dopants. It has been observed that when the fluorine treatment 610 is performed with a flow rate less than 100 sccm, the treatment process may not be sufficient to tune a threshold voltage of the resulting transistor. It has been observed that when the fluorine treatment 610 is performed with a flow rate greater than 6000 sccm, an excessive amount of fluorine may be introduced into the device, negatively impacting the threshold voltages of the resulting transistor.

In some embodiments, the fluorine treatment 610 is performed for a duration in a range of 0.5 seconds to 60 minutes (e.g., by soaking the gate dielectric layer 392 in the fluorine-containing precursor for such a duration), which may be advantageous for diffusing sufficient fluorine into the gate dielectric layer 392 to reduce leakage path and reliability weaknesses caused by a subsequent introduction of dipole dopants. It has been observed that when the fluorine treatment 610 is performed for less than 0.5 seconds, the treatment process may not be sufficient to tune a threshold voltage of the resulting transistor. It has been observed that when the fluorine treatment 610 is performed for greater than 60 minutes, an excessive amount of fluorine may be introduced into the device, negatively impacting the threshold voltages of the resulting transistor.

In some embodiments, the concentration of the fluorine atoms 612 at the interface of the high-k dielectric layer 392B with the interfacial layer 392A is in a range of $2 \times 10^3$ atoms/cm$^2$ to $5 \times 10^7$ atoms/cm$^2$, which may be advantageous for reducing leakage path and reliability weaknesses caused by a subsequent introduction of dipole dopants. The concentration of the fluorine atoms 612 at the interface of the high-k dielectric layer 392B with the interfacial layer 392A being less than $2 \times 10^3$ atoms/cm$^2$ may be disadvantageous by leading to increased leakage path and reliability weaknesses. The concentration of the fluorine atoms 612 at the interface of the high-k dielectric layer 392B with the interfacial layer 392A being greater than $5 \times 10^7$ atoms/cm$^2$ may be disadvantageous by negatively impacting the threshold voltages of the resulting transistor.

In some embodiments, the diffused fluorine atoms 612 have a density gradient from the top surface of the high-k dielectric layer 392B to the bottom surface of the high-k dielectric layer 392B in a range of $2 \times 10^3$ atoms/cm$^2$/nm to $5 \times 10^7$ atoms/cm$^2$/nm, which may be advantageous for reducing leakage path and reliability weaknesses caused by a subsequent introduction of dipole dopants. The density gradient from the top surface of the high-k dielectric layer 392B to the bottom surface of the high-k dielectric layer 392B being less than $2 \times 10^3$ atoms/cm$^2$/nm may be disadvantageous by leading to increased leakage path and reliability weaknesses. The density gradient from the top surface of the high-k dielectric layer 392B to the bottom surface of the high-k dielectric layer 392B being greater than $5 \times 10^7$ atoms/cm$^2$/nm may be disadvantageous by leading to negatively impacting the threshold voltages of the resulting transistor.

In some embodiments, the concentration of the fluorine atoms 612 at the interface of the interfacial layer 392A with the channel region 358 is in a range of $2 \times 10^3$ atoms/cm$^2$ to $5 \times 10^7$ atoms/cm$^2$, which may be advantageous for reducing leakage path and reliability weaknesses caused by a subsequent introduction of dipole dopants. The concentration of the fluorine atoms 612 at the interface of the interfacial layer 392A with the channel region 358 being less than $2 \times 10^3$ atoms/cm$^2$ may be disadvantageous by leading to increased leakage path and reliability weaknesses. The concentration of the fluorine atoms 612 at the interface of the interfacial layer 392A with the channel region 358 being greater than $5 \times 10^7$ atoms/cm$^2$ may be disadvantageous by negatively impacting the threshold voltages of the resulting transistor.

In some embodiments, the diffused fluorine atoms 612 have a density gradient from the top surface of the interfacial layer 392A to the bottom surface of the interfacial layer 392A in a range of $2 \times 10^3$ atoms/cm$^2$/nm to $5 \times 10^7$ atoms/cm$^2$/nm, which may be advantageous for reducing leakage path and reliability weaknesses caused by a subsequent introduction of dipole dopants. The density gradient from the top surface of the interfacial layer 392A to the bottom surface of the interfacial layer 392A being less than $2 \times 10^3$ atoms/cm$^2$/nm may be disadvantageous by leading to increased leakage path and reliability weaknesses. The density gradient from the top surface of interfacial layer 392A to the bottom surface of the interfacial layer 392A being greater than $5 \times 10^7$ atoms/cm$^2$/nm may be disadvantageous by leading to negatively impacting the threshold voltages of the resulting transistor.

Figure 45:
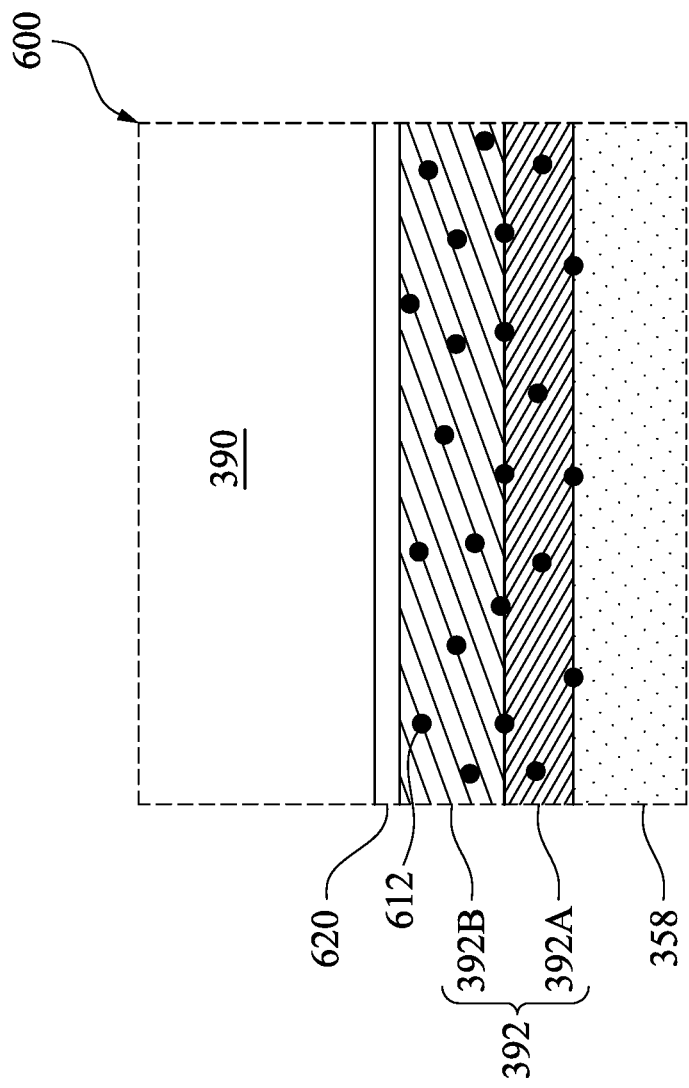

In FIG. 45, a dipole layer 620 is formed over the high-k dielectric layer 392B. The dipole layer 620 is subsequently used as a source of dipole dopant species to dope the gate dielectric layer 392 in order to tune the threshold voltages of subsequently formed transistors. The dipole dopant species of the dipole layer 620 may include aluminum (Al), lanthanum (La), zinc (Zn), gallium (Ga), the like, or a combination thereof; the dipole layer 620 may be formed of an oxide thereof, a nitride thereof, a carbide thereof, or the like. Different dipole layers 620 may be formed in the n-type region 350N and the p-type region 350P. In some embodiment, the dipole layer 620 in the p-type region 350P is formed of a material that includes a p-type dipole dopant, such as zinc oxide. In some embodiment, the dipole layer 620 in the n-type region 350N is formed of a material that includes an n-type dipole dopant, such as lanthanum oxide.

In some embodiments, the dipole layer 620 is formed with an atomic layer deposition (ALD) or a plasma enhanced atomic layer deposition (PEALD) process. The dipole layer 620 formation may be performed at a temperature in a range of 250° C. to 550° C. and at a pressure in a range of 0.5 torr to 40 torr. The process may include cyclically pulsing a first process gas, purging the first process gas (for example, using nitrogen ($N_2$)), pulsing a second process gas, purging the second process gas (for example, using nitrogen ($N_2$)).

The first process gas is a dopant-containing gas that contains the desired dipole dopant. Suitable dopant-containing gases include an aluminum-containing gas such as trimethylaluminum (TMA) ($Al_2(CH_3)_6$), a lanthanum-containing gas such as tris(isopropylcyclopentadienyl)lanthanum ($La(iPrCp)_3$), a zinc-containing gas such as diethylzinc ($Zn(C_2H_5)_2$), a gallium-containing gas such as tris(dimethylamido)gallium(III) ($Ga_2[N(CH_3)_2]_6$), or the like. The second process gas is a gas that is capable of reacting with the first process gas to form the material of the dipole layer 620.

The second process gas may include an oxygen-containing gas such as oxygen ($O_2$ and/or $O_3$) and/or water ($H_2O$), and other gases such as nitrogen ($N_2$), hydrogen ($H_2$), argon, helium, krypton, xenon, and/or the like, or combinations thereof. The duration of each of the pulsing and purging cycles may be in a range of 0.1 seconds and 20 seconds.

Figure 46:
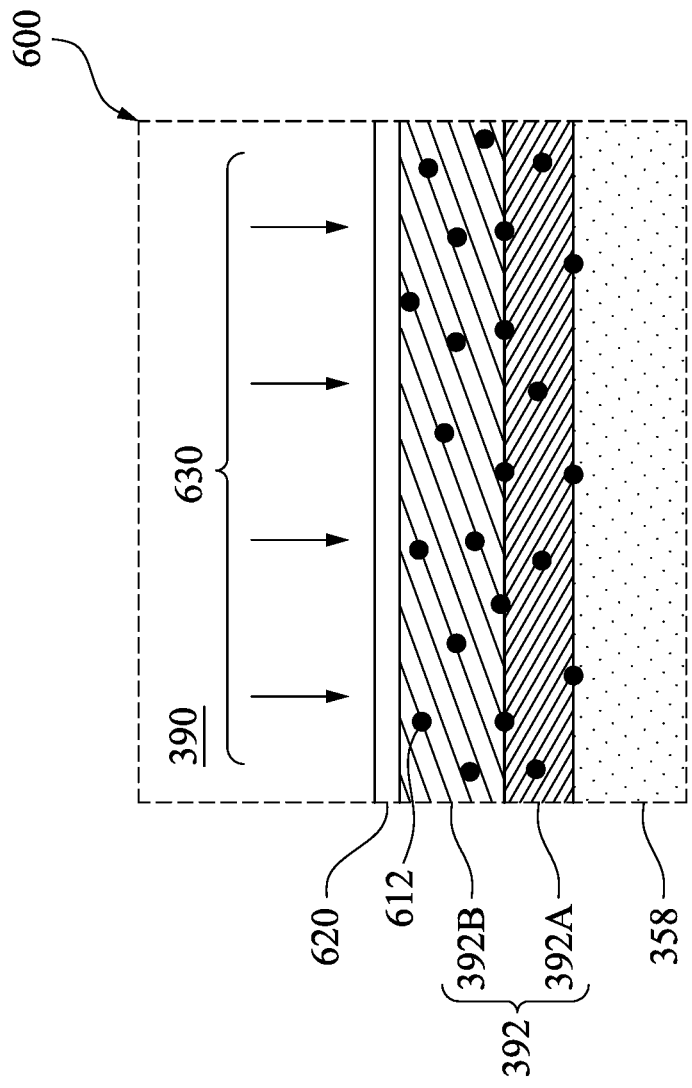

In FIG. 46, an anneal 630 is performed to drive (e.g., diffuse) the dipole dopant species from the dipole layer 620 into the gate dielectric layer 392 (e.g., the high-k dielectric layer 392B and/or the interfacial layer 392A). The diffused dipole dopant species can tune the threshold voltages of subsequently formed transistors. The diffused dipole dopant species may introduce energy states into the gate dielectric layer 392 close to conduction band edges of the gate dielectric layer 392, which may bring the conductivity of the gate dielectric layer 392 closer to the conductivity of a semiconductor material. This increased conductivity of the gate dielectric layer 392 may lead to charges, such as electrons liberated by oxygen vacancies along the interfaces of the gate dielectric layer 392 (e.g. interfaces between the high-k dielectric layer 392B, the interfacial layer 392A, and the channel region 358 of the fin 352), building up along the interfaces of the gate dielectric layer 392. This charge buildup along the interfaces of the gate dielectric layer 392 may lead to leakage path and reliability issues. The diffused fluorine atoms 612 (see above, FIG. 44) may localize the electrons by filling the oxygen vacancies, reducing charge along the interfaces and thereby reducing leakage path and reliability weaknesses.

In some embodiments, the diffused fluorine atoms 612 bond with the diffused dipole dopant species to form bonded fluorine-dipole species which include fluorine atoms bonded to the dipole dopant species. For example, the bonded fluorine-dipole species may include F—Al—O species, Al—O—F species, F—La—O species, La—O—F species, or the like. These bonded fluorine-dipole species may further reduce charge along the interfaces.

In some embodiments, the anneal 630 is a rapid thermal anneal or another thermal process, which may be performed at a temperature in a range from 500° C. to 1,000° C. and for a duration in a range of 1 second to 20 seconds. The anneal 630 can have a temperature and/or duration sufficient to drive (e.g., diffuse) one or more dipole dopant species into the gate dielectric layer 392 to a desired dipole dopant concentration (see below, FIG. 48).

Figure 47:
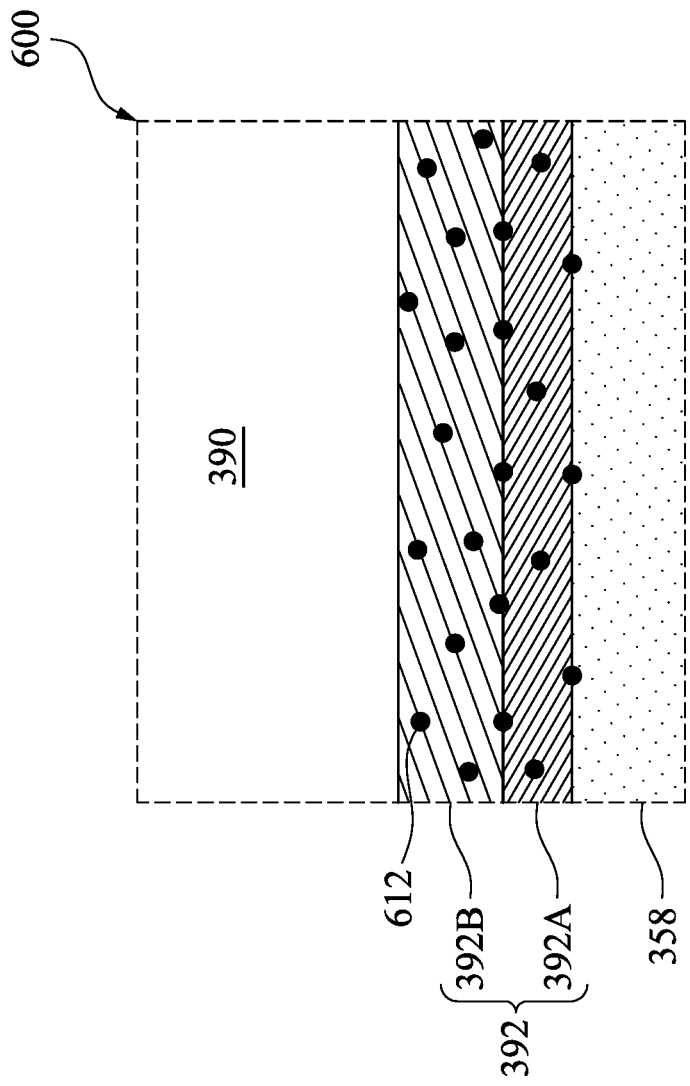

In FIG. 47, the dipole layer 620 is removed using one or more etching processes selective to the material of the dipole layer 620. The etching processes can include a wet etching process or a dry etching process. In some embodiments, the dipole layer 620 is removed with a wet etching process using, e.g., SC-1, SC-2, dilute hydrofluoric acid, ammonium hydroxide, the like, or a combination thereof. In some embodiments, the dipole layer 620 is removed with a dry etching process using, e.g., a reactive ion etching (RIE), a neutral beam etching (NBE), the like, or a combination thereof. However, any suitable removal process may be used to remove the dipole layer 620.

Figure 48:
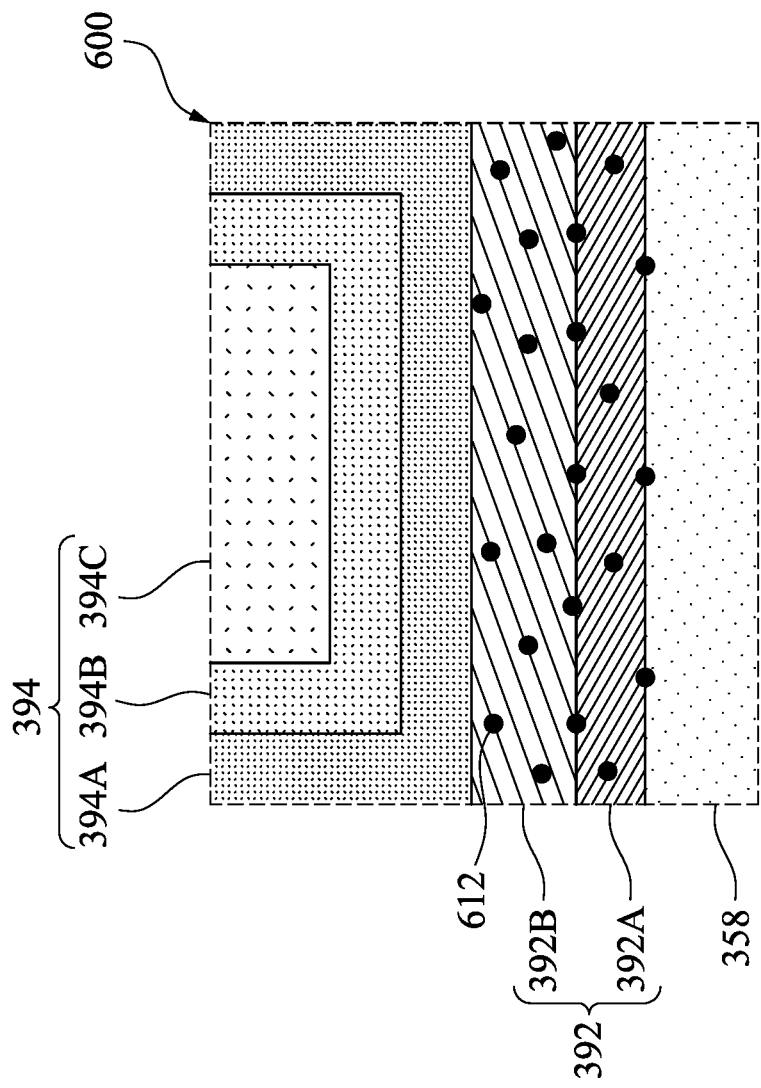

In FIG. 48, the gate electrode layer 394 is deposited on the gate dielectric layer 392. As noted above, the gate electrode layer 394 may include any number of liner layers 394A, any number of work function tuning layers 394B, and a fill material 394C. The liner layers 394A are formed of any acceptable material to promote adhesion and prevent diffusion. For example, the liner layers 394A may be formed of a metal or metal nitride such as titanium nitride, titanium aluminide, titanium aluminum nitride, silicon-doped titanium nitride, tantalum nitride, or the like, which may be deposited by ALD, CVD, PVD, or the like.

The work function tuning layers 394B are formed of any acceptable material to tune a work function of a device to a desired amount given the application of the device to be formed. In some embodiment, the work function tuning layers 394B in the p-type region 350P are formed of a p-type work function metal (P-WFM) such as titanium nitride (TiN), tantalum nitride (TaN), combinations thereof, or the like, which may be deposited by ALD, CVD, PVD, or the like. In some embodiment, the work function tuning layers 394B in the n-type region 350N are formed of a n-type work function metal (N-WFM) such as titanium aluminum (TiAl), titanium aluminum carbide (TiAlC), titanium aluminum nitride (TiAlN), combinations thereof, or the like, which may be deposited by ALD, CVD, PVD, or the like.

The fill material 394C includes any acceptable material of a low resistance. For example, the fill material 394C may be formed of a metal such as tungsten, aluminum, cobalt, ruthenium, combinations thereof or the like, which may be deposited by ALD, CVD, PVD, or the like. The fill material 394C fills the remaining portions of the recesses 390.

In some embodiments, the concentration of the fluorine atoms 612 at the interface of the high-k dielectric layer 392B with the gate electrode layer 394 is in a range of $2 \times 10^3$ atoms/cm$^2$ to $5 \times 10^7$ atoms/cm$^2$, which may be advantageous for reducing leakage path and reliability weaknesses caused by a subsequent introduction of dipole dopants. The concentration of the fluorine atoms 612 at the interface of the high-k dielectric layer 392B with the gate electrode layer 394 being less than $2 \times 10^3$ atoms/cm$^2$ may be disadvantageous by leading to increased leakage path and reliability weaknesses. The concentration of the fluorine atoms 612 at the interface of the high-k dielectric layer 392B with the gate electrode layer 394 being greater than $5\times10^7$ atoms/cm$^2$ may be disadvantageous by negatively impacting the threshold voltages of the resulting transistor.

Figure 49:
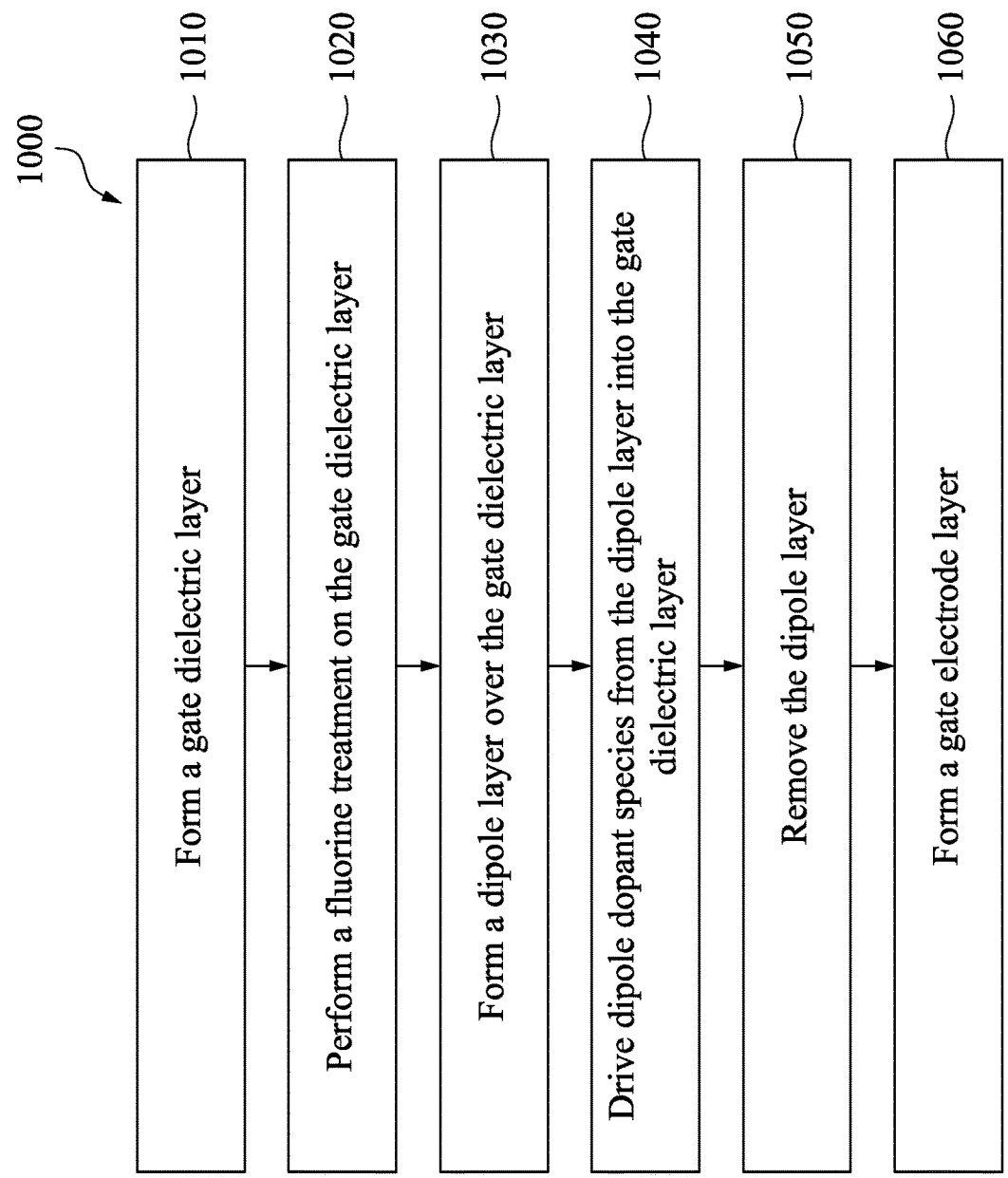
FIG. 49 illustrates a flow chart for a method of forming layers for replacement gates, in accordance with some embodiments.

FIG. 49 illustrates a flow chart for a method 1000 of forming layers for replacement gates, as illustrated in FIGS. 43 through 48. In step 1010, a gate dielectric layer 392 is formed, as described above with respect to FIG. 43. In step 1020, a fluorine treatment 610 is performed on the gate dielectric layer 392, as described above with respect to FIG. 44. In step 1030, a dipole layer 620 is formed over the gate dielectric layer 392, as described above with respect to FIG. 45. In step 1040, dipole dopant species are driven from the dipole layer 620 into the gate dielectric layer 392, as described above with respect to FIG. 46. In step 1050, the dipole layer 620 is removed, as described above with respect to FIG. 47. In step 1060, a gate electrode layer 394 is formed on the gate dielectric layer 392, as described above with respect to FIG. 48.

In FIGS. 50A and 50B, a removal process is performed to remove the excess portions of the gate dielectric layer 392 and the gate electrode layer 394, which excess portions are over the top surface of the ILD 388, thereby forming gate dielectrics 402 and gate electrodes 404. In some embodiments, a planarization process such as a chemical mechanical polish (CMP), an etch-back process, combinations thereof, or the like may be utilized. The remaining portions of the gate electrode layer 394 in the recesses form the gate electrodes 404. The remaining portions of the gate dielectric layer 392 in the recesses form the gate dielectrics 402. The gate dielectrics 402 and the gate electrodes 404 thus form replacement gates of the resulting FinFETs. The gate electrodes 404 and the gate dielectrics 402 may be collectively referred to as a "gate structure." The gate and the gate structures may extend along sidewalls of a channel region 358 of the fins 352.

The gate dielectrics 402 have diffused dipole dopant species that are useful for tuning the threshold voltages of the formed FinFETs, and the diffused fluorine atoms are useful for reducing leakage and reliability issues that would otherwise be caused by the presence of the dipole dopant species. Because of the presence of dipole dopant species in the gate dielectrics 402, thicknesses of the work function tuning layers 394B (see FIG. 48) may be smaller, which may enable smaller respective spacings between neighboring gate electrodes 404. In some embodiments, the gate electrodes 404 are free of work function tuning layers, as the threshold voltages of the gates may be tuned by the dipole dopant species in the gate dielectrics 402.

In some embodiments, after the gate dielectrics 402 are formed, a dipole dopant concentration in the high-k dielectric layer 392B (see FIG. 48) is in a range of $2\times10^3$ cm$^{-3}$ to $5\times10^7$ cm$^{-3}$, which may be advantageous for tuning the threshold voltages of the subsequently formed gates. The dipole dopant concentration in the high-k dielectric layer 392B being less than $2\times10^3$ cm$^{-3}$ may be disadvantageous by insufficiently tuning the threshold voltages of the subsequently formed gates. The dipole dopant concentration in the high-k dielectric layer 392B being greater than $5\times10^7$ cm$^{-3}$ may be disadvantageous by increasing leakage path and reliability weaknesses.

In some embodiments, after the gate dielectrics 402 are formed, a dipole dopant concentration in the interfacial layer 392A (see FIG. 48) is in a range of $2\times10^3$ cm$^{-3}$ to $5\times10^7$ cm$^{-3}$, which may be advantageous for tuning the threshold voltages of the subsequently formed gates. The dipole dopant concentration in the interfacial layer 392A being less than $2\times10^3$ cm$^{-3}$ may be disadvantageous by insufficiently tuning the threshold voltages of the subsequently formed gates. The dipole dopant concentration in the interfacial layer 392A being greater than $5\times10^7$ cm$^{-3}$ may be disadvantageous by increasing leakage path and reliability weaknesses. In some embodiments, the dipole dopant concentration in the high-k dielectric layer 392B is greater than the dipole dopant concentration in the interfacial layer 392A.

Figure 51B:
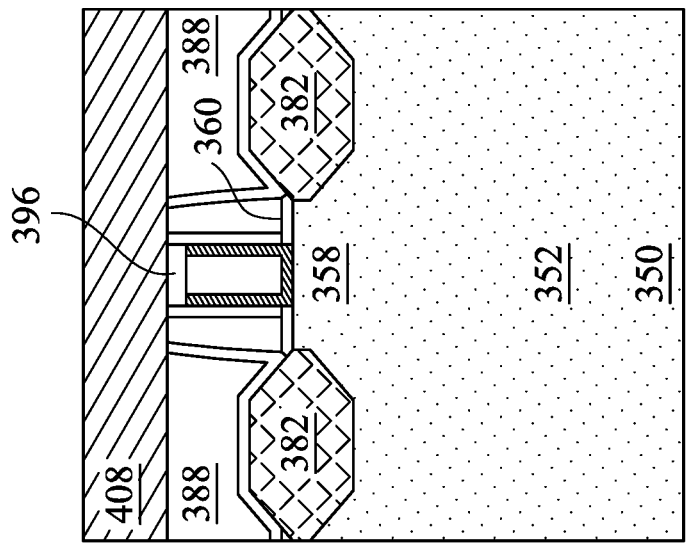
Figure 51A:
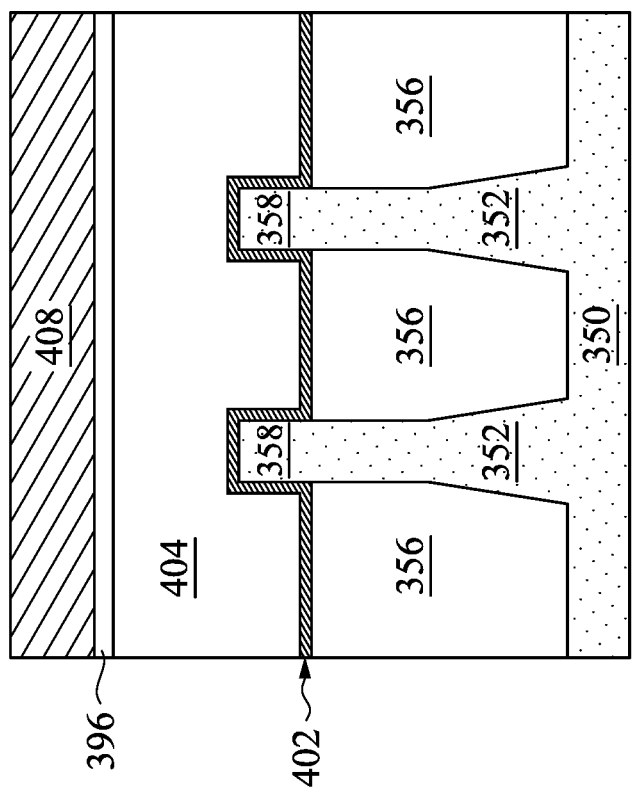

In FIGS. 51A and 51B, a gate mask 396 is formed over the gate structure (including a gate dielectric 402 and a corresponding gate electrode 404), and the gate mask 396 may be disposed between opposing portions of the gate spacers 386. In some embodiments, forming the gate mask 396 includes recessing the gate structure so that a recess is formed directly over the gate structure and between opposing portions of gate spacers 386. A gate mask 396 comprising one or more layers of dielectric material, such as silicon nitride, silicon oxynitride, or the like, is filled in the recess, followed by a planarization process to remove excess portions of the dielectric material extending over the first ILD 388. The gate mask 396 is optional and may be omitted in some embodiments. In such embodiments, the gate structure may remain level with top surfaces of the first ILD 388.

As also illustrated in FIGS. 51A and 51B, a second ILD 408 is deposited over the first ILD 388. In some embodiments, the second ILD 408 is a flowable film formed by a flowable CVD method. In some embodiments, the second ILD 408 is formed of a dielectric material such as PSG, BSG, BPSG, USG, or the like, and may be deposited by any suitable method, such as CVD and PECVD. The subsequently formed gate contacts 410 (see below, FIGS. 52A and 52B) penetrate through the second ILD 408 and the gate mask 396 (if present) to contact the top surface of the recessed gate electrode 404.

Figure 52B:
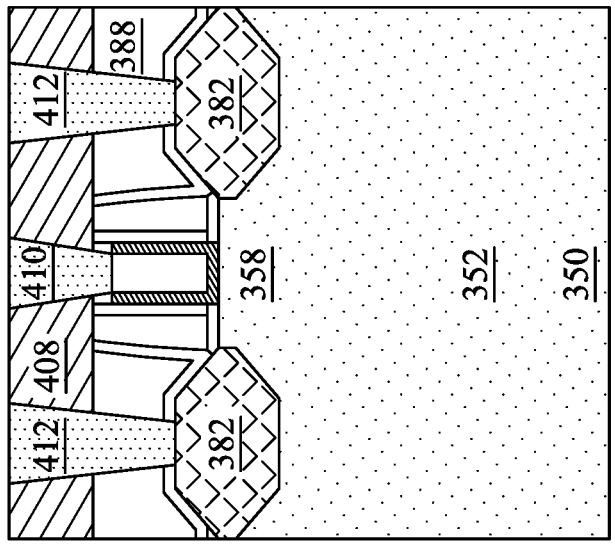
Figure 52A:
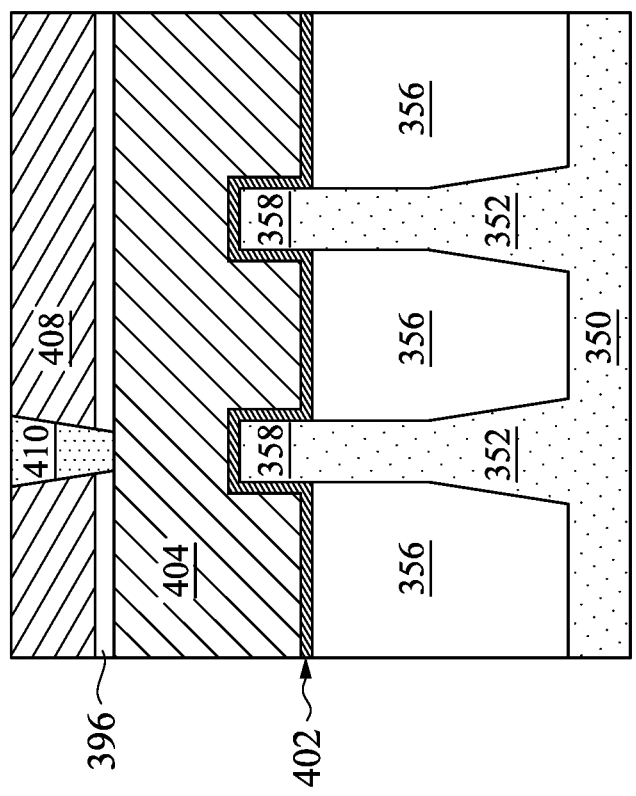

In FIGS. 52A and 52B, gate contacts 410 and source/drain contacts 412 are formed through the second ILD 408 and the first ILD 388 in accordance with some embodiments. Openings for the source/drain contacts 412 are formed through the first and second ILDs 388 and 408, and openings for the gate contact 410 are formed through the second ILD 408 and the gate mask 396 (if present). The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 408. The remaining liner and conductive material form the source/drain contacts 412 and gate contacts 410 in the openings.

An anneal process may be performed to form a silicide at the interface between the epitaxial source/drain regions 382 and the source/drain contacts 412. The source/drain contacts 412 are physically and electrically coupled to the epitaxial source/drain regions 382, and the gate contacts 410 are physically and electrically coupled to the gate electrodes 404. The source/drain contacts 412 and gate contacts 410 may be formed in different processes, or may be formed in the same process. Although shown as being formed in the same cross-sections, it should be appreciated that each of the source/drain contacts 412 and gate contacts 410 may be formed in different cross-sections, which may avoid shorting of the contacts.

The disclosed FinFET embodiments could also be applied to nanostructure devices such as gate-all-around (e.g., nanostructure, nanosheet, nanowire, or the like) field effect transistors (GAAFETs). A GAA device can be formed as described above with reference to FIGS. 1-24E.

Figure 53:
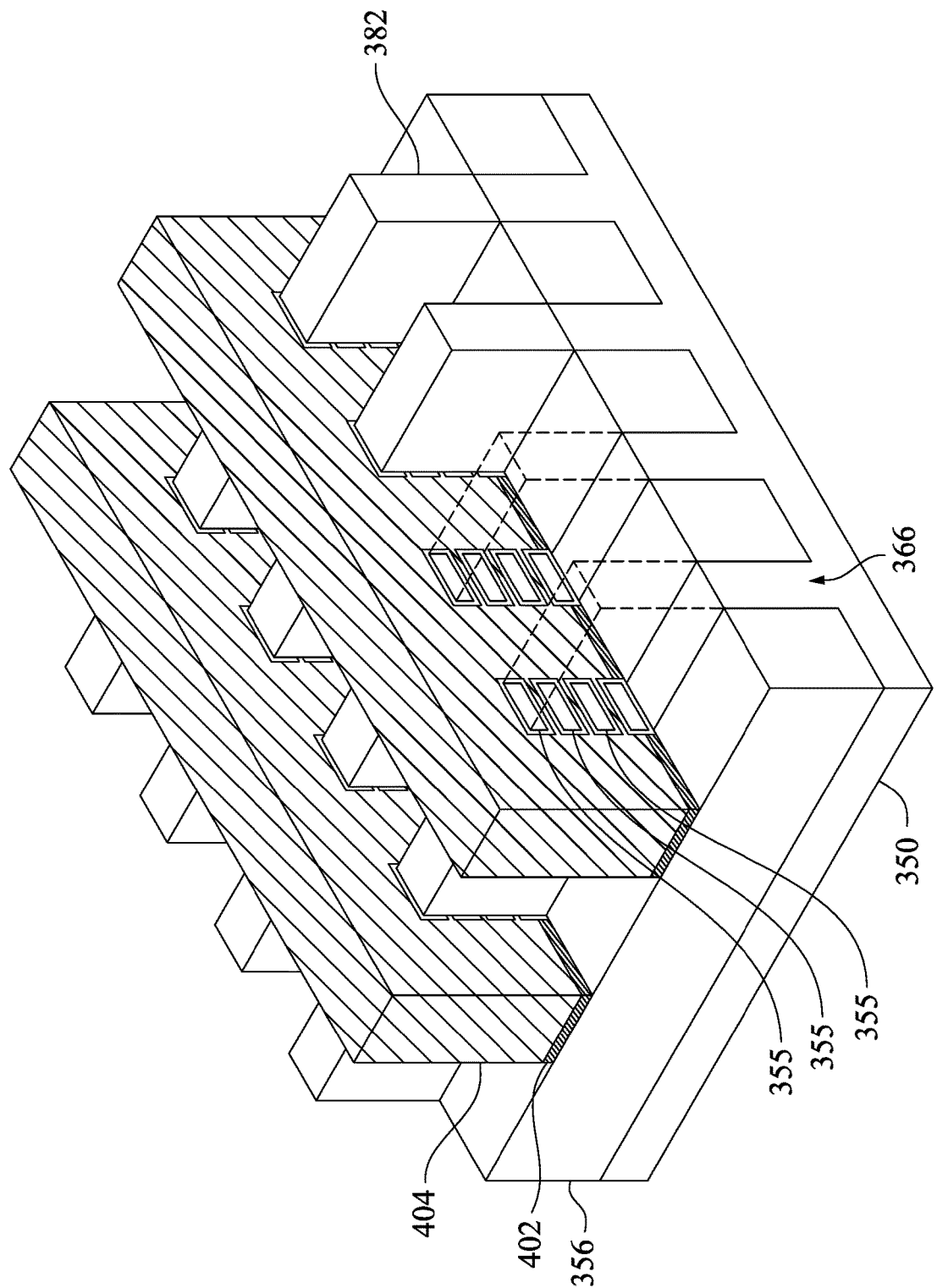
FIG. 53 illustrates an example of a GAA transistor in a three-dimensional view, in accordance with some embodiments.

FIG. 53 illustrates an example of GAAFETs in a three-dimensional view, in accordance with some embodiments. The GAAFETs comprise nanostructures 355 (e.g., nanosheets, nanowire, or the like) over fins 366 on a substrate 350 (e.g., a semiconductor substrate), wherein the nanostructures 355 act as channel regions for the GAAFETs. The nanostructure 355 may include p-type nanostructures, n-type nanostructures, or a combination thereof. Isolation regions 356 are disposed between adjacent fins 366, which may protrude above and from between neighboring isolation regions 356. Although a bottom portion of the fins 366 are illustrated as being single, continuous materials with the substrate 350, the bottom portion of the fins 366 and/or the substrate 350 may comprise a single material or a plurality of materials. In this context, the fins 366 refer to the portion extending between the neighboring isolation regions 356.

Gate dielectrics 402 are over top surfaces of the fins 366 and along top surfaces, sidewalls, and bottom surfaces of the nanostructures 355. The gate dielectrics 402 are formed in a manner similar as described above with respect to FIGS. 42A-50B, except in the context of GAAFETs (e.g., as described above with reference to FIG. 15). For example, the gate dielectrics 402 may include an interfacial layer 392A (see above, FIG. 48) over top surfaces of the fins 366 and along top surfaces, sidewalls, and bottom surfaces of the nanostructures 355 and a high-k dielectric layer 392B (see above, FIG. 48) along top surfaces, sidewalls, and bottom surfaces of the interfacial layer 392A. Gate electrodes 404 are over the gate dielectrics 402. Epitaxial source/drain regions 382 are disposed on the fins 366 on opposing sides of the gate dielectrics 402 and the gate electrodes 404.

The embodiments of the present disclosure have some advantageous features. A dipole dopant species is diffused into one or more gate dielectric layers to tune threshold voltages of subsequently formed transistors without negatively affecting respective spacings for the gates of the transistors. The dipole doping of the one or more gate dielectric layers may lead to leakage path and reliability issues, e.g., charge buildup on interfaces between the one or more gate dielectric layers or the underlying channel region. Also, by forming a fluorine-containing layer, and then diffusing fluorine into the underlying gate dielectric to localize electrons, leakage path issues may be reduced and the reliability of the resulting transistor is improved. Also, diffusing fluorine has the effect of adjusting the threshold voltages of the resulting transistors, and the embodiments of the present application may be applied to adjust threshold voltages. Furthermore, by selectively doping fluorine into selected transistors, the performance of the transistors may be selectively adjusted.

In accordance with some embodiments of the present disclosure, a method comprises removing a first dummy gate stack and a second dummy gate stack to form a first trench and a second trench, wherein the first dummy gate stack and the second dummy gate stack are in a first device region and a second device region, respectively; depositing a first gate dielectric layer and a second gate dielectric layer extending into the first trench and the second trench, respectively; forming a fluorine-containing layer comprising a first portion over the first gate dielectric layer, and a second portion over the second gate dielectric layer; removing the second portion of the fluorine-containing layer; performing an annealing process to diffuse fluorine in the first portion of the fluorine-containing layer into the first gate dielectric layer; and after the annealing process, forming a first work-function layer and a second work-function layer over the first gate dielectric layer and the second gate dielectric layer, respectively.

In an embodiment, the forming the fluorine-containing layer comprises depositing the fluorine-containing layer using a fluorine-containing precursor. In an embodiment, the fluorine-containing precursor comprises $WF_6$. In an embodiment, the depositing the fluorine-containing layer is performed using an additional precursor comprising silane. In an embodiment, the forming the fluorine-containing layer comprises soaking a corresponding wafer comprising the first gate dielectric layer and the second gate dielectric layer in a fluorine-containing process gas. In an embodiment, the soaking results in a surface portion of the first gate dielectric layer in contact with the fluorine-containing process gas to have an increased fluorine atomic percentage and to form the fluorine-containing layer.

In an embodiment, the fluorine-containing process gas is selected from $NF_3$, $WF_6$, or combinations thereof. In an embodiment, the method further comprises, before the forming the fluorine-containing layer, depositing a protection layer comprising a first part and a second part on the first gate dielectric layer and the second gate dielectric layer, respectively. In an embodiment, in the removing the second portion of the fluorine-containing layer, a portion of the protection layer is further removed from over the second gate dielectric layer. In an embodiment, the method further comprises, after the annealing process, removing an additional portion of the protection layer from over the first gate dielectric layer. In an embodiment, the method further comprises forming a first source/drain region on a side of the first work-function layer and a second source/drain region on a side of the second work-function layer, wherein the first source/drain region and the second source/drain region are of opposite conductivity types.

In an embodiment, the method further comprises forming a first source/drain region on a side of the first work-function layer and a second source/drain region on a side of the second work-function layer, wherein the first source/drain region and the second source/drain region are of a same conductivity type. In an embodiment, the first dummy gate stack is formed on a top surface and sidewalls of a multilayer stack, and wherein the multilayer stack comprises a plurality of sacrificial layers and a plurality of nanostructures provided alternatingly.

In accordance with some embodiments of the present disclosure, a method comprises forming a first dummy gate stack on a top surface and sidewalls of a first multilayer stack, wherein the first multilayer stack comprises a first plurality of sacrificial layers and a first plurality of nanostructures provided alternatingly; forming a second dummy gate stack on a top surface and sidewalls of a second multilayer stack, wherein the second multilayer stack comprises a second plurality of sacrificial layers and a second plurality of nanostructures provided alternatingly; removing the first dummy gate stack and the second dummy gate stack to form a first recess and a second recess, respectively, in a dielectric layer; removing the first plurality of sacrificial layers and the second plurality of sacrificial layers; depositing first gate dielectrics wrapping around the first plurality of nanostructures; depositing second gate dielectrics wrapping around the second plurality of nanostructures; depositing first protection layers and second protection layers on the first gate dielectrics and the second gate dielectrics, respectively; forming first fluorine-containing layers and second fluorine-containing layers on the first protection layers and the second protection layers, respectively; removing the second fluorine-containing layers; after the second fluorine-containing layers are removed, performing an annealing process, wherein the first fluorine-containing layers are subject to the annealing process; and after the annealing process, removing the first fluorine-containing layers.

In an embodiment, the method further comprises removing the first protection layers and the second protection layers; and forming work-function layers in spaces left by the removed first protection layers and the removed second protection layers. In an embodiment, the method further comprises forming a first work-function layer and a second work-function layer on the first protection layers and the second protection layers, respectively. In an embodiment, the forming the first fluorine-containing layers and the second fluorine-containing layers comprises a deposition process or a soaking process.

In accordance with some embodiments of the present disclosure, a method comprises forming a first nanostructure in a first trench, with a first gate spacer comprising portions on opposite sides of the first trench; forming a second nanostructure in a second trench, with a second gate spacer comprising portions on opposite sides of the second trench; depositing a first gate dielectric extending into the first trench to encircle the first nanostructure; depositing a second gate dielectric extending into the second trench to encircle the second nanostructure; and after the first gate dielectric and the second gate dielectric are formed, adding fluorine into the first gate dielectric, wherein when the fluorine is added into the first gate dielectric, fluorine remains substantially unchanged in the second gate dielectric.

In an embodiment, the adding the fluorine comprises forming a fluorine-containing layer on the first gate dielectric; and performing an annealing process to drive the fluorine in the fluorine-containing layer into the first gate dielectric. In an embodiment, the fluorine-containing layer is further formed to extend on the second gate dielectric, and the method further comprising, before the annealing process, removing the fluorine-containing layer from the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   removing a first dummy gate stack and a second dummy gate stack to form a first trench and a second trench, wherein the first dummy gate stack and the second dummy gate stack are in a first device region and a second device region, respectively;
   depositing a first gate dielectric layer and a second gate dielectric layer extending into the first trench and the second trench, respectively;
   forming a fluorine-containing layer comprising a first portion over the first gate dielectric layer, and a second portion over the second gate dielectric layer;
   removing the second portion of the fluorine-containing layer;
   performing an annealing process to diffuse fluorine in the first portion of the fluorine-containing layer into the first gate dielectric layer; and
   after the annealing process, forming a first work-function layer and a second work-function layer over the first gate dielectric layer and the second gate dielectric layer, respectively.

2. The method of claim 1, wherein the forming the fluorine-containing layer comprises depositing the fluorine-containing layer using a fluorine-containing precursor.

3. The method of claim 2, wherein the fluorine-containing precursor comprises $WF_6$.

4. The method of claim 3, wherein the depositing the fluorine-containing layer is performed using an additional precursor comprising silane.

5. The method of claim 1, wherein the forming the fluorine-containing layer comprises soaking a corresponding wafer comprising the first gate dielectric layer and the second gate dielectric layer in a fluorine-containing process gas.

6. The method of claim 5, wherein the soaking results in a surface portion of the first gate dielectric layer in contact with the fluorine-containing process gas to have an increased fluorine atomic percentage and to form the fluorine-containing layer.

7. The method of claim 5, wherein the fluorine-containing process gas is selected from $NF_3$, $WF_6$, or combinations thereof.

8. The method of claim 1 further comprising:
   before the forming the fluorine-containing layer, depositing a protection layer comprising a first part and a second part on the first gate dielectric layer and the second gate dielectric layer, respectively.

9. The method of claim 8, wherein in the removing the second portion of the fluorine-containing layer, a portion of the protection layer is further removed from over the second gate dielectric layer.

10. The method of claim 9 further comprising, after the annealing process, removing an additional portion of the protection layer from over the first gate dielectric layer.

11. The method of claim 1 further comprising forming a first source/drain region on a side of the first work-function layer and a second source/drain region on a side of the second work-function layer, wherein the first source/drain region and the second source/drain region are of opposite conductivity types.

12. The method of claim 1 further comprising forming a first source/drain region on a side of the first work-function layer and a second source/drain region on a side of the second work-function layer, wherein the first source/drain region and the second source/drain region are of a same conductivity type.

13. The method of claim 1, wherein the first dummy gate stack is formed on a top surface and sidewalls of a multilayer stack, and wherein the multilayer stack comprises a plurality of sacrificial layers and a plurality of nanostructures provided alternatingly.

14. A method comprising:
   forming a first dummy gate stack on a top surface and sidewalls of a first multilayer stack, wherein the first multilayer stack comprises a first plurality of sacrificial layers and a first plurality of nanostructures provided alternatingly;
   forming a second dummy gate stack on a top surface and sidewalls of a second multilayer stack, wherein the second multilayer stack comprises a second plurality of sacrificial layers and a second plurality of nanostructures provided alternatingly;

removing the first dummy gate stack and the second dummy gate stack to form a first recess and a second recess, respectively, in a dielectric layer;

removing the first plurality of sacrificial layers and the second plurality of sacrificial layers;

depositing first gate dielectrics wrapping around the first plurality of nanostructures;

depositing second gate dielectrics wrapping around the second plurality of nanostructures;

depositing first protection layers and second protection layers on the first gate dielectrics and the second gate dielectrics, respectively;

forming first fluorine-containing layers and second fluorine-containing layers on the first protection layers and the second protection layers, respectively;

removing the second fluorine-containing layers;

after the second fluorine-containing layers are removed, performing an annealing process, wherein the first fluorine-containing layers are subject to the annealing process; and after the annealing process, removing the first fluorine-containing layers.

15. The method of claim 14 further comprising:

removing the first protection layers and the second protection layers; and forming work-function layers in spaces left by the removed first protection layers and the removed second protection layers.

16. The method of claim 14 further comprising forming a first work-function layer and a second work-function layer on the first protection layers and the second gate dielectrics, respectively.

17. The method of claim 14, wherein the forming the first fluorine-containing layers and the second fluorine-containing layers comprises a deposition process or a soaking process.

18. A method comprising:

forming a first nano structure in a first trench, with a first gate spacer comprising portions on opposite sides of the first trench;

forming a second nanostructure in a second trench, with a second gate spacer comprising portions on opposite sides of the second trench;

depositing a first gate dielectric extending into the first trench to encircle the first nanostructure;

depositing a second gate dielectric extending into the second trench to encircle the second nanostructure; and after the first gate dielectric and the second gate dielectric are formed, adding fluorine into the first gate dielectric, wherein when the fluorine is added into the first gate dielectric, fluorine remains substantially unchanged in the second gate dielectric.

19. The method of claim 18, wherein the adding the fluorine comprises:

forming a fluorine-containing layer on the first gate dielectric; and performing an annealing process to drive the fluorine in the fluorine-containing layer into the first gate dielectric.

20. The method of claim 19, wherein the fluorine-containing layer is further formed to extend on the second gate dielectric, and the method further comprising, before the annealing process, removing the fluorine-containing layer from the second trench.

* * * * *